(12) United States Patent
McPherson et al.

(10) Patent No.: US 11,721,617 B2
(45) Date of Patent: Aug. 8, 2023

(54) POWER MODULE

(71) Applicant: Wolfspeed, Inc., Durham, NC (US)

(72) Inventors: Brice McPherson, Fayetteville, AR (US); Brandon Passmore, Fayetteville, AR (US); Roberto M. Schupbach, Raleigh, NC (US); Jennifer Stabach-Smith, Fayetteville, AR (US)

(73) Assignee: WOLFSPEED, INC., Durham, NC (US)

( * ) Notice: Subject to any disclaimer, the term of this patent is extended or adjusted under 35 U.S.C. 154(b) by 72 days.

(21) Appl. No.: 17/239,418

(22) Filed: Apr. 23, 2021

(65) Prior Publication Data
US 2021/0313256 A1    Oct. 7, 2021

Related U.S. Application Data

(63) Continuation-in-part of application No. 16/937,857, filed on Jul. 24, 2020.
(Continued)

(51) Int. Cl.
*H01L 23/495* (2006.01)
*H01L 23/498* (2006.01)
(Continued)

(52) U.S. Cl.
CPC .... *H01L 23/49562* (2013.01); *H01L 23/3121* (2013.01); *H01L 23/49861* (2013.01);
(Continued)

(58) Field of Classification Search
CPC ........... H01L 23/49562; H01L 23/3121; H01L 23/49861; H01L 24/48; H01L 25/18
(Continued)

(56) References Cited

U.S. PATENT DOCUMENTS 9,095,054 B1 * 7/2015 Bourne ................ H01L 25/165
9,275,938 B1    3/2016 McPherson et al.
(Continued)

FOREIGN PATENT DOCUMENTS

EP        3582598 A1   12/2019
WO   WO 2021/207042   10/2021

OTHER PUBLICATIONS

Invitation to Provide Informal Clarification for International Patent Application No. PCT/US2021/025688, mailed Jul. 15, 2021, 3 pages.
(Continued)

*Primary Examiner* — Andargie M Aychillhum
(74) *Attorney, Agent, or Firm* — Dority & Manning, P.A.

(57) ABSTRACT

The present disclosure describes a power module having a substrate, first and second pluralities of vertical power devices, and first and second terminal assemblies. The substrate has a top surface with a first trace and a second trace. The first plurality of vertical power devices and the second plurality of vertical power devices are electrically coupled to form part of a power circuit. The first plurality of vertical power devices is electrically and mechanically directly coupled between the first trace and a bottom of a first elongated bar of the first terminal assembly. The second plurality of vertical power devices are electrically and mechanically directly coupled between the second trace and a bottom of a second elongated bar of the second terminal assembly.

28 Claims, 38 Drawing Sheets

Related U.S. Application Data

(60) Provisional application No. 63/006,126, filed on Apr. 7, 2020.

(51) Int. Cl.
*H01L 23/31* (2006.01)
*H01L 25/065* (2023.01)
*H02M 1/08* (2006.01)
*H01L 23/00* (2006.01)
*H02M 7/00* (2006.01)
*H01L 25/18* (2023.01)

(52) U.S. Cl.
CPC .......... *H01L 24/48* (2013.01); *H01L 25/0655* (2013.01); *H01L 25/18* (2013.01); *H01L 2224/48175* (2013.01); *H02M 1/08* (2013.01); *H02M 7/003* (2013.01)

(58) Field of Classification Search
USPC ......................................................... 257/77
See application file for complete search history.

(56) References Cited

U.S. PATENT DOCUMENTS

| | | |
|---|---|---|
| 2010/0327654 A1 | 12/2010 | Azuma et al. |
| 2013/0181228 A1 | 7/2013 | Usui et al. |
| 2017/0213783 A1 | 7/2017 | Meiser et al. |
| 2017/0374755 A1 | 12/2017 | Chi et al. |
| 2019/0181770 A1* | 6/2019 | Martin ................. H05K 7/1432 |
| 2019/0237439 A1 | 8/2019 | McPherson et al. |
| 2020/0053900 A1 | 2/2020 | Feurtado et al. |
| 2021/0313256 A1 | 10/2021 | McPherson et al. |

OTHER PUBLICATIONS

International Search Report and Written Opinion for International Patent Application No. PCT/US2021/025688, dated Aug. 23, 2021, 15 pages.
Notice of Allowance for Taiwanese Patent Application No. 110112551, dated Oct. 19, 2021, 4 pages.
International Search Report and Written Opinion for Application No. PCT/US2022/025680, dated Jul. 29, 2022, 19 pages.
U.S. Non-Final Office Action for U.S. Appl. No. 16/937,857, dated Dec. 22, 2022, 11 pages.

* cited by examiner

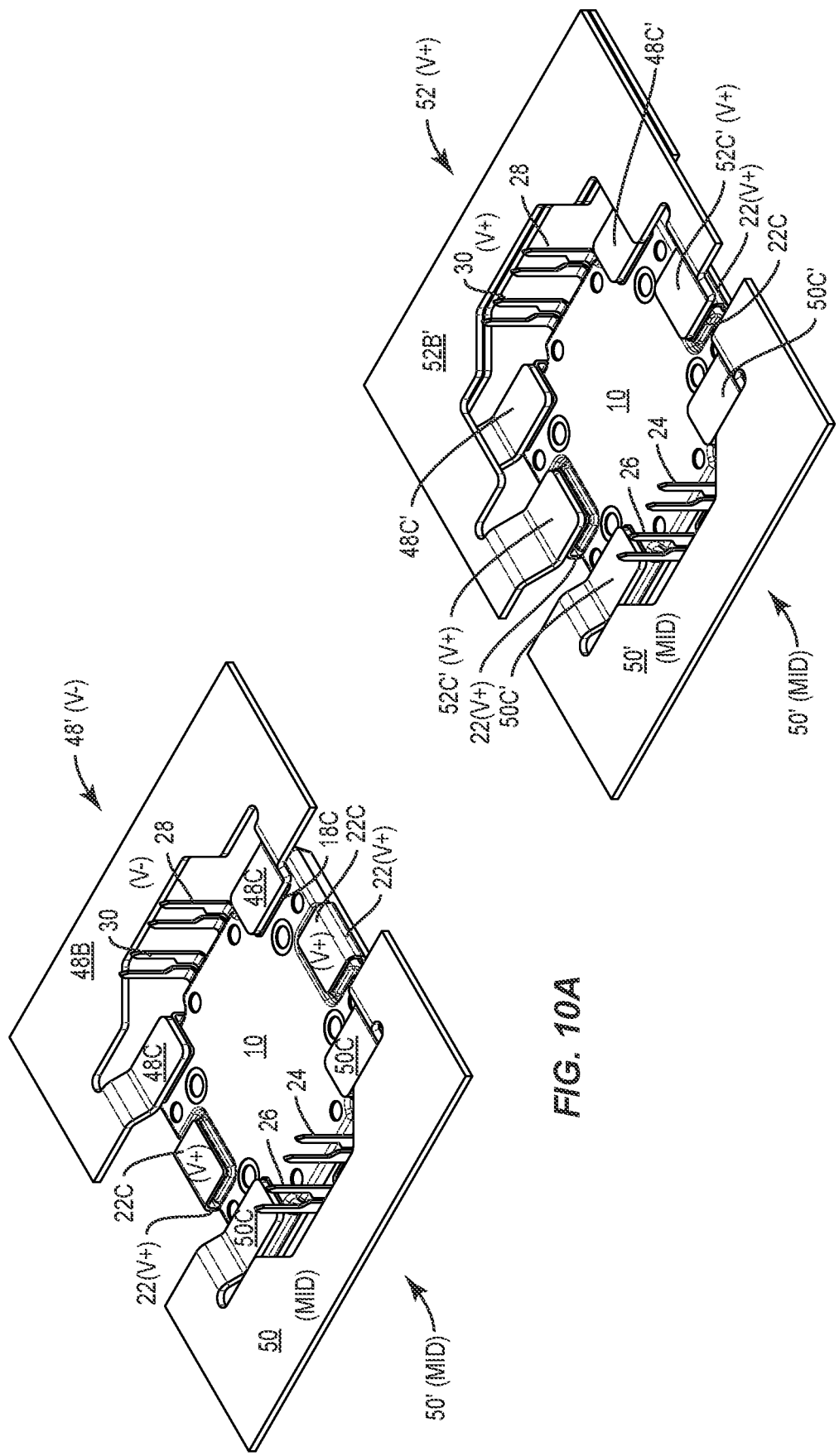

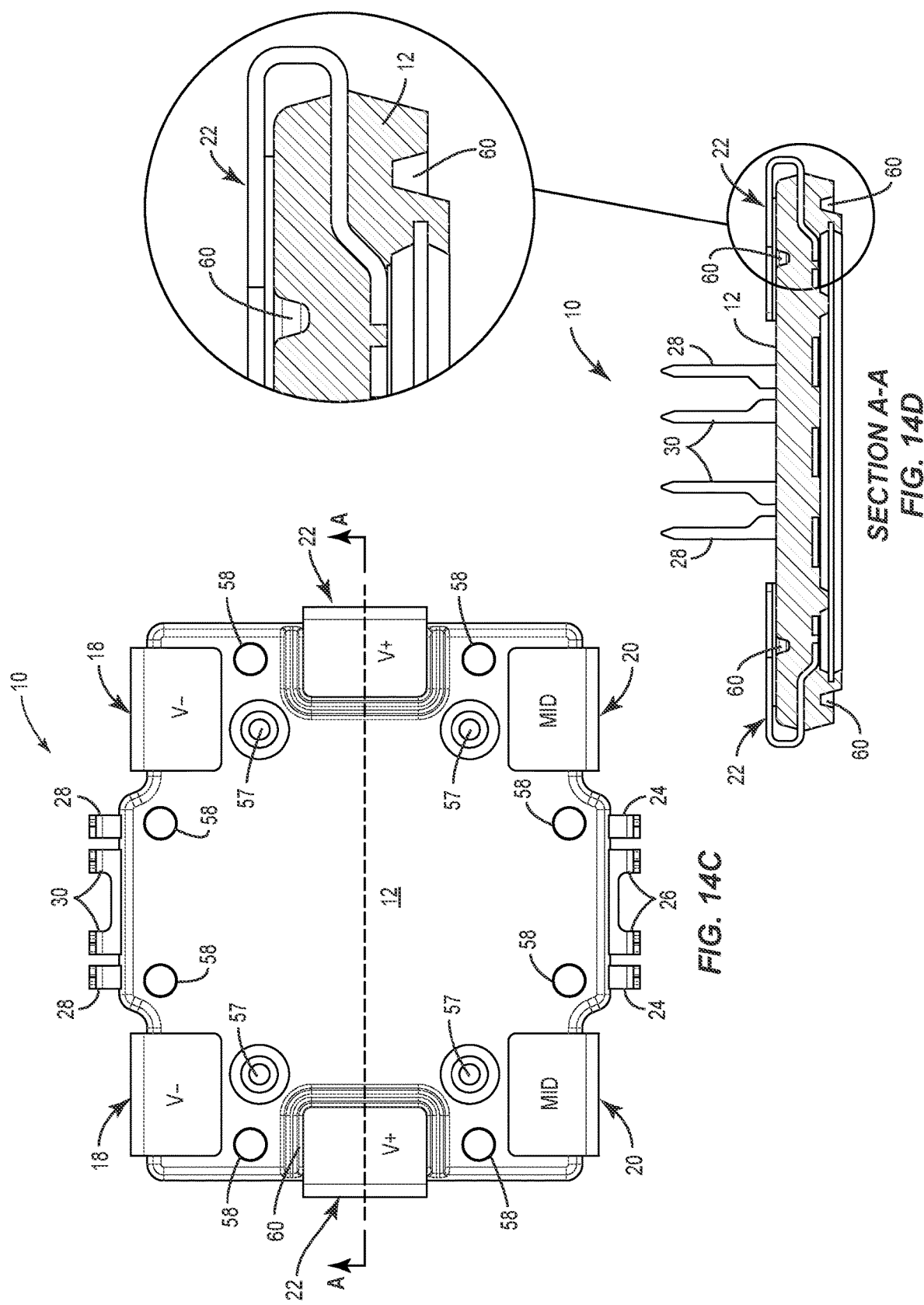

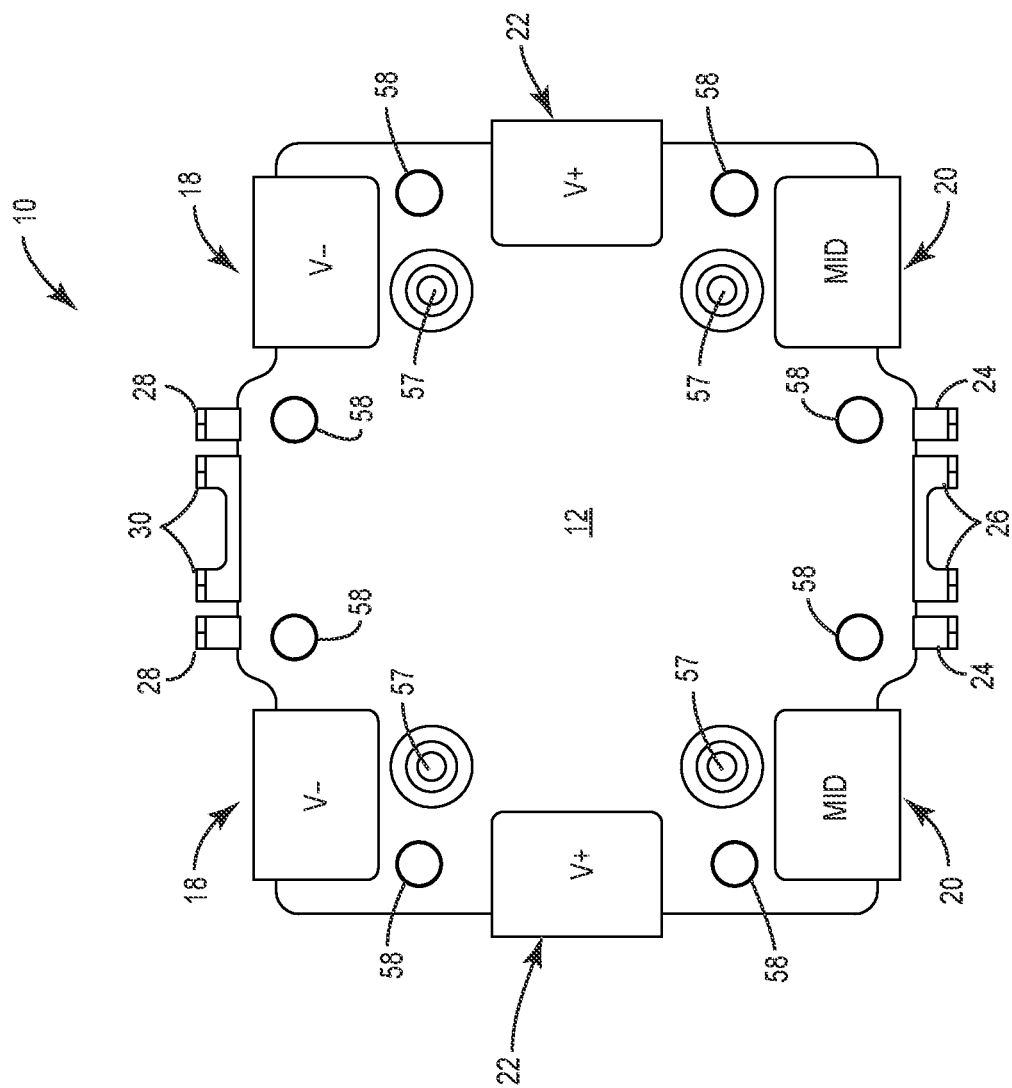

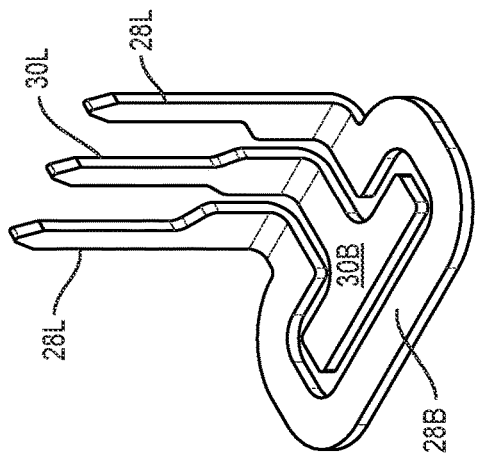
FIG. 16D
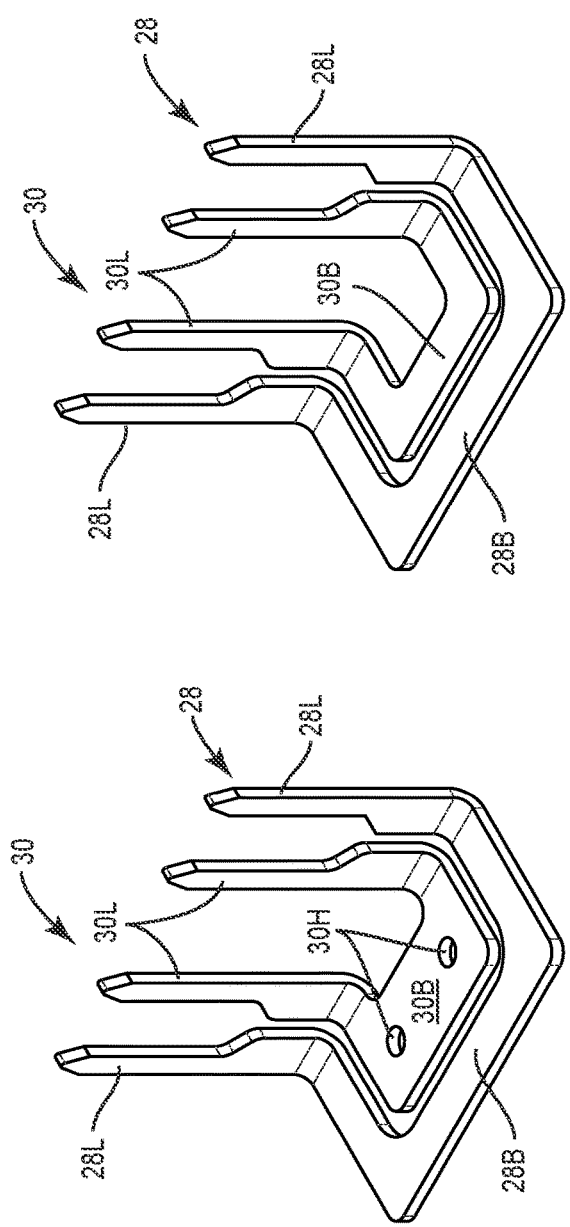
FIG. 16B
FIG. 16A
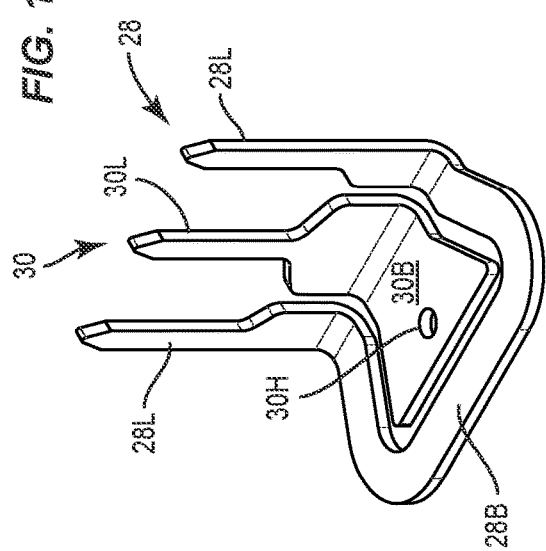
FIG. 16C

POWER MODULE

This application is a continuation-in-part of U.S. patent application Ser. No. 16/937,857, filed Jul. 24, 2020, which claims the benefit of U.S. provisional patent application No. 63/006,126, filed Apr. 7, 2020, the disclosures of which are incorporated herein by reference in their entireties.

FIELD OF THE DISCLOSURE

The present disclosure relates to power modules for high power applications.

BACKGROUND OF THE DISCLOSURE

In high power applications, multiple components for all or a portion of a circuit are often packaged in electronic modules. These modules are generally referred to as power modules that are housed in a thermoplastic, epoxy, or like molded housing that encapsulates the components and the circuit board or substrate on which the components are mounted. The input/output connections for the power module are provided by terminal assemblies that extend out of the housing to facilitate incorporation in and connection to other systems. Such systems may include electric vehicles, power conversion and control, and the like.

SUMMARY

The present disclosure relates to a power module comprising a substrate, first and second pluralities of vertical power devices, and first and second terminal assemblies. The substrate has a top surface with a first trace and a second trace. The first plurality of vertical power devices and a second plurality of vertical power devices are electrically coupled to form part of a power circuit. The first terminal assembly has a first elongated bar, at least two first terminal contacts, and at least two first terminal legs that respectively extend between different points of the first elongated bar and the at least two first terminal contacts. The second terminal assembly has a first elongated bar, at least two first terminal contacts, and at least two first terminal legs that respectively extend between different points of the first elongated bar and the at least two first terminal contacts. The first plurality of vertical power devices are electrically and mechanically directly coupled between the first trace and a bottom of the first elongated bar of the first terminal assembly. The second plurality of vertical power devices are thermally, electrically, and mechanically directly coupled between the second trace and a bottom of the second elongated bar of the second terminal assembly.

The power module may also have a third terminal assembly and a fourth terminal assembly. The third and fourth terminal assemblies may be thermally, electrically, and mechanically coupled to the first trace proximate opposing sides of the substrate.

In one embodiment, the substrate has four sides, the third terminal assembly is on a first side, and fourth terminal assembly is proximate a second side that is opposite the first side, the first terminal assembly is proximate a third side that is between the first side and the second side, and the second terminal assembly is proximate a fourth side that is between the first and second side and opposite the third side.

In one embodiment, a housing encapsulates at least a portion of the first terminal assembly and the second terminal assembly. Each of the at least two first terminal legs may extend out of a side portion of the housing and fold such that the at least two first terminal contacts extend over and parallel with a top portion of the housing. Similarly, each of the at least two second terminal legs may extend out of a side portion of the housing and fold such that the at least two second terminal contacts extend over and parallel with a top portion of the housing.

In one embodiment, a third terminal assembly and a fourth terminal assembly are electrically and mechanically coupled to the first trace proximate opposing sides of the substrate, wherein the substrate has four sides, the third terminal assembly is on a first side, and fourth terminal assembly is proximate a second side that is opposite the first side, the first terminal assembly is proximate a third side that is between the first side and the second side, and the second terminal assembly is proximate a fourth side that is between the first and second side and opposite the third side.

The third terminal assembly may have a third terminal leg that extends out of a side portion of the housing and a third terminal contact that extends over and parallel with a top portion of the housing. The fourth terminal assembly may have a fourth terminal leg that extends out of a side portion of the housing and a fourth terminal contact that extends over and parallel with a top portion of the housing.

The top and bottom surfaces of the housing may have a plurality of grooves that function as creepage extenders to effectively extend a surface distance between certain conductive elements of the power module.

In one embodiment, the first bar and the at least two first terminal legs of the first terminal assembly form a U-shape, and the second bar and the at least two second terminal legs of the second terminal assembly form a U-shape.

In one embodiment, the power module also has a first pin assembly having a first pin bar and at least one first pin leg extending from the first pin bar. The first pin bar may be located adjacent the first bar and between the at least two first terminal legs. The second pin assembly may have a second pin bar and at least one second pin leg extending from the second pin bar. The second pin bar may be located adjacent the second bar and between the at least two second terminal legs.

The at least one first pin leg may have two first pin legs and the at least one second pin leg may have two second pin legs. In such an embodiment, the power module may also have third and fourth pin assemblies. The third pin assembly may have a third pin bar and at least one third pin leg extending from the third pin bar, wherein the third pin bar is located adjacent the first pin bar and between the two first pin legs. The fourth pin assembly may have a fourth pin bar and at least one fourth pin leg extending from the fourth pin bar, wherein the fourth pin bar is located adjacent the second pin bar and between the two second pin legs.

In one embodiment, the at least one third pin leg may have two third pin legs, and the at least one fourth pin leg may have two fourth pin legs.

In one embodiment, the first pin assembly may be electrically connected to first contacts of the first plurality of vertical power devices via first bond wires. The second pin assembly may be electrically connected to second contacts of the second plurality of vertical power devices via second bond wires. The third pin assembly may be electrically connected to third contacts of the first plurality of vertical power devices via third bond wires. The fourth pin assembly is electrically connected to fourth contacts of the second plurality of vertical power devices via second bond wires.

In one embodiment, the power module has a housing that encapsulates at least a portion of the first terminal assembly, the second terminal assembly, the first pin assembly, and the second pin assembly. The at least one first pin leg and the at least one second pin leg extend out of respective side portions of the housing and then turn upward toward the top of the housing at an angle between 75 and 105 degrees. Other embodiments may include angles between 70 and 110 degrees, 80 and 100 degrees, 85 and 95 degrees, and 87 and 93 degrees.

In one embodiment, the first plurality of vertical power devices and the second plurality of vertical power devices are field effect transistors. Further, the first pin assembly is electrically coupled to one of gate contacts or source contacts of the first plurality of vertical power devices; and the second pin assembly is electrically coupled to one of gate contacts or source contacts of the second plurality of vertical power devices.

In one embodiment, the third pin assembly is electrically coupled to another of the gate contacts or source contacts of the first plurality of vertical power devices. The fourth pin assembly is electrically coupled to another of the gate contacts or source contacts of the second plurality of vertical power devices.

In one embodiment, the first plurality of vertical power devices has at least three first vertical transistors that are electrically coupled in parallel with one another, and the second plurality of vertical power devices has at least three second vertical transistors that are electrically coupled in parallel with one another. In this embodiment, the at least three first vertical transistors and the at least three second vertical transistors may be silicon carbide transistors and the substrate may be silicon carbide. Certain power device positions may be depopulated for applications needing less power handling capabilities than in fully populated embodiments.

In one embodiment, the first plurality of vertical power devices and the second plurality of vertical power devices comprise power field effect transistors, and the power circuit is a half H-bridge circuit.

In one embodiment, the first terminal assembly has a plurality of jumpers that extend from the first elongated bar to the second trace, such that the plurality of jumpers connect electrically and mechanically to the second trace.

In one embodiment, the first terminal assembly and the second terminal assembly are components of a common lead frame.

In one embodiment, the power circuit has a power loop and at least one signal loop. The power loop runs through the first plurality of vertical power devices and the second plurality of vertical power devices. The power loop is independent from the at least one signal loop. The at least one signal loop may provide at least one control signal for the first plurality of vertical power devices or the second plurality of vertical power devices. In one configuration, the power loop does not run through any bond wires with the power module.

In one embodiment, both the first terminal assembly and the second terminal assembly are symmetrical along at least one axis.

Based on the above, the present disclosure relates to a compact, high voltage, high current, low inductance half-bridge power module designed for the next generation of silicon carbide (SiC) and other material system power devices and power electronics applications. It utilizes a novel layout incorporating a size- and cost-optimized power substrate with a multi-function copper layer that interconnects the top pads of the devices while also acting as the external terminals.

In another embodiment, the power module comprises a substrate, a first plurality of vertical power devices, a second plurality of vertical power devices, a housing, and various terminal assemblies. The substrate has a top surface with a first trace and a second trace. The first plurality of vertical power devices and the second plurality of vertical power devices are electrically coupled to form part of a power circuit. The first terminal assembly comprises a first elongated bar, at least two first terminal contacts, and at least two first terminal legs that respectively extend between different points of the first elongated bar and the at least two first terminal contacts. The second terminal assembly comprises a second elongated bar, at least two second terminal contacts, and at least two second terminal legs that respectively extend between different points of the second elongated bar and the at least two second terminal contacts.

The housing includes four sides between a top surface and a bottom surface, wherein the housing encapsulates at least a portion of the first terminal assembly and the second terminal assembly. The first of the at least two first terminal legs extends out of a first side of the housing and folds such that the at least two first terminal contacts extend over and are parallel to a bottom surface of the housing. Each of the at least two second terminal legs extend out of a third side of the housing and turn downward wherein the at least two second terminal contacts form an angle between 75 and 105 degrees with the bottom surface of the housing, wherein the third side is between the first side and the second side of the housing. Other embodiments may include angles between 70 and 110 degrees, 80 and 100 degrees, 85 and 95 degrees, and 87 and 93 degrees.

The power module may be configured such that the first plurality of vertical power devices is electrically and mechanically directly coupled between the first trace and a bottom of the first elongated bar of the first terminal assembly. The second plurality of vertical power devices may also be electrically and mechanically directly coupled between the second trace and a bottom of the second elongated bar of the second terminal assembly.

In one embodiment, a plurality of first embossments is provided in the first elongated bar and biased toward the substrate, and a plurality of second embossments is provided in the second elongated bar and biased toward the substrate. Each of the first plurality of vertical power devices is electrically and mechanically directly coupled between the first trace and a bottom of one of the first plurality of embossments in the first elongated bar of the first terminal assembly. Each of the second plurality of vertical power devices is electrically and mechanically directly coupled between the second trace and a bottom of one of the second plurality of embossments in the second elongated bar of the second terminal assembly.

The power module may further include a third terminal assembly and a fourth terminal assembly, which are electrically and mechanically coupled to the second trace proximate opposing sides of the substrate. The third terminal assembly may include a third terminal leg that extends out of the first side portion of the housing and a third terminal contact that extends over and is parallel to a bottom surface of the housing. The fourth terminal assembly comprises a fourth terminal leg that extends out of the second side of the housing and a fourth terminal contact that extends over and is parallel to a bottom surface of the housing.

The power module may further include a first pin assembly that includes a first pin bar and at least one first pin leg that extends from the first pin bar and out of a fourth side of the housing and then turns downward at an angle between 75 and 105 degrees with the bottom surface of the housing, wherein the fourth side is opposite the third side of the housing. The second pin assembly includes a second pin bar and at least one second pin leg that extends from the second pin bar and out of the fourth side of the housing and then turns downward at an angle between 75 and 105 degrees with the bottom surface of the housing. Other embodiments may include angles between 70 and 110 degrees, 80 and 100 degrees, 85 and 95 degrees, and 87 and 93 degrees.

The power module may also include third and fourth pin assemblies. The third pin assembly may include a third pin bar and at least one third pin leg that extends from the third pin bar and out of the third side of the housing and then turns downward at an angle between 75 and 105 degrees with the bottom surface of the housing. The fourth pin assembly may include a fourth pin bar and at least one fourth pin leg that extends from the fourth pin bar and out of the third side of the housing and then turns downward at an angle between 75 and 105 degrees with the bottom surface of the housing, wherein the at least third first pin leg and the at least one fourth pin leg are between the at least two second terminal contacts. Other embodiments may include angles between 70 and 110 degrees, 80 and 100 degrees, 85 and 95 degrees, and 87 and 93 degrees.

In certain embodiments, the first terminal assembly may include a fifth pin leg that extends out of the fourth side of the housing and then turns downward at an angle between 75 and 110 degrees with the bottom surface of the housing. Similarly, the second terminal assembly may include a sixth pin leg that extends out of the third side of the housing and then turns downward at an angle between 75 and 110 degrees with the bottom surface of the housing. Other embodiments may include angles between 70 and 110 degrees, 80 and 100 degrees, 85 and 95 degrees, and 87 and 93 degrees.

The power circuit may include a power loop and at least one signal loop, wherein the power loop runs through the first plurality of vertical power devices and the second plurality of vertical power devices. The power loop may be independent from the at least one signal loop. Further, the at least one signal loop may provide at least one control signal for the first plurality of vertical power devices or the second plurality of vertical power devices. In certain embodiments, the power loop does not run through any bond wires of the power module.

The first plurality of vertical power devices and the second plurality of vertical power devices may include power field effect transistors wherein the power circuit is a half H-bridge circuit.

The second terminal assembly may include a plurality of jumpers that extends from the first elongated bar to the first trace such that the plurality of jumpers connects electrically and mechanically to the first trace.

In yet another embodiment, the power module is configured as follows. The substrate has a top surface with a first trace and a second trace. The first plurality of vertical power devices and a second plurality of vertical power devices are electrically coupled to form part of a power circuit. The first terminal assembly has a first elongated bar, at least two first terminal contacts, and at least two first terminal legs that respectively extend between different points of the first elongated bar and the at least two first terminal contacts, wherein a plurality of first embossments are provided in the first elongated bar and biased toward the substrate. The second terminal assembly has a second elongated bar, at least two second terminal contacts, and at least two second terminal legs that respectively extend between different points of the second elongated bar and the at least two second terminal contacts, wherein a plurality of second embossments are provided in the second elongated bar and biased toward the substrate.

Each of the first plurality of vertical power devices may be electrically and mechanically directly coupled between the first trace and a bottom of one of the first plurality of embossments in the first elongated bar of the first terminal assembly. Each of the second plurality of vertical power devices is electrically and mechanically directly coupled between the second trace and a bottom of one of the second plurality of embossments in the second elongated bar of the second terminal assembly.

A feature of these designs is scalability and modularity. The layout can widen and lengthen to either (1) accommodate larger devices or (2) place more devices in parallel. Essentially, the package concept can scale up or scale down to meet the power processing needs without forfeiting any of the performance benefits that the package offers. It is also straightforward to arrange these packages in parallel, increasing the current of a converter and/or forming topologies such as full-bridges (often used in DC-DC power conversion) and three-phase (used in motor drives and inverters).

Scalability and modularity are aspects to this product design, such that a broad portfolio of offerings and configurations may be supported by the platform. As described below, the present disclosure may be scaled up or down to best meet the needs of the particular application.

Those skilled in the art will appreciate the scope of the present disclosure and realize additional aspects thereof after reading the following detailed description in association with the accompanying drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 10A illustrates a second embodiment of a terminal connection to a low inductance bus bar lower layer according to the present disclosure.

FIG. 10B illustrates a third embodiment of a terminal connection to a low inductance bus bar upper layer according to the present disclosure.

FIGS. 14C and 14D are top and cross-sectional views of the external housing of the power module of FIGS. 14A and 14B.

FIG. 15 illustrates contours of the power module housing according to one embodiment of the present disclosure.

FIGS. 16A, 16B, 16C, and 16D illustrates various examples of signal pin assemblies according to the present disclosure.

DETAILED DESCRIPTION

Figure 2:
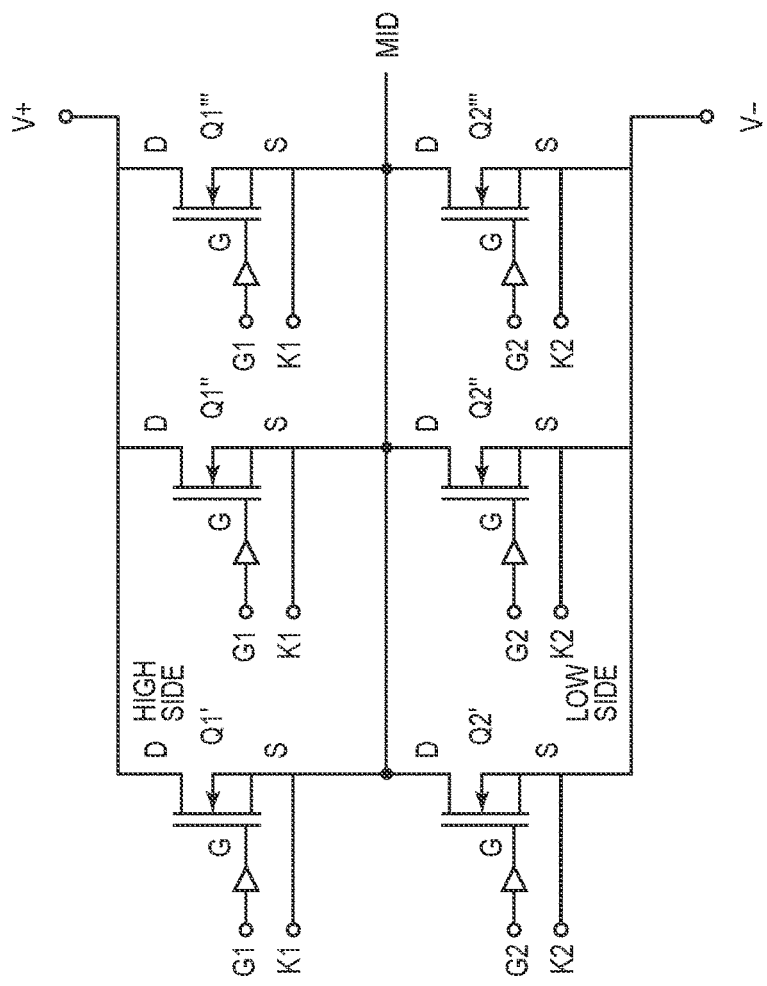
FIG. 2 illustrates a practical implementation of the half H-bridge circuit of FIG. 1A.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to power modules that are used in high power applications. Power modules may contain one or more power semiconductor devices, such as metal oxide semiconductor field effect transistors (MOSFETs), insulated gate bipolar transistors (IGBTs), diodes, and the like, arranged into a variety of circuit topologies. Typical circuit topologies include, but are not limited to, a single switch, a half H-bridge circuit, a full H-bridge circuit, and a three-phase switching circuit, which is often referred to as a six-pack.

Figure 1B:
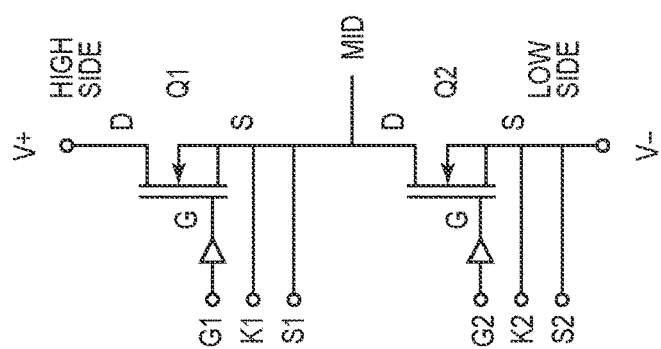
FIGS. 1A and 1B illustrate schematics of a typical half H-bridge circuit.
Figure 1A:
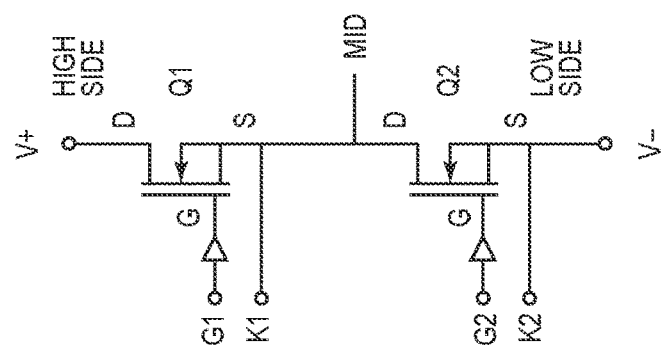

For the following discussion, a half-bridge circuit is used to facilitate an understanding of the packaging concepts disclosed herein. A basic half H-bridge circuit is a common power circuit that is used to switch different voltages to a load, such as a motor as illustrated in FIGS. 1A and 1B. The key components of the half H-bridge circuit are a high-side transistor Q1 and a low-side transistor Q2, which are coupled in series between a V+ terminal and a V− terminal. Assume for this example that transistors Q1 and Q2 are power MOSFETs with drain (D), gate (G1, G2), source (S), and source-kelvin (K1, K2) connections. The drain (D) of transistor Q1 is coupled to the V+ terminal, and the source (S) of transistor Q2 is coupled to the V− terminal. The source of transistor Q1 and the drain of transistor Q2 are coupled together and represent the MID terminal, which is essentially the output node that connects to the load (not shown).

To increase power handling, multiple power devices may be coupled in parallel with one another. In the illustrated embodiments and as depicted in FIG. 2, transistor Q1 is represented by three transistors Q1', Q1", and Q1'" that are coupled in parallel with one another, and transistor Q2 is represented by three transistors Q2', Q2", and Q2'" that are coupled in parallel with one another. For conciseness and readability, the parallel transistors Q1', Q1", and Q1'" may be collectively referenced as transistors Q1, and transistors Q2', Q2", and Q2'" may be collectively referenced as transistors Q2. In this example, transistors Q1 and Q2 are vertical, N channel MOSFETs, wherein the drain contact is on the bottom of the device and the source, gate, and source-kelvin contacts are on the top of the device. The half H-bridge circuit of FIG. 2 is implemented in the power module embodiments described below, but is just one of the many types of circuits that will benefit from the concepts provided herein.

Figure 3:
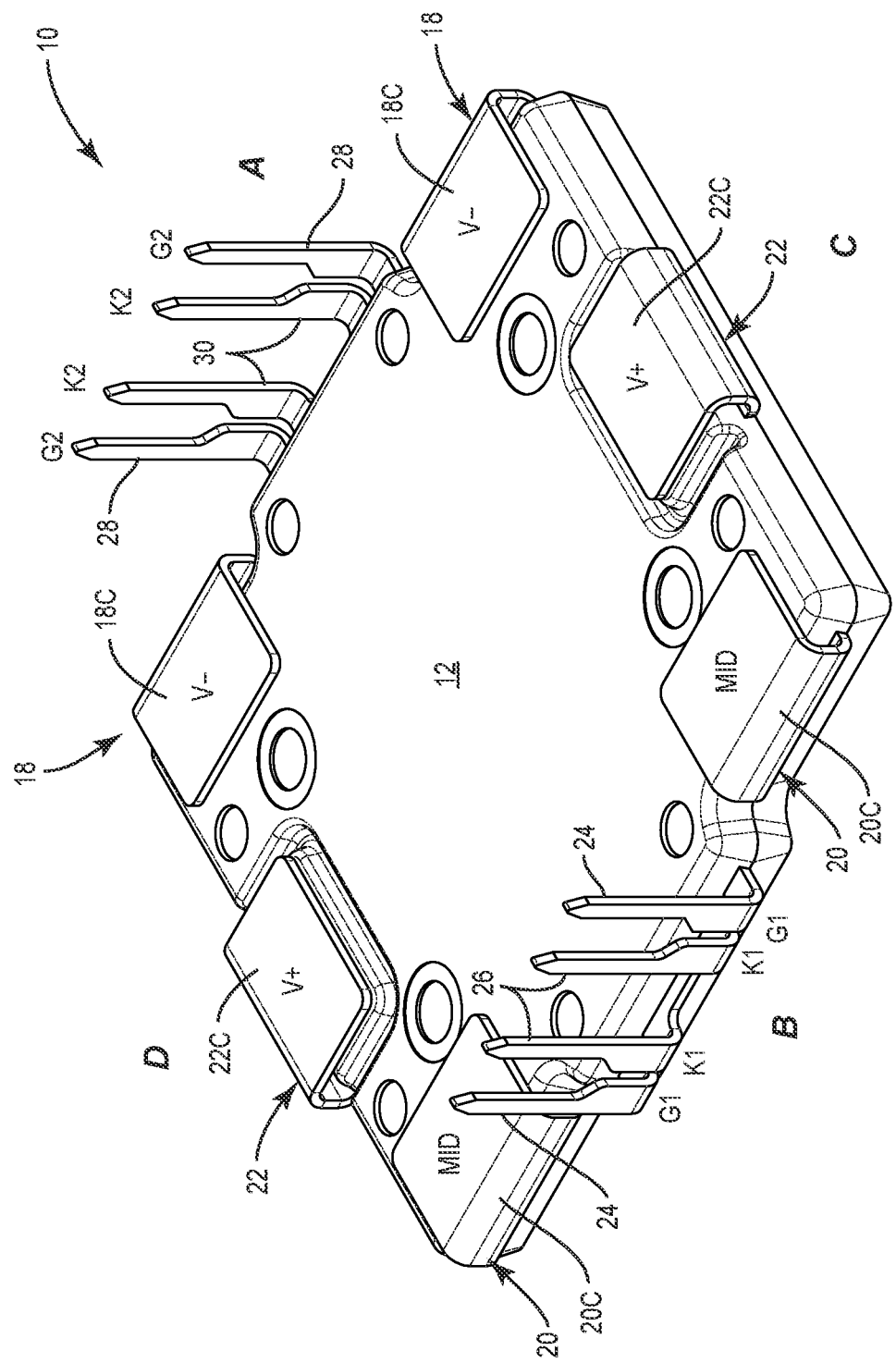
FIG. 3 is an isometric view of the external structure of a power module according to a first embodiment of the present disclosure.
Figure 4:
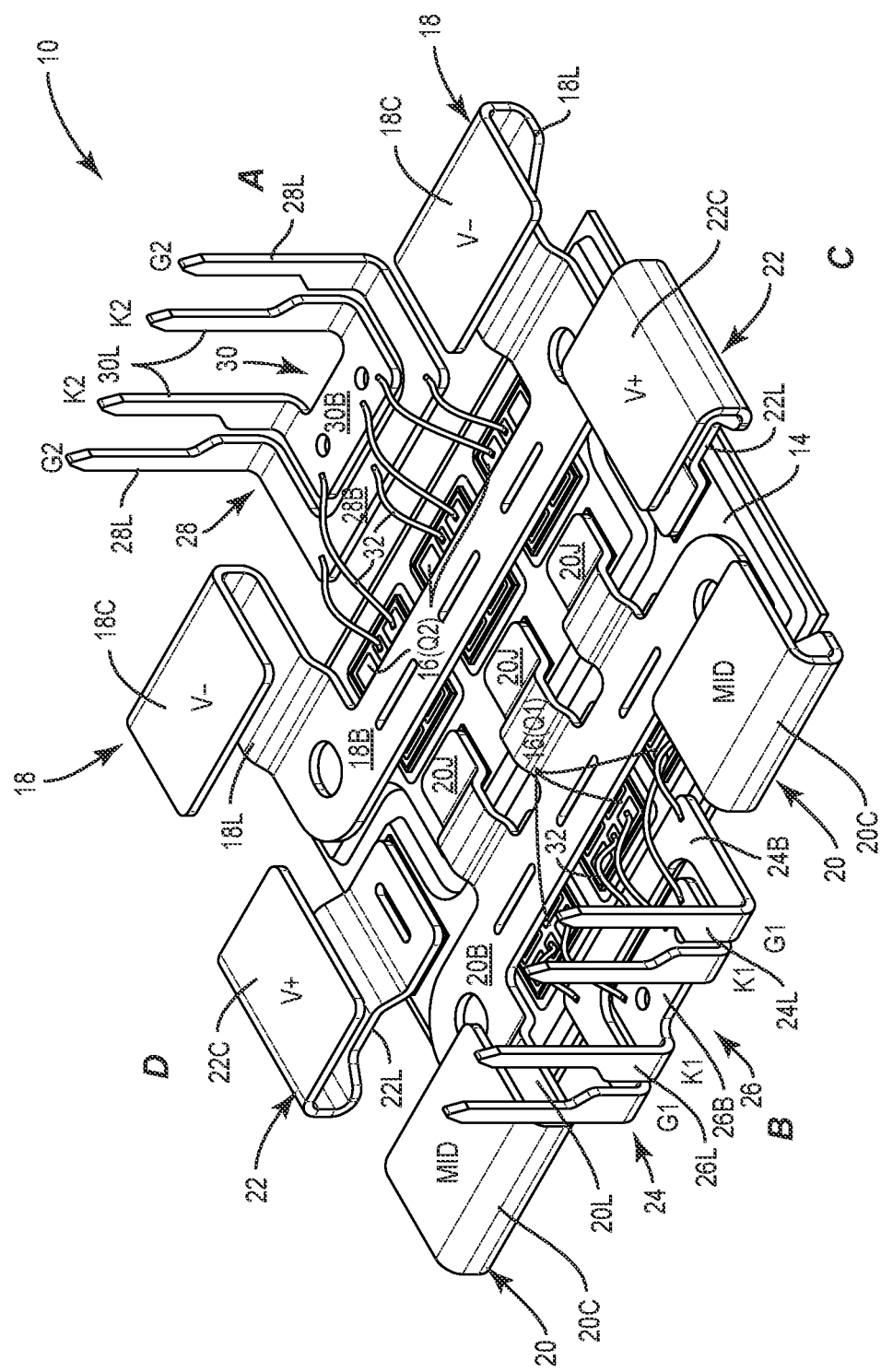
FIG. 4 is an isometric view of the internal structure of a first embodiment of the present disclosure.
Figure 5:
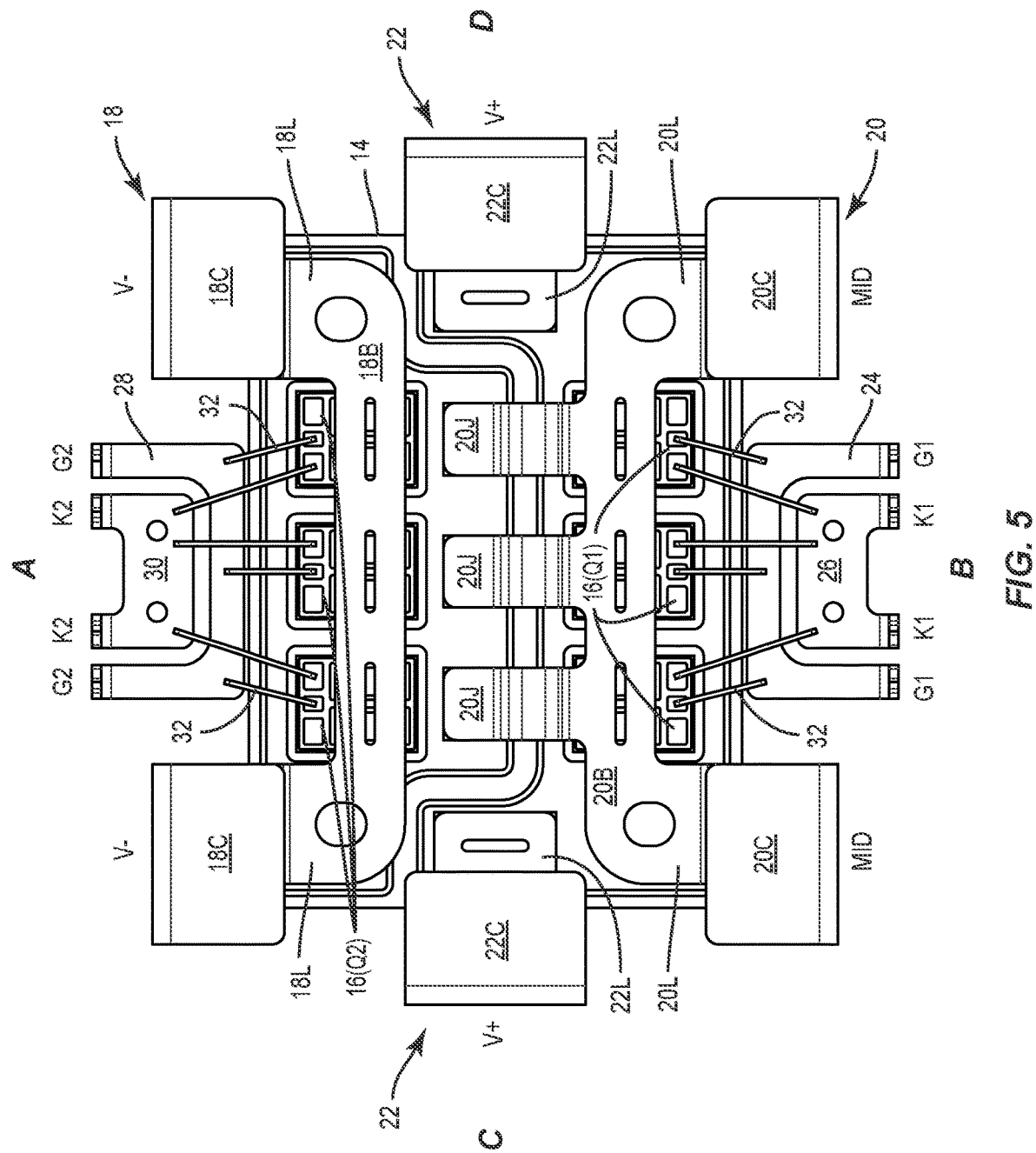
FIG. 5 is a top view of the internal structure of the first embodiment of the present disclosure.
Figure 6:
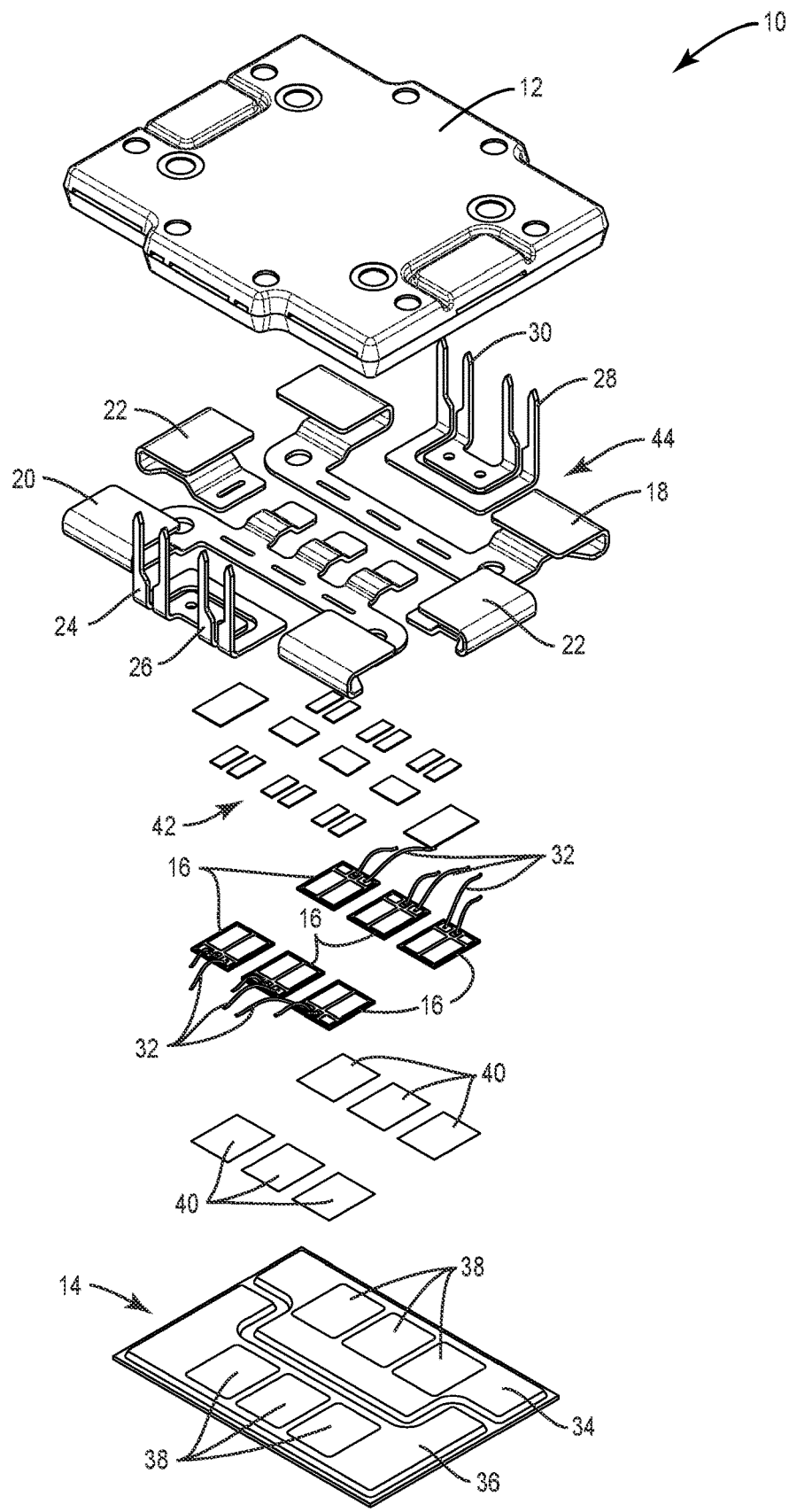
FIG. 6 is an exploded view of the first embodiment of the present disclosure.
Figure 7:
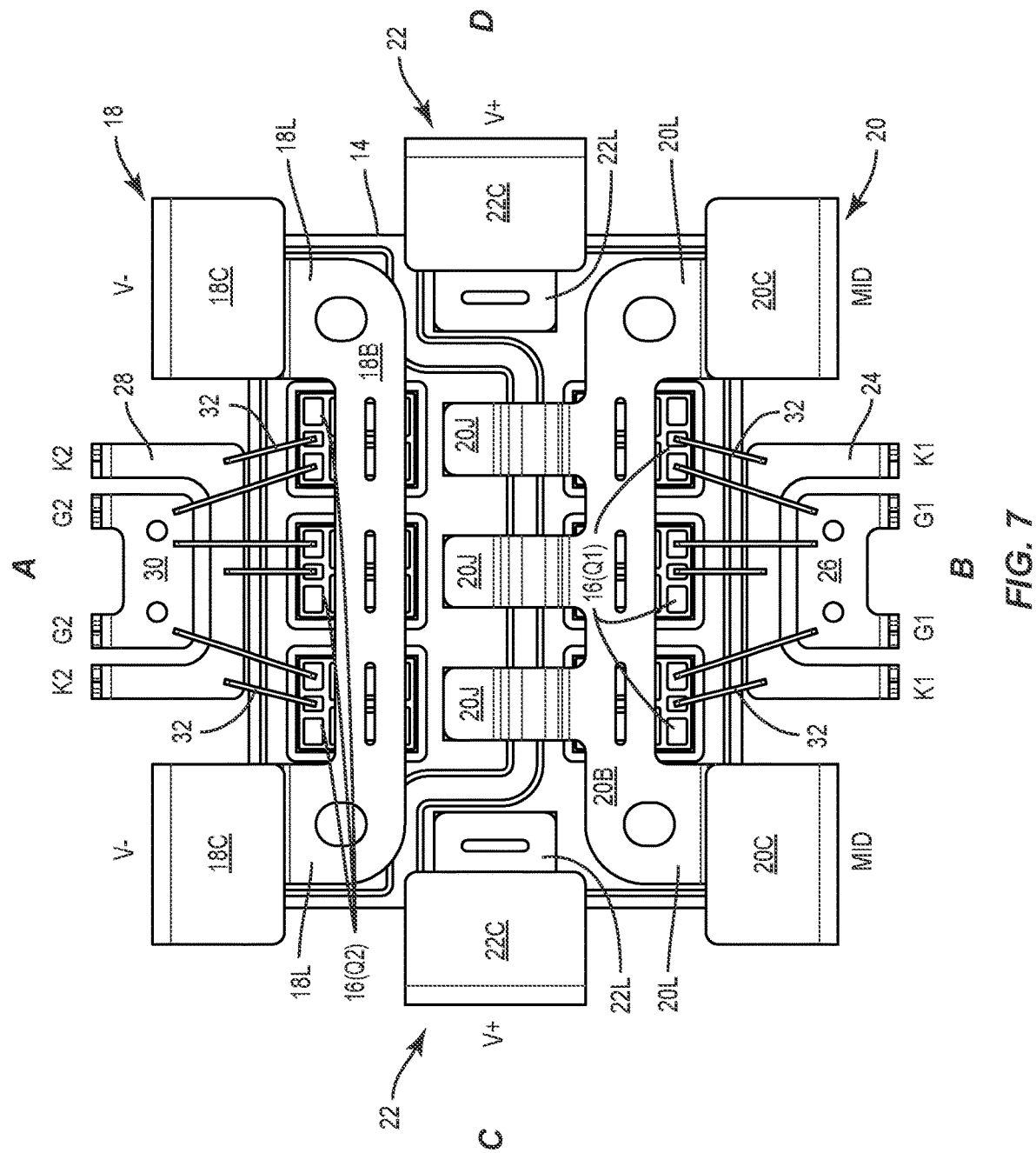
FIG. 7 is a top view of the internal structure of an alternative embodiment of the present disclosure.

An exemplary power module 10 is illustrated in FIGS. 3, 4, 5, and 6, according to a first embodiment. FIG. 3 is an isometric view of the power module 10 with a housing 12, which may be molded. FIGS. 4 and 5 are isometric and plan views of the power module 10 without the encapsulating molded housing 12. FIG. 6 is an exploded view of the power module 10. The following description collectively references each of FIGS. 3, 4, 5, and 6.

At the core of the power module 10 resides a substrate 14 with power devices 16 mounted to a top surface thereof. In this embodiment, the power devices 16 are transistors Q1 (i.e. Q1', Q1", Q1'") and Q2 (i.e. Q2', Q2", Q2'"). A first terminal assembly, which is referred to as the V− terminal assembly 18, is mounted over transistors Q2 (16) near side A of the power module 10. The V− terminal 18 assembly is conductive and directly attached to the source contacts on the top side of transistors Q2 to form the V− node of FIG. 2.

Two opposing terminals, which are referred to as the V+ terminal assemblies 22, are mounted to a first trace/pad 34 (FIG. 6) on the top surface of the substrate 14 near sides C and D. The transistors Q1 are mounted on the substrate 14 such that the drains of transistors Q1 are directly attached to the first trace/pad 34. As such, the drains of transistors Q1 and the V+ terminal assemblies 22 form the V+ node of FIG. 2.

Another terminal assembly, which is referred to as the MID-terminal assembly 20, is mounted over transistors Q1 (16) near side B of the power module 10. The MID-terminal assembly 20 is conductive and directly attached to the source contacts on the top side of transistors Q1. The MID-terminal assembly 20 includes integral jumpers 20J that extend to and directly attach to a second trace/pad 34, on which the drains contacts of transistors Q2 are directly attached. As such, the drain contacts of transistor Q2, the source contacts of transistor Q1, and the MID-terminal assembly 20 form the MID node of FIG. 2.

The gate and source-kelvin contacts (G1, K1) for transistors Q1 are electrically coupled to pin assemblies 24, 26, respectively using bond wires 32. Similarly, the gate and source-kelvin contacts (G2, K2) for transistors Q2 are electrically coupled to pin assemblies 28, 30, respectively, using bond wires 32. The pin assemblies 24, 26, 28, 30 are directly mounted to the top surface of the substrate 14, such that they are electrically isolated from each other as well from the high-power V−, V+, and MID-nodes. Details pertaining to the design and shape of the pin assemblies 24, 26, 28, 30, V− terminal assembly 18, the opposing MID-terminal assembly 20, and the V+ terminal assemblies 22 are provided further below. Notably, such designs may include additional pins or pin assemblies that provide input or output nodes for the electronics provided by the power module 10. These additional pins and pin assemblies could be used for current sensing, temperature sensing, biasing, and the like.

Reference is now made to the exploded view of the power module 10 in FIG. 6. Starting from the bottom of the figure, the power devices 16, which include transistors Q1, Q2, are attached to the first and second traces 34, 36 at mounting locations 38 using device attach material 40. The device attach material 40 may be a solder, adhesive, sintered metal, or the like that provides for mechanical structure, high current interconnection, and high thermal conductivity.

The pin assemblies 24, 26, 28, 30, V− terminal assembly 18, the MID-terminal assembly 20, and the V+ terminal assembly 22 are formed from a single lead frame 44. The portions of the top of the power devices 16 and the substrate 14 that are connected to corresponding bottom portions of the V− terminal assembly 18, the MID-terminal assembly 20, and the V+ terminal assemblies 22 using lead frame attach material 42. The lead frame attach material may be solder, adhesive, sintered metal, a laser weld, an ultrasonic weld, and the like that provides mechanical structure, high current interconnection, and high thermal conductivity. The lead frame 44 is typically a metal contact strip for high current external connection and internal interconnection. Any contacts are joined together on a single sheet, often with multiple products per sheet, and processed as an array before being formed and singulated.

The bond wires 32 are typically used to connect the control contacts of the power devices 16 to the various pin assemblies 24, 26, 28, 30. The bond wires 32 may be ultrasonically or thermosonically bonded large diameter wire capable of supporting relatively high current electrical interconnection. Alternatively, the pin assemblies 26, 26, 28, 30 may be bonded directly to the power devices 16, traces on the substrate 18, or the like.

The housing 12 may be formed using a transfer or an injection molding process to provide mechanical structure, high voltage isolation. The housing 12 encapsulates the internal parts of the power module 10. The mold compound used for the housing 12 may be a transfer or compression molded epoxy molding compound (EMC) capable of providing mechanical structure, high voltage isolation, coefficient of thermal expansion (CTE) matching, and low humidity absorption.

The V− terminal assembly 18 includes an elongated first bar 18B, which resides between two terminal legs 18L. Together, the elongated first bar 18B and the two terminal legs 18L form a U-shape in the illustrated embodiment. Other shapes are envisioned, such as T, V, and C-shapes. Each of the terminal legs 18L are shaped such that it extends outward from the first bar 18B toward side A of the power module 10, passes through the side of the housing 12, turns upward toward the top of the housing 12, and then turns inward over a portion of the top of the housing 12 to provide a V− terminal contact 18C. As such, a distal portion of each of the terminal legs 18L is bent back over an intermediate portion thereof. As noted above, bottom portions of the first bar 18B of the V− terminal assembly 18 are directly attached to the source contacts of transistors Q2 (power devices 16). Embossments E (not shown) may be provided as described in embodiments described further below. The V− terminal contacts 18C at the exposed distal ends of terminal legs 18L provide terminal contacts for the first terminal assembly 18.

Similarly, the MID-terminal assembly 20 includes an elongated second bar 20B, which resides between two terminal legs 20L. Together, the second bar 20B and the two terminal legs 20L form a U-shape in the illustrated embodiment. Other shapes are envisioned, such as T, V, and C-shapes. Each of the terminal legs 20L are shaped such that it extends outward from an end of the second bar 20B toward side B of the power module, passes through the side of the housing 12, turns upward toward the top of the housing 12, and then turns inward over a portion of the top of the housing 12 to provide a MID-terminal contact 20C. As such, a distal portion of each of the terminal legs 20L is bent back over an intermediate portion thereof. Bottom portions of the second bar 20B of the MID-terminal assembly 20 are directly attached to source contacts of the transistors Q1 (power devices 16). Embossments E (not shown) may be provided as described in embodiments described further below. The exposed distal ends of second terminal legs 30 provide terminal contacts for the second terminal assembly 20.

The MID-terminal assembly 20 in this embodiment also includes multiple (3) integrally formed jumpers 20J, which extend from the second bar 20B toward the first bar 18B of the first terminal assembly 18. The distal ends of the jumpers 20J are directly attached to the first trace 34 on the top surface of the substrate 14, as described above. The jumper 20J may be replaced with a single bar. Further, the number of jumpers 20J may vary from one embodiment to another. In certain embodiments, there will be one jumper 20J per power device 16 that is coupled to the MID-terminal assembly 20.

The two opposing V+ terminals assemblies 22 are each shaped similarly to the terminal legs 18L, 20L of the first and second terminal assemblies 18, 20. Other shapes are envisioned. One end of each opposing terminal 22 is directly attached to the second trace 36 on the top of the substrate 14. From the substrate 14, each opposing terminal 22 extends outward toward sides C and D of the power module 10, passes through a respective side of the housing 12, turns upward toward the top of the housing 12, and then turns inward over a portion of the top of the housing 12. As such, a distal portion of each of the V+ terminal assemblies 22 is bent back over an intermediate portion thereof. The exposed distal ends of opposing terminals 22 provide terminal contacts 22C for the V+ terminal assemblies 22. As illustrated, the V− and MID− terminal assemblies 18, 20 are located on opposing sides A and B of the power module 10. The two opposing V+ terminal assemblies 22 are located on the remaining opposing sides C and D of the power module 10. Notably, the V−, V+, and MID terminal contacts 18C, 22C, 20C may be coplanar or non-planar depending on the application. The V−, V+, and MID terminal contacts 18C, 22C, 20C may also be formed into different configurations, with some having two bends to form a C shape while some may only have one bend forming an L and the like. Non-planar configurations that place the contacts on two, three, or more different planes may provide additional options for connecting these contacts to external bus bars.

Groups of nested signal pin assemblies 24, 26 and 28, 30 are provided between the terminal legs 18L of the V− terminal assembly 18 and the terminal legs 20L of the MID-terminal assembly 20. The pin assemblies 24, 26, 28, 30 in the illustrated embodiment are U-shaped and include a pin bar 24B, 26B, 28B, 30B and a pair of pin legs 24L, 26L, 28L, 30L, which extend from each pin bar 24B, 26B, 28B, 30B. Other embodiments may use L and T shapes for the signal pin bars 24B, 26B, 28B, 30B. The pin legs 24L, 26L, 28L, 30L extend outward through the respective sides of the housing 12 and the turn vertically upward. The bond wires 32 electrically connect the power devices 16 to the pin bars 24B, 26B, 28B, 30B of the pin assemblies 24, 26, 28, 30.

In general, there are two categories of electrical loops in a power module: the power loop and the signal loop. The power loop is a high voltage, high current path through the transistors Q1, Q2 for delivering power to a load via the drain (or collector) and source (or emitter) of the transistors Q1, Q2, wherein the load is typically connected to the MID-terminal assembly 20. The signal loop is a low voltage, low current path through the gates G1, G2 (or bases) and the sources S (or emitters) of transistors Q1, Q2. The gate-source (or base-emitter) signal path actuates the transistors Q1, Q2 to effectively turn-on or turn-off the transistors Q1, Q2. As detailed below, the signal loop may also entail the source-Kelvin connections K1, K2 of the transistors Q1, Q2.

Figure 8:
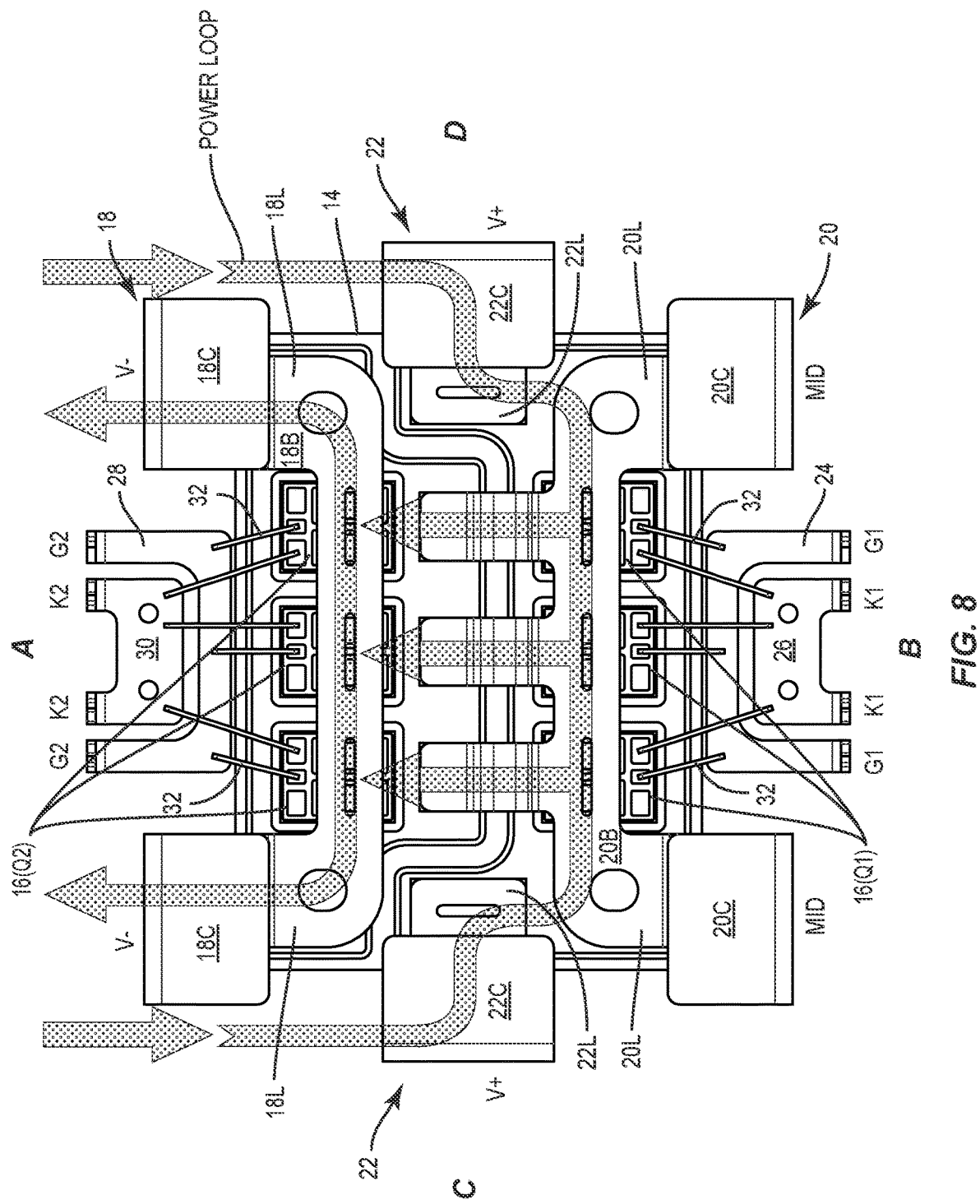
FIG. 8 illustrates an exemplary power loop for the first embodiment of the present disclosure.

The power loop effectively runs between the V+ terminal assembly 22 and the V− terminal assembly 18. The V+ terminal assembly 22 and the V− terminal assembly 18 are typically connected across a DC supply, such as a battery in parallel with a large capacitance. An exemplary power loop for the illustrated power module 10 is shown in FIG. 8.

The opposing V+ terminal assemblies 22 are directly attached to opposing ends of the second trace 36 on the substrate 14. Power flows into the power module 10 through the contacts 22C and legs 22C of the two V+ terminal assemblies 22. As such, power flows onto the opposing ends of the second trace 36 on the substrate 14 via the terminal assemblies 22 and over to the drain contacts of transistors Q1. The drain contacts of transistors Q1 are on the bottoms of the transistors Q1 and are also directly attached to the second trace 36. The transistors Q1 are attached to the second trace 36 between the points where the two V+ terminal assemblies 22 are attached to the second trace 36, and the transistors Q1 are equally spaced apart from one another and the points of attachment for the two V+ terminal assemblies 22.

Power then flows up through transistors Q1 from the drains of transistors Q1 to the sources of transistors Q1. The sources of transistors Q1 are attached to the bottom side of the second bar 20B of the mid terminal assembly 20. The mid-terminal jumpers 20J of the mid terminal assembly 20 connect the second bar 20B of the mid terminal assembly 20 to the first trace 34 on the substrate 14. The drains of the transistors Q2 are directly attached to the first trace 34 and are equally spaced apart from one another. From the drains of the transistors Q2, power flows up through transistors Q2 to the sources of transistors Q2. The sources of transistors Q2 are directly connected to the bottom side of the first bar 18B of the V− terminal assembly 18. As such, power flows along the first bar 18B to the contacts 18C of the V− terminal assembly 18 via the opposing legs 18L.

By using symmetrical V+ terminal assemblies 22 and a symmetrical V− terminal assembly 18, the current sharing between devices is balanced, smaller external contacts can be used, which helps with lead frame panelization, and inductance is greatly reduced by shortening the overall current paths of the power loop. As described further below, the contacts 18C, 20C, and 22C of the V-terminal assembly 18, the MID-terminal assembly 20, and the V+ terminal assemblies 22 may be electrically connected external interconnections using laser welds, solder, ultrasonic welds, mechanical bonds (clamps, springs, etc.), conductive adhesives, or any other conductive bond.

Current must flow through a closed circuit. Accordingly, stray inductance of the package itself is not the only contributing factor to the full loop inductance. Inductance of the full loop, including any capacitance of the power supply and capacitors provided across the power supply, external bussing and wiring, and the power module 10 itself should be considered. As such, not only should the internal layout of the power module 10 be low-inductance, but the locations of the V-terminal assembly 18, the MID-terminal assembly 20, the V+ terminal assemblies 22 should also allow for low-inductance laminated bussing or a similar interconnection method to connect the power module 10 to the DC supply.

Figures 9A, 9B:
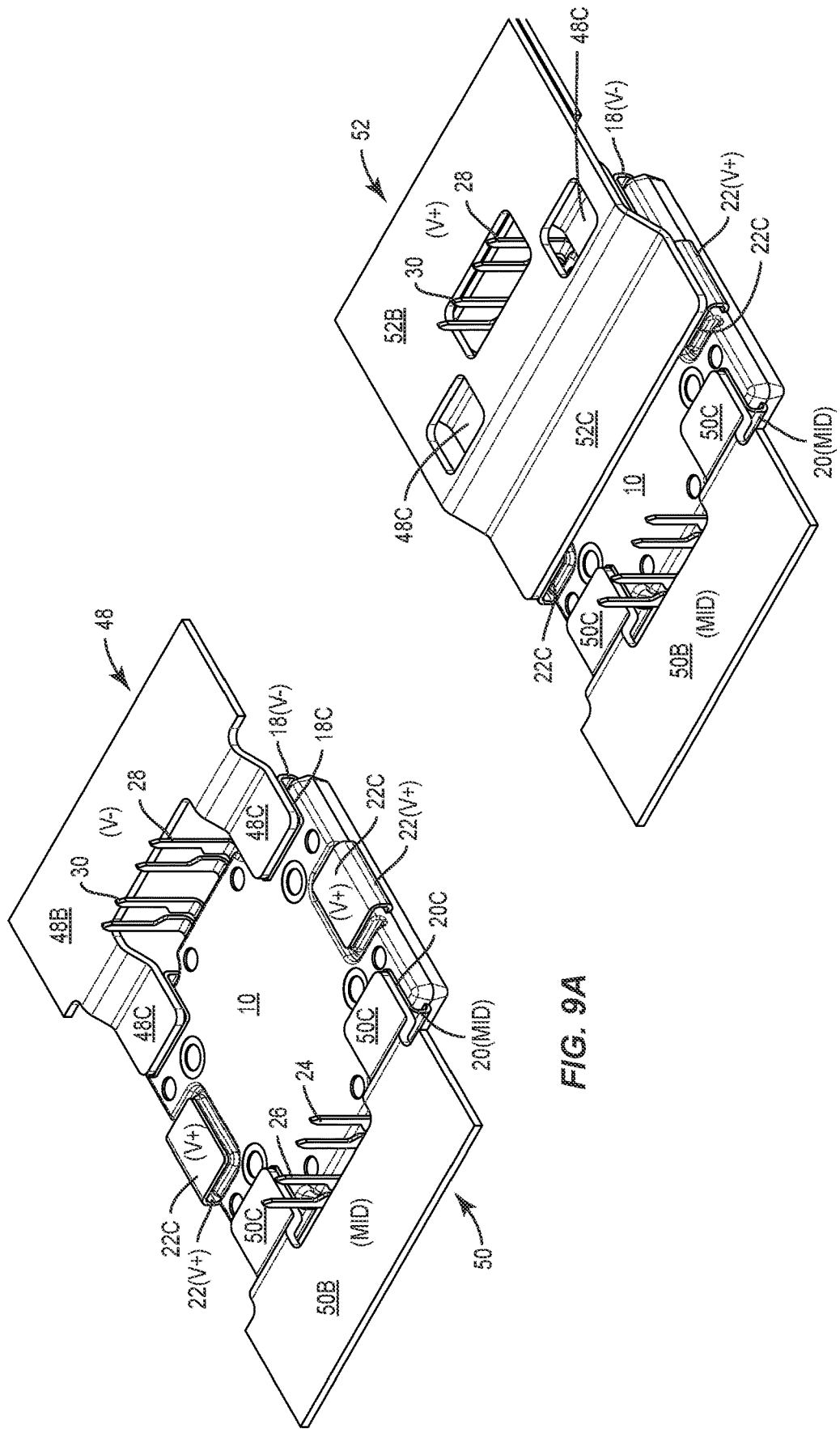
FIG. 9A illustrates a first embodiment of a terminal connection to a low inductance bus bar lower layer according to the present disclosure.
FIG. 9B illustrates a first embodiment of a terminal connection to a low inductance bus bar upper layer according to the present disclosure.

There are many effective approaches to connect the terminals to high performance bussing. FIGS. 9A and 9B depict an approach that uses laminated bus bars: V− bus bar 48, MID bus bar 50, and V+ bus bar 52 to respectively connect to the V− terminal assembly 18, the MID-terminal assembly 20, and the V+ terminals assemblies 22. As such, the metal planes for bussing run over the top of the power module 10. For clarity, only the metal components of the V− bus bar 48, the MID bus bar 50, and the V+ bus bar 52, are shown, but not the lamination film itself. The illustrated configuration provides a high density and low inductance solution where neighboring power modules 10 could be closely positioned near each other, such as for paralleling or forming a multi-module topology.

With particular reference to FIG. 9A, the V− bus bar 48 has a body 48B from which two contacts 48C extend. The contacts 48C are physically and electrically connected to contacts 18C of the V− terminal assembly 18. Similarly, the MID bus bar 50 has a body 50B from which two contacts 50C extend. The contacts 50C are physically and electrically connected to contacts 20C of the MID terminal assembly 20. Turning to FIG. 9B, the V+ bus bar 52 has a body 52B from which a single, wide contact 52C extends. The contact 52C is physically and electrically connected to contacts 22C of the opposing V+ terminal assemblies 22. An opening in the V+ bus bar 52 provide access to the contacts 48C of the V− bus bar 48 as well as a pass through for pin assemblies 28, 30 for the gate G2 and source-Kelvin K2 signals. FIG. 9B shows the bend in the V+ bus bar 48 that could be avoided in some situations by raising the V+ terminal assemblies 22 up so that they are not co-planar with the V− terminal assemblies 18.

Figure 9C:
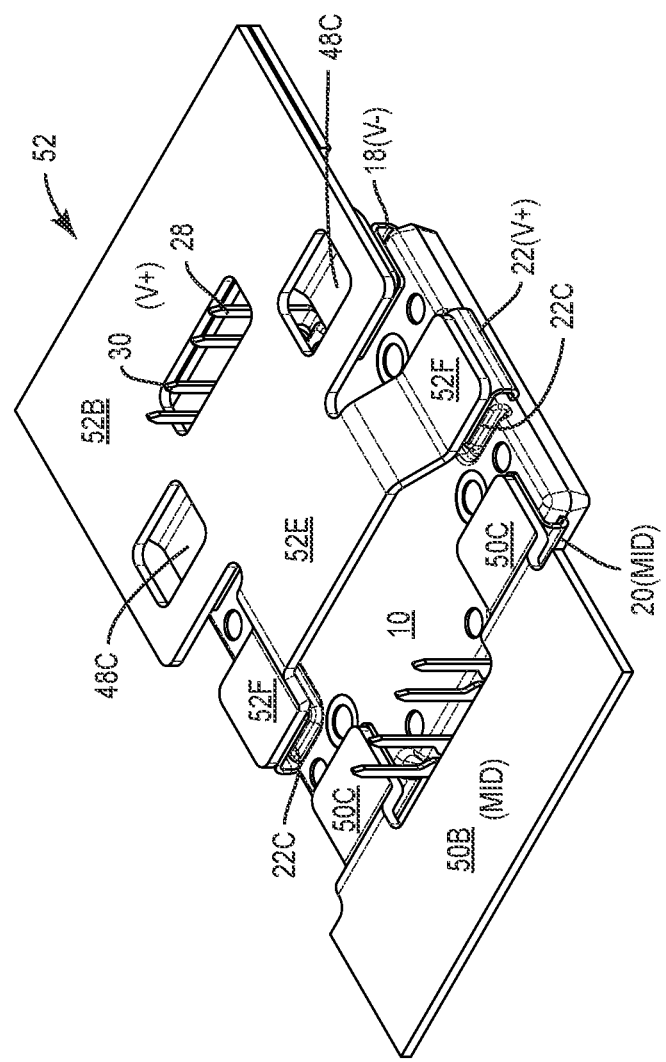
FIG. 9C illustrates a second embodiment of a terminal connection to a low inductance bus bar upper layer according to the present disclosure.

FIG. 9C provides an alternative configuration for the V+ bus bar 52. The V+ bus bar 52 has an extension 52E that extends from the body 52B. The body has two opposing feet 52F that drop down from extension 52E to the contacts 22 of the V+ terminal assemblies 22. The configuration in FIG. 9C would slightly sacrifice some inductance (i.e. increased inductance due to less lamination area) in exchange for more strain relief and less rigidity with respect to the configuration of FIG. 9B.

Another bussing approach is illustrated in FIGS. 10A and 10B. Here, the bussing runs more along the sides or around the perimeter of the power modules 10. This may be useful in situations where more access is needed to the contact areas or to the power module 10 in general. For example, if a soldering or welding tool needs to directly touch the metal surfaces of the various contacts.

With particular reference to FIG. 10A, the V− bus bar 48' has a body 48B' from which two contacts 48C' extend. The V− bus bar 48' is biased outside of the perimeter of the power module 10, wherein the two contacts 48C' wrap around opposing sides of the power module 10 before extending inward and downward to make contact with the contacts 18C of the V− terminal assembly 18. Similarly, MID bus bar 50' has a body 50B' from which two contacts 50C' extend. The MID bus bar 50' is biased outside of the perimeter of the power module 10 wherein the two contacts 50C' wrap around opposing sides of the power module 10 before extending inward and downward to make contact with the contacts 20C of the MID-terminal assembly 20.

Turning to FIG. 10B, the V+ bus bar 52' is biased outside of the perimeter of the power module 10 and resides over the V− bus bar 48'. The V+ bus bar 52' has two contacts 52C', which wrap around opposing sides of the power module 10 before extending inward and downward to make contact with the respective contacts 22C of the V+ terminal assemblies 22. Many more bussing approaches and module variants could be envisioned depending on specific system configurations. Ultimately, the end goal is to provide a versatile and effective terminal arrangement to allow for a variety of end user solutions.

The signal loops, or the gate and source connections, for each transistor (Q1, Q2) position also benefit from a low impedance to minimize voltage stresses on the gates of the transistors Q1, Q2 during switching. While the gate stresses can be buffered or reduced by adding resistors, this is often at the cost of higher package complexity, higher cost, and slower switching speeds. Most importantly, for optimal switching performance, the power loops and signal loops should be completely independent of each other to enable low switching loss with fast, well controlled dynamics.

The drain-source (or collector-emitter) and gate-source (or gate-emitter) loops share the same connection at the source (or emitter) of the device. If the power path couples into the signal paths, extra dynamics are introduced through either positive or negative feedback. Typically, negative feedback introduces extra losses as the power path coupling fights the control signal (i.e. the power path coupling tries to turn the device off when the control signal is trying to turn the device on). Positive feedback typically causes instability as the power path coupling amplifies the control signal until the devices are destroyed. Ultimately, the coupling of power and signal paths result in a reduction in switching quality, slower switching speeds, increased losses, and possible destruction.

Accordingly, independent loops improve switching quality. In the illustrated embodiments, the power source connection has a separate path from the signal source (referred to as a source-Kelvin) such that one does not overlap or interfere with the other. The closer the separate connections are made to the transistors, the better the switching performance.

Figure 11:
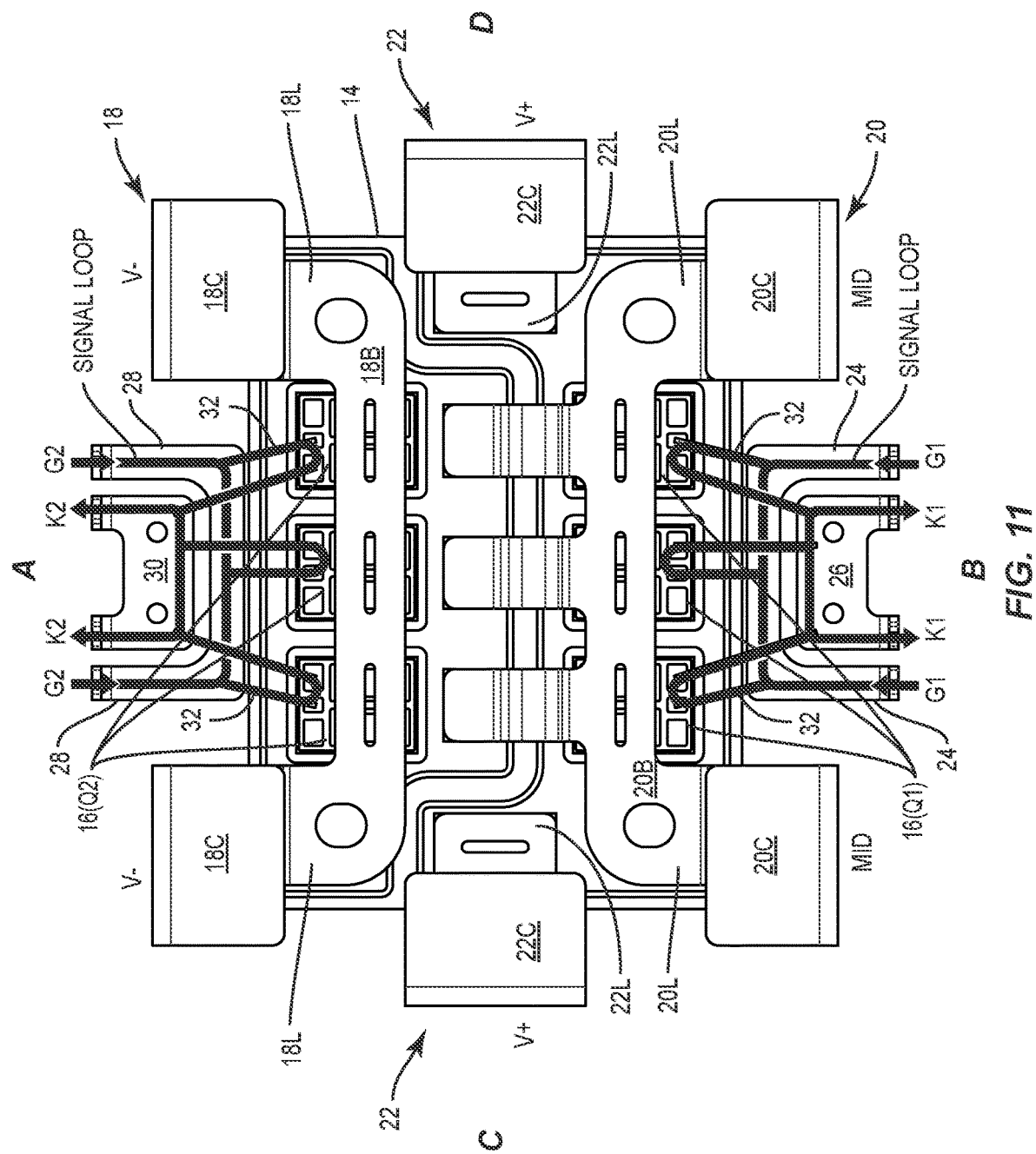
FIG. 11 illustrates exemplary signal loops according to the first embodiment of the present disclosure.

FIG. 11 illustrates the internal signal loops for the illustrated embodiment. The signal loop for transistor Q1 flows onto and through the G1 pin assembly 24 and then through a bond wire 32 to the gate contact of transistor Q1, where the signal is presented to transistor Q1. The signal loop flows from transistor Q1 via the source contact of transistor Q1. From the source contact, the signal loop flows through another bond wire 32 directly to and through the K1 pin assembly 26.

Similarly, the signal loop for transistor Q2 flows onto and through the G2 pin assembly 28 and then through a bond wire 32 to the gate contact of transistor Q2, where the signal is presented to transistor Q2. The signal loop flows from transistor Q2 via the source contact of transistor Q2. From the source contact, the signal loop flows through another bond wire 32 directly to and through the K2 pin assembly 30. As shown, this is a true source-Kelvin implementation in which the power and signal loops are completely independent.

Figure 12:
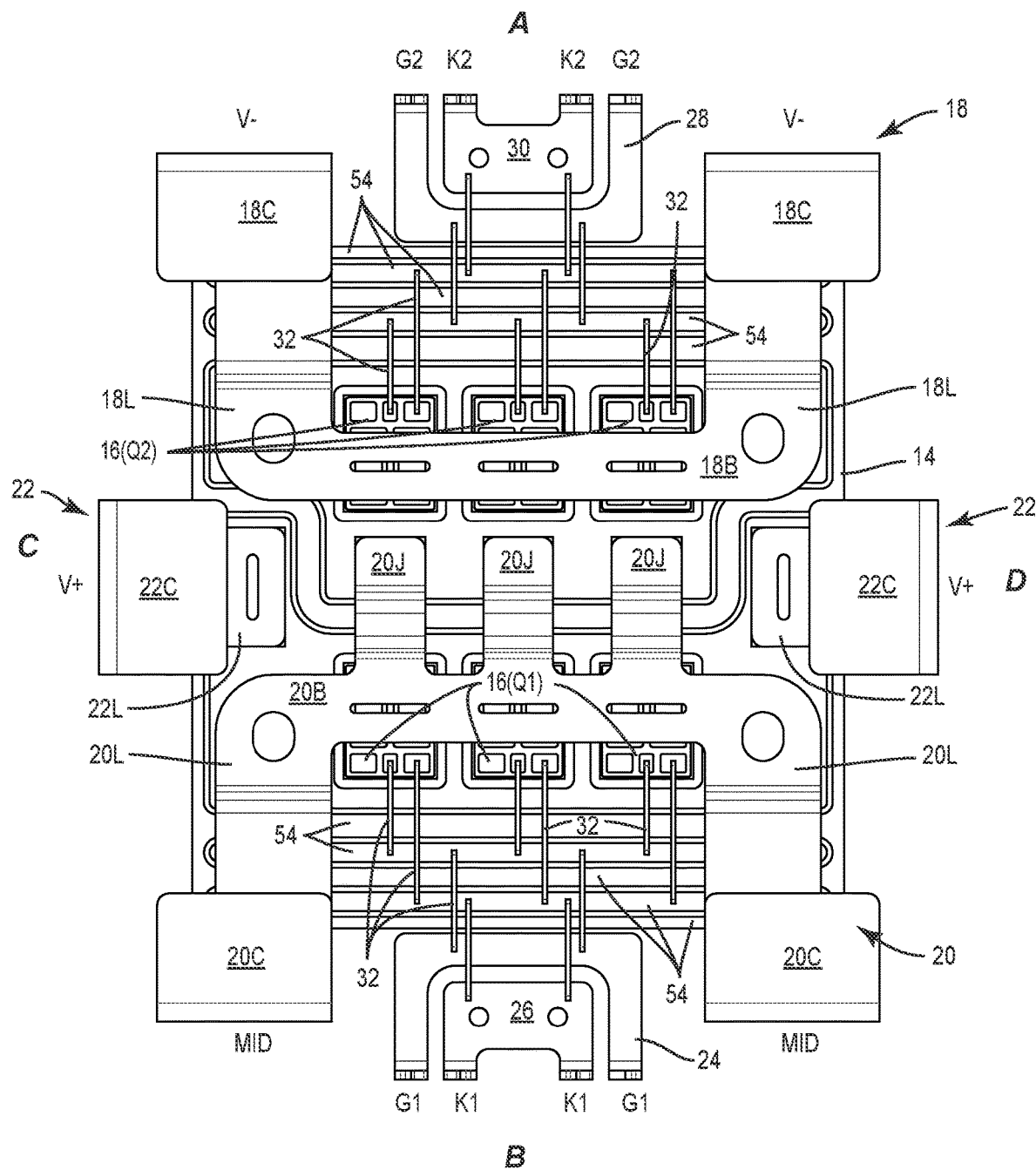
FIG. 12 illustrates direct bonding to the power substrate according to one embodiment of the present disclosure.

The signal loops in FIG. 11 are merely one embodiment. As shown in FIG. 12, other embodiments may include additional signal traces 54 on the top of the substrate 14. In such embodiments, one set of bond wires 32 first connects the gate and source contacts of the transistors to the additional signal traces 54, and a second set of bond wires 32 connect these additional signal traces 54 to the appropriate pin assemblies 24-30 (G1, G2, K1, K2). While the latter configuration does allow for simpler signal pin implementations, it requires significantly more substrate area, which may result in an increase in cost. Ultimately, the layout is flexible to be compatible with both, and each embodiment may be enhanced or optimized for different applications or specifications.

A further issue arises in transconductance mismatches between paralleled devices. Transconductance is effectively the current gain of the device, and corresponds to the relationship between the output current to the input voltage. During switching, the input voltage rises and results in an associated rise in the output current. If there is a transconductance difference between paralleled devices, which is common in silicon carbide power devices, the devices will each have slightly different turn-on characteristics. With different currents running through the devices, each device is presented slightly different voltages. These voltage mismatches will result in a 'balancing current' that flows between the devices during switching.

This balancing current will prefer the path of least impedance, which could be through the signal loop instead of the power loop. Like the issues of interference with the coupled power and signal loops, this balancing current can affect switching quality. Introducing this high, uncontrolled current through the signal loop can also introduce a reliability concern as the signal loops are not intended to carry high currents.

Figure 13:
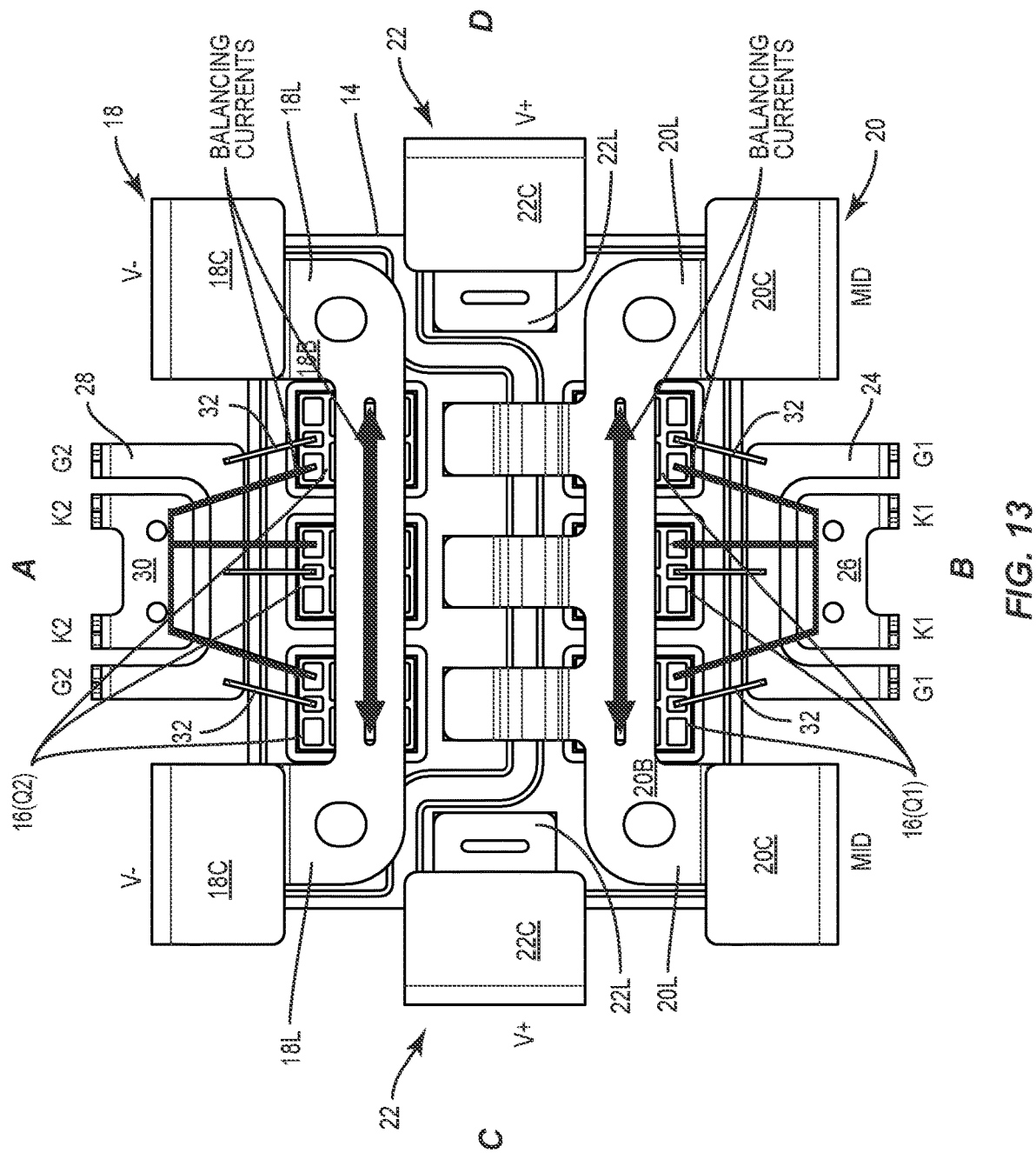
FIG. 13 illustrates balancing current paths between devices due to transconductance mismatches.

In one embodiment, a significantly lower inductance is found through the metal sheet running across the source pads on the topside of the devices. These paths are depicted in FIG. 13. In comparison, the effective path length and cross section of the source bond path has a comparatively higher impedance. In practice, the balancing current will flow through the power contact and not interfere with the signals.

Figures 14A, 14B:
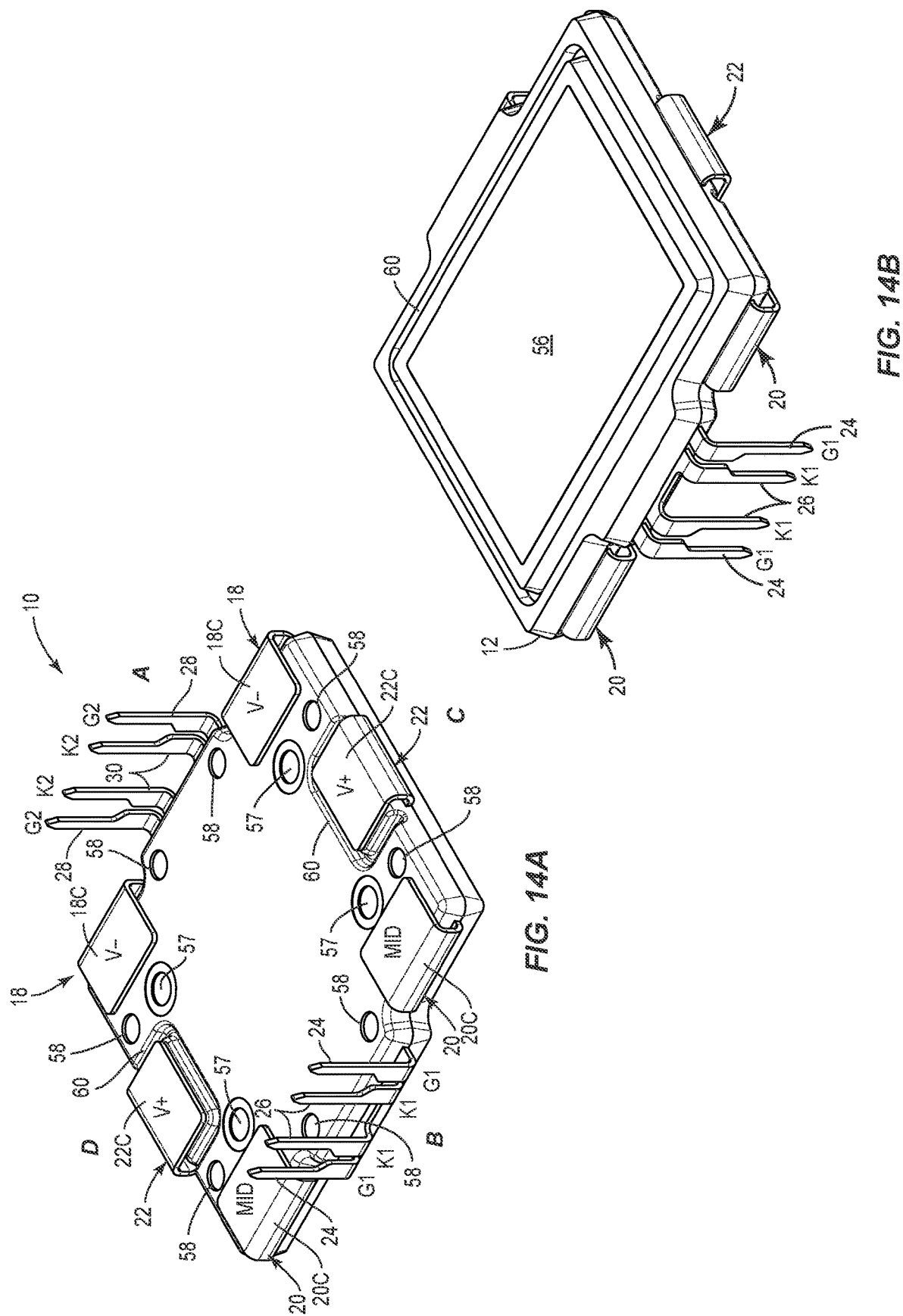
FIGS. 14A and 14B are front and rear isometric views of the external housing of the power module according to one embodiment of the present disclosure.

Turning now to FIGS. 14A-14D, the package is encased by a protective plastic or epoxy housing 12 through transfer molding, compression molding, injection molding, or similar process. Several notable features of the housing 12 are highlighted in FIGS. 14A-14D and discussed below. As shown in FIG. 14B, the backside metal of the power substrate 14 is exposed on the underside of the power module 10 to provide a thermal pad 56. The thermal pad 56 is used as a thermal contact surface to remove heat from the power module 10. The thermal pad 56 may be sintered, soldered, epoxied, or similarly attached to a heat sink or cold plate (not shown) to further assist the removal of waste heat from the power module 10.

Features in the housing may vary based on the manufacturing method. The embodiment of FIGS. 14A-14D is representative of the structural characteristics of transfer molding. There are four hold-down pin vestiges 57 shown, but there may be more or fewer depending on the overall size of the power module 10. Hold-down pins (not shown) press down directly on the power substrate during the transfer molding process to limit the amount of plastic bleed or flash on the exposed portion of the thermal pad 56. This ensures that the thermal surface is free of debris and capable of acting to remove heat efficiently. There are also ejector marks 58 around the perimeter of the housing 12. The ejector marks 58 are small recesses created by ejector pins (not shown) that are used to remove the power module 10 from the mold (not shown) while it is still hot. Specific locations and associated geometries of these features will vary depending on specific product size and implementation.

Clearance and creepage may be an important aspect for a high voltage product. Between conductors at different voltage potentials, clearance is the shortest direct path in air between the conductors. Creepage is the shortest direct path along a surface between the conductors. Meeting safety standards is a challenge and is often at odds with manufacturing method (tooling, epoxy flow, etc.) and product size (footprint and power density). For small transfer molded packages, particularly low profile and high voltage SiC based products, reaching a suitable balance is difficult.

In certain embodiments, the clearance distances are adequate and within standard. To increase the creepage distance, and correspondingly increase maximum allowable voltage, creepage extenders 60 are used. Creepage extenders 60 are grooves, ripples, or other surface enhancements that extend the surface distance between conductors at different potentials. As illustrated, the creepage extenders 60 are included as part of the plastic or epoxy housing 14, providing extra functionality without adding cost. FIG. 14C and 14D show one implementation of these features on the housing 12 of the power module 10. Other patterns are possible on the topside and backside depending on specific design implementation.

To minimize the length of the power loop, some or all of the edge power contacts, such as those for the V− and MID-terminal assemblies 18, 20 may be inset from the edge of the housing 12, in comparison to the signal contacts, such as the pin assemblies 24, 26, 28, 30, as shown in FIG. 15. The signal contacts provided by pin assemblies 24, 26, 28, 30 need more room to better accommodate the bond wires 32 from the devices; therefore, their housing section extends out from the edge of the overall housing 12. This contoured feature allows for inductance optimization for each of the independent power and signal loops.

The pin assemblies 24, 26, 28, 30 run along a horizontal strip to accommodate devices in parallel. Externally, there are multiple methods to form the pins of the contacts, which would be attached to a printed circuit board gate driver, wires, or similar. Some variations are depicted in FIG. 16A-16D. For conciseness and clarity, only pin assemblies 28, 30 are discussed, but the same concepts will apply to pin assemblies 24, 26.

A first approach is shown in FIG. 16A, wherein the pin assemblies 28, 30 are U-shaped and concentric as described above. In these embodiments, the legs of the pins travel out of respective side portions of the housing and then turn upward toward the top of the housing at an angle between 75 and 105 degrees. Other embodiments may include angles between 70 and 110 degrees, 80 and 100 degrees, 85 and 95 degrees, and 87 and 93 degrees.

The first approach takes advantage of the product symmetry. Depending on where the pin assemblies 28, 30 exit the housing 12, holes 30H in the pin bar 30B of the outer pin-assembly 30 provides for strain relief. A second approach provided in FIG. 16B does not include holes for strain relief. Instead, the strain relief is inherent in the pin bar 30B due to being U-shaped and allowing some portion of the housing 12 being present in the U-shaped bend of the pin assemblies 28, 30. In other approaches, three pins could be used as shown in FIGS. 16C and 16D. In these approaches, the outer pin assembly 28 remains U-shaped with two legs 28L. However, the centrally located inner pin assembly 30 has only a single leg 30L. The bars 30B for the pin assembly 30 may take virtually any shape, such as the angular or triangular shape of FIG. 16C or the T-shape of FIG. 16D.

There are many more pin assembly variations that could be considered, depending on the specific needs of the end system and the format of its gate driver. The illustrated embodiments were developed with modularity and flexibility in mind, enabling numerous potential product variations.

Figure 17A:
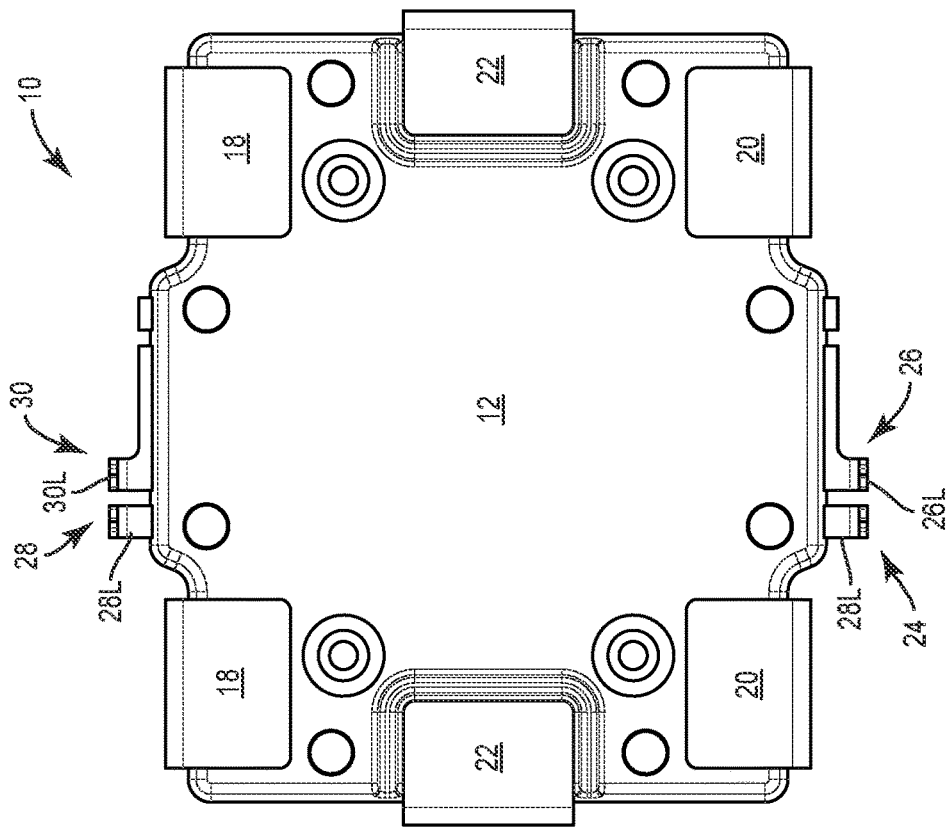
FIGS. 17A and 17B illustrates examples of signal pin trimming according to the present disclosure.
Figure 17B:
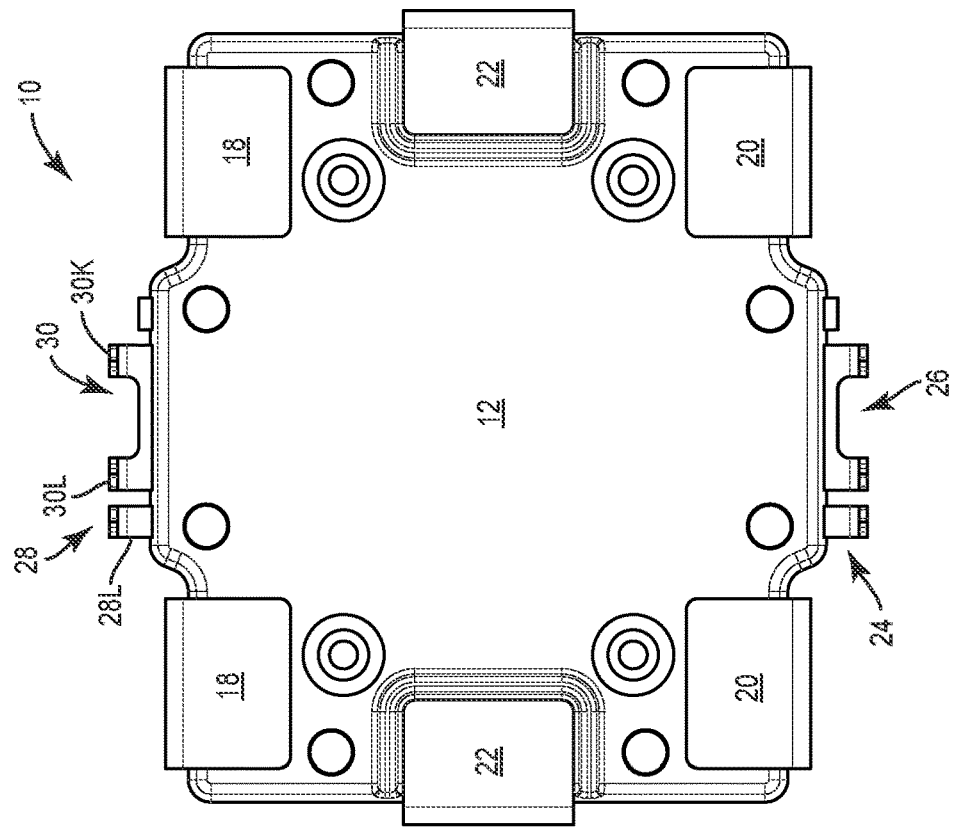

Other pin modifications include trimming some of the legs from the pin assemblies 24, 26, 28, 30, as illustrated in FIGS. 17A and 17B. For instance, removing one leg from pin assemblies 24, 26, 28, 30 to allow gate and or source-Kelvin driver on the PCB to only use two of the contacts (as opposed to four in the prior embodiments). The asymmetric approaches could be useful to maximize the amount of metal area used by external bussing. In FIG. 17A, the inner pin assemblies 26, 30 have both legs 26L, 30L, respectively. Outer pin assemblies 24, 28 have one leg trimmed such that only one leg 24L, 28L remains for each of the pin assemblies 24, 28. In FIG. 17B, both the inner pin assemblies 26, 30 and the outer pin assemblies 24, 28 have one leg trimmed such that only one leg 24L, 26L, 28L, 30L remains for each of the pin assemblies 24, 26, 28, 30.

Figure 18:
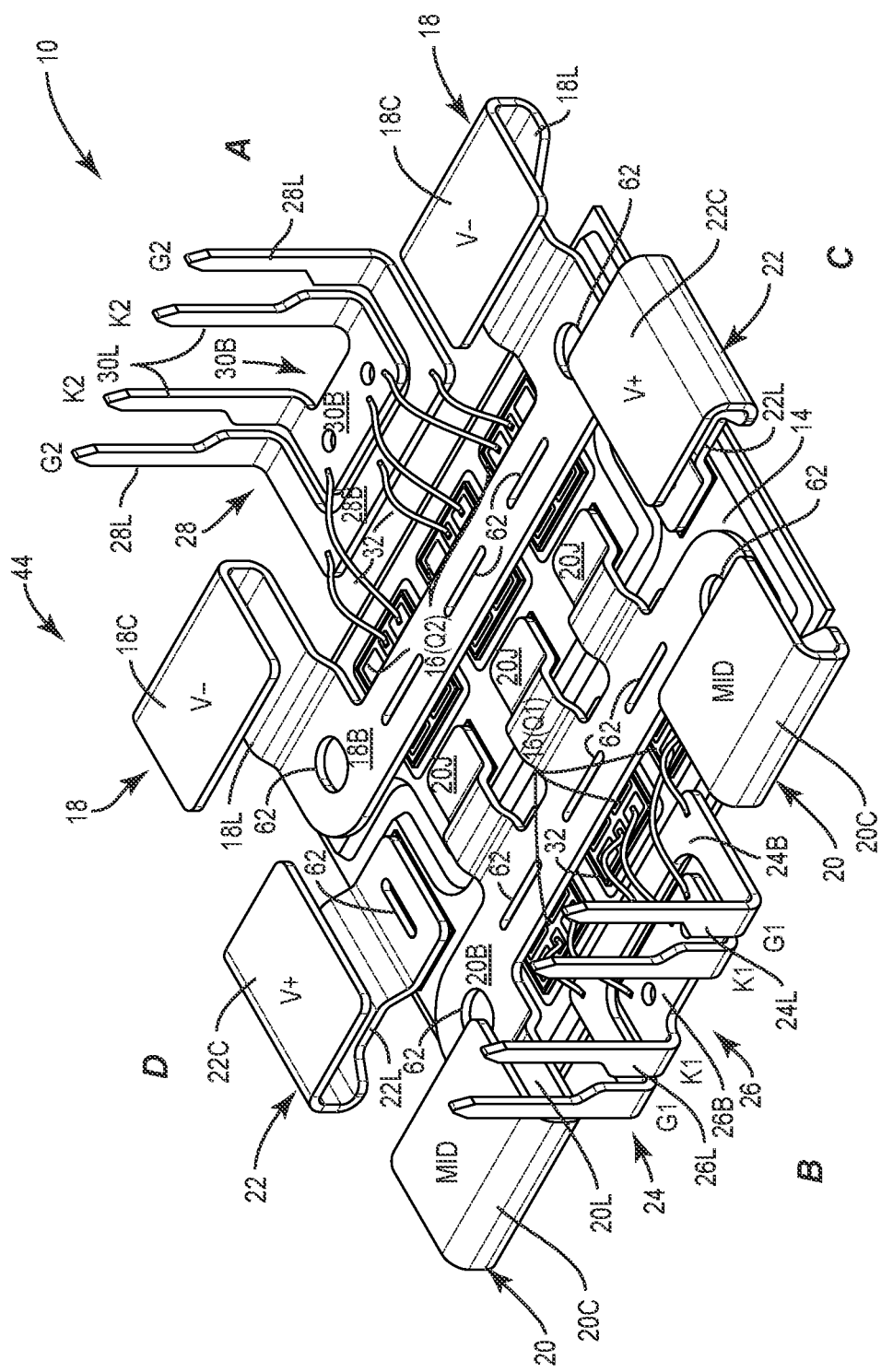
FIG. 18 illustrates lead frame features according to one embodiment of the present disclosure.

As noted above, the terminal and pin assemblies 18-30 are formed from lead frame 44 and combine functionality to provide high current internal interconnections, bond wire locations, and external terminal contact surfaces. Portions or parts of the lead frame 44 attach both to the topside source pads of transistors Q1, Q2 as well as to the substrate 14. The lead frame 44 may attach to the various components in several ways, including soldering, sintering, conductive epoxy, laser welding, ultrasonic welding, etc. Surface enhancement features, such as holes, slots, feathered edges, etc. are referred as 'solder or epoxy catches' and may be used to enhance the strength of the bond, as shown in FIG. 18.

The strip on the lead frame 44 that directly attaches to the topside source pads may have a few distinguishing features. It may have a variety of solder catch implementations, depending on the specific layout of the device being packaged. It may also include ripples (not pictured) between devices for thermal expansion stress relief and enhanced mold flow. Various bends in the lead frame 44 may be used as further means of stress relief.

External to the power module 10, the terminal and pin assemblies 18-30 will be attached to bus bars, wires, printed circuit boards, etc. Vibration in the system may pull on the terminal and pin assemblies 18-30. It is desirable to not have these external forces push or pull on the power devices or bond wires. To this end, where needed, holes, and/or other retention features are placed in the lead frame 44 such that when it is are pulled on, the mold compound filling those holes takes the strain, not the sensitive internal components.

Holes 62 and/or other retention features in the lead frame 44 are placed matching the location of the hold down pins used in the transfer molding process. Ideally, these pins press directly on the substrate. These holes 62 provide clearance such that the pin can accomplish this. They also act as strain relief after the assembly is molded.

Figure 19B:
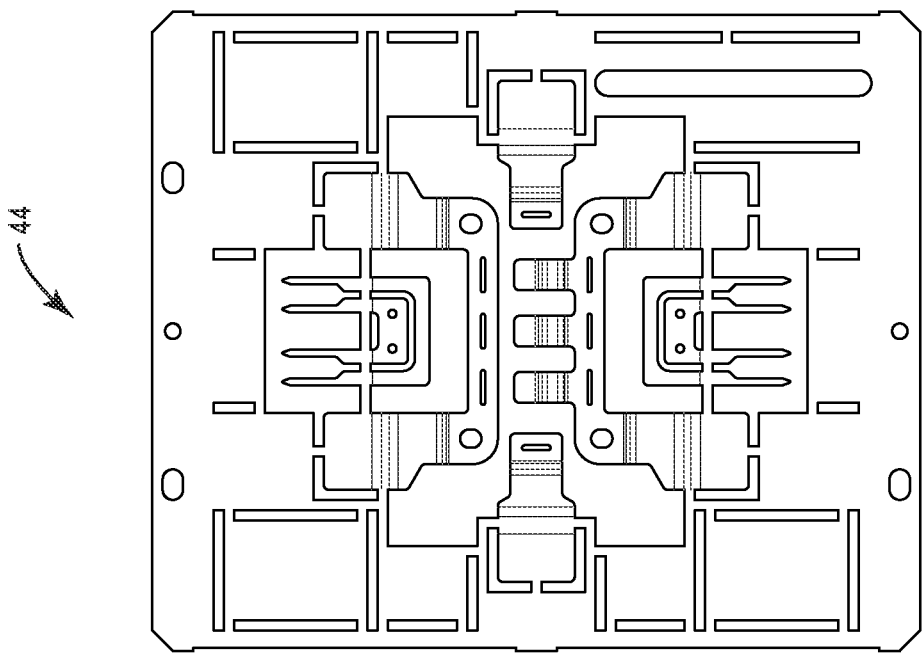
FIGS. 19A and 19B are isometric and plan views of a lead frame section according to the present disclosure.
Figure 19A:
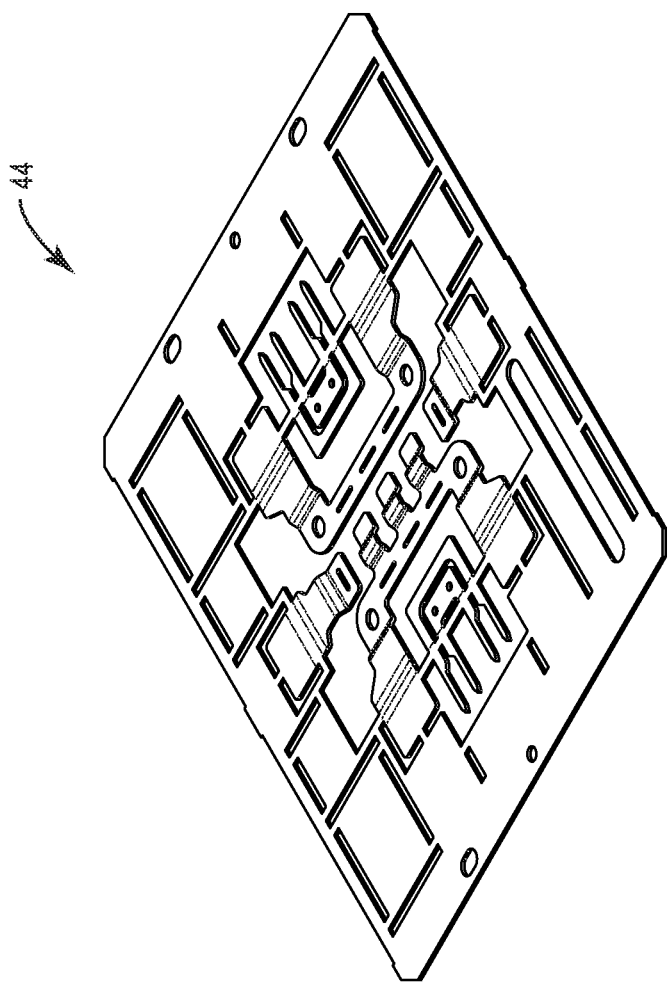

The lead frame 44 may be fabricated from sheet metal in either an etching or stamping process. One example of this is presented in FIGS. 19A and 19B. The contacts and inner features are joined to the external frame by narrow tabs. To streamline processing in panels or magazines, much of the sheet metal begins flat. Only the inner bends are formed. Due to the multiple heated processes that the assembly requires during manufacturing production, thermal expansion slots are added to break up large copper areas. These limit the expansion and warpage of the assembly.

After the lead frame 44 has been attached to the power devices and substrate, wire bonded, and then molded, it is trimmed away from the outer frame at the locations of the joining tabs. The bends of the external contacts are folded and formed, often with procedural steps and selective trimming.

Figure 20:
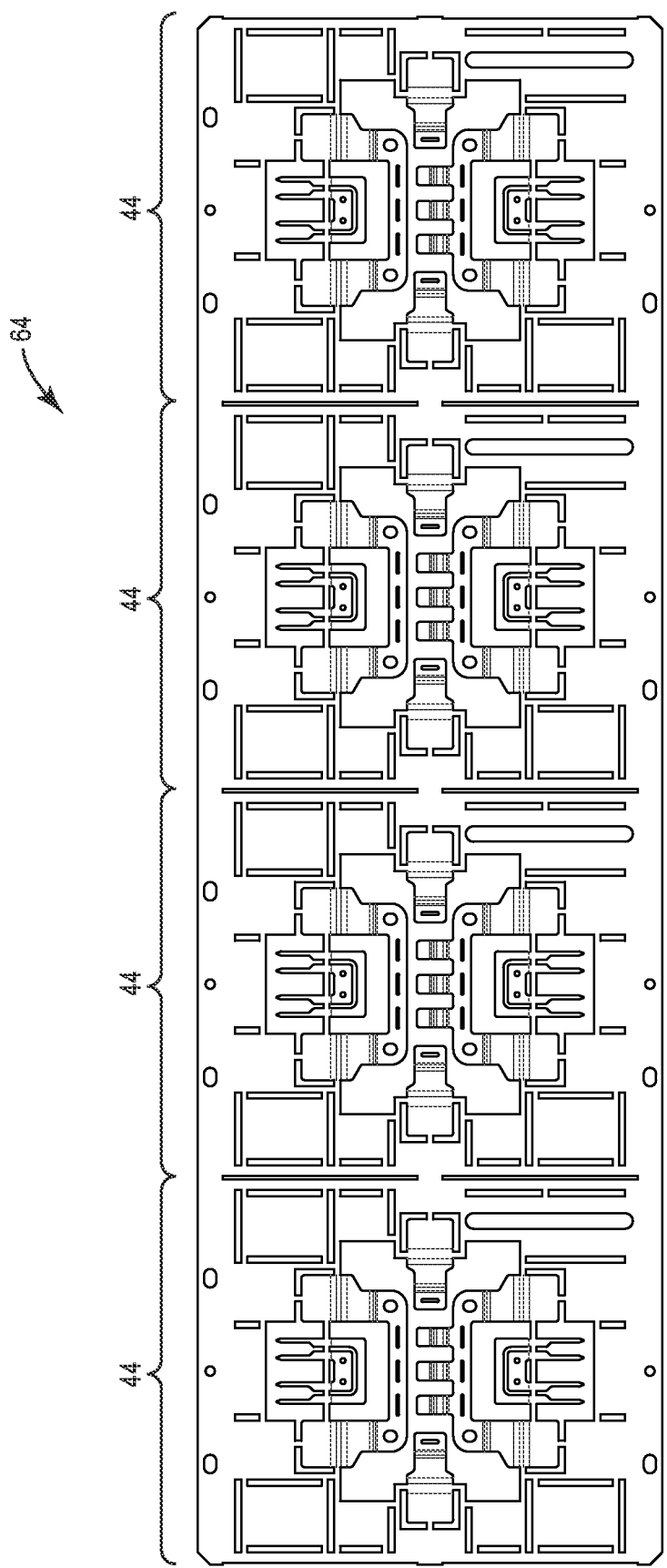
FIG. 20 illustrates one embodiment of a lead frame array according to the present disclosure.

For automated mass production, these lead frames 44 are often patterned into an array. These arrays are handled in multiple machines, often loaded from magazines or racks. Holes on the top and bottom edges are used for fixturing, positioning, keying, and handling. An example lead frame array 64 with four lead frames 44 is shown in FIG. 20. Specific features of the lead frames 44 and the lead frame array 64 will vary depending on product configuration, product size variations, and manufacturing equipment types.

Figure 21:
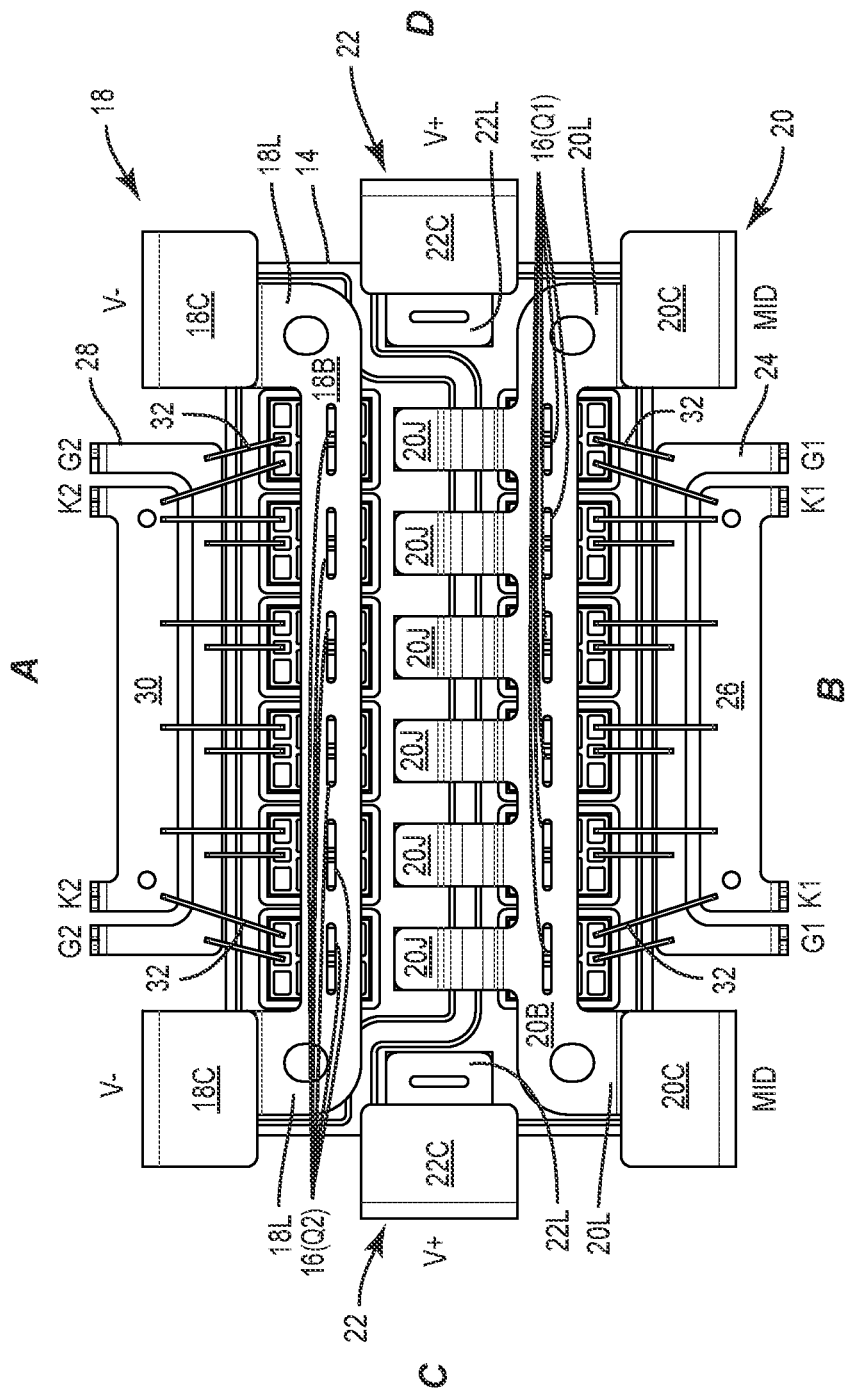
FIG. 21 illustrates a larger variation for a power module according to the present disclosure.

A potential benefit of the illustrated embodiments is the ability to scale the principal layout up or down to best meet the power processing and budget requirements of a broad range of systems and applications. The power module 10 can accommodate different combinations of device widths and lengths at various counts by parametrically stretching in the related dimension. Notably, scaling the power module 10 in this way will not reduce or limit the core benefits of the fundamental packaging approach. Examples of scalability are presented in FIGS. 5 and 21, wherein FIG. 5 illustrates a power module 10 that has three transistors Q1 (16) and three transistors Q2 (16), and FIG. 21 illustrates a laterally stretched power module 10 that has six transistors Q1 (16) and six transistors Q2 (16).

Figure 22A:
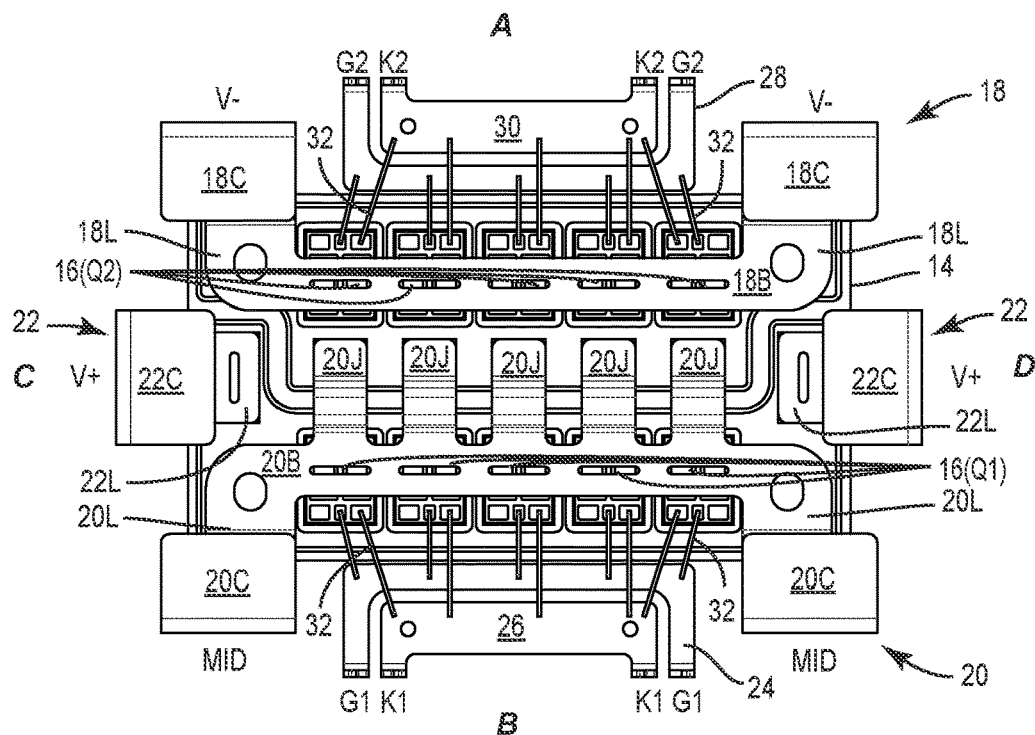
FIGS. 22A and 22B illustrate a fully populated power module and a partially populated power module according to the present disclosure.
Figure 22B:
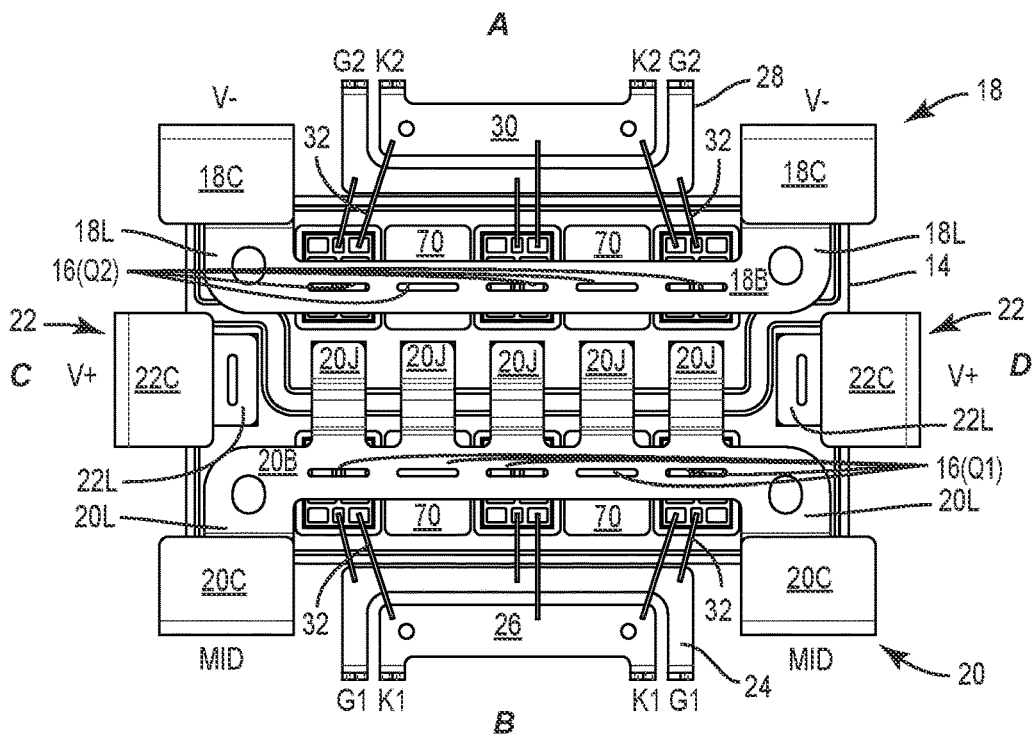

In certain embodiments, a shared set of materials is desired to minimize the number of unique production tools required to manufacture the component. As such, an alternate form of scalability would be to keep the same substrate and lead frame layout and adjust the number of or scale of devices in a set footprint. For example, the devices could be widened in some cases (higher current) and narrowed in others (lower cost). Positions could also be depopulated, to reduce maximum power handling relative to a fully populated power module 10. An example is provided in FIGS. 22A and 22B. The power modules 10 in both FIGS. 22A and 22B are laterally stretched relative to that provided in FIG. 5 to have five positions for transistors Q1 (16) and five positions for transistors Q2 (16). The power module 10 of FIG. 22A is fully populated with five transistors Q1 (16) and five transistors Q2 (16). The power module 10 of FIG. 22B is populated with three transistors Q1 (16) and three transistors Q2 (16). As such, two of the positions (unpopulated positions 70) in FIG. 22B are intentionally left unpopulated and may correspond to a 40% reduction in power handling relative to that of FIG. 22A, assuming the same type of components are employed in both scenarios. In certain embodiments, only one transistor Q1 (16) and one transistor Q2 (16) are employed.

The scalability features allow for within-package optimization. It is also helpful to provide a design that can be enhanced or optimized externally as well. The half-bridge legs of the power module 10 can be arranged to form many topology variations. In most cases, each of the respective V− and V+ terminal assemblies 18, 20 would be connected to the same low inductance bus bars. The Mid-terminal assemblies 22 or AC output would either be (1) connected to parallel packages for higher currents, (2) kept separate for individual bridge legs, or (3) have some combination of both.

Figure 23:
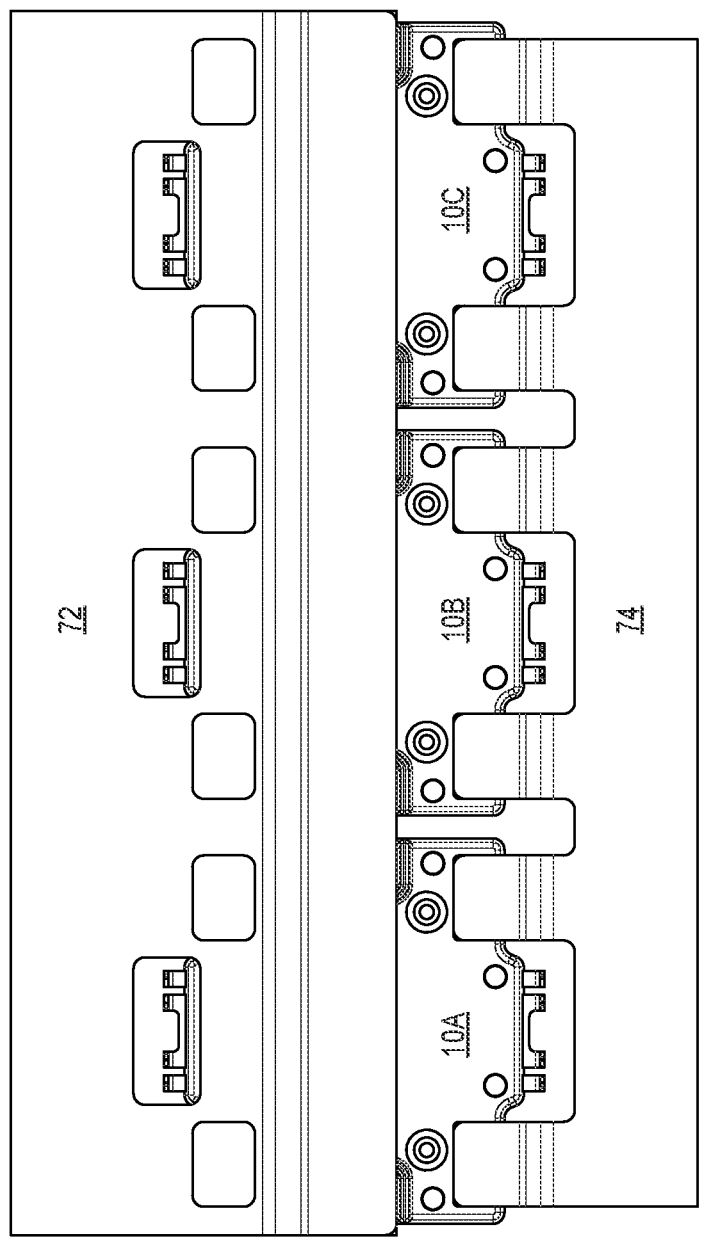
FIG. 23 illustrates an example of paralleled power modules with laminated bussing to form a higher power half-bridge, according to one embodiment of the present disclosure.

FIG. 23 illustrates an example of paralleled configuration with laminated bussing, in which V−, V+ and MID-terminal assemblies of three power modules 10A, 10B and 10C are respectively connected in parallel to an elongated V− bus bar (not shown), an elongated V+ bus bar 72, and an elongated MID bus bar 74. The number of power modules 10X in parallel can be increased or decreased to appropriately or best match the power requirements of the system. This feature allows for the same core product to be used in many systems of all power levels in a cost-effective manner.

Figure 24:
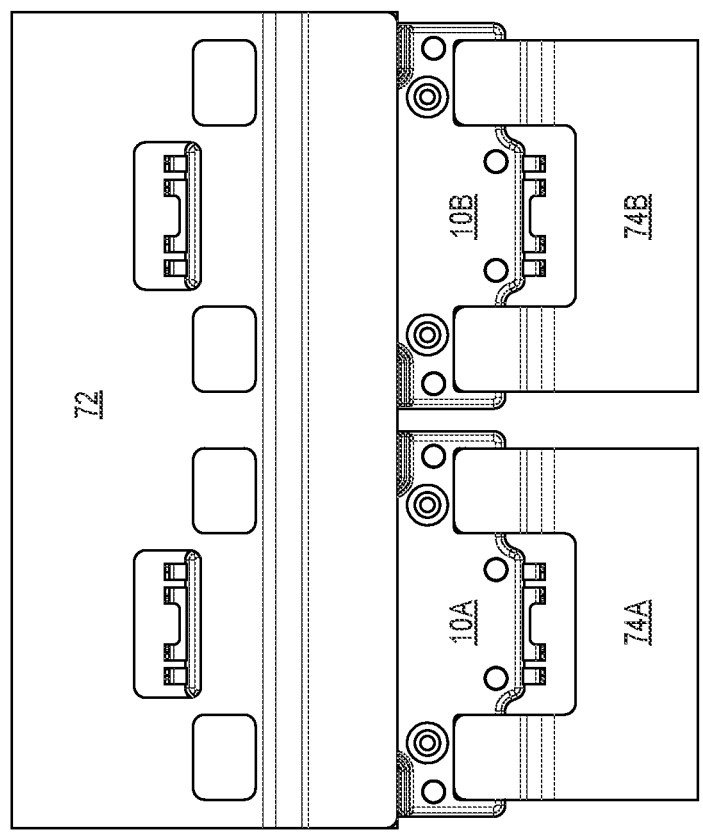
FIG. 24 illustrates power modules arranged as a full-bridge topology according to one embodiment of the present disclosure.

FIG. 24 illustrates an example of two half-H bridge power modules 10A and 10B connected to form a single, full H-bridge circuit using appropriate bussing. As illustrated, the V− terminal assembly (not shown) and V+ terminal assembly 22 of two power modules 10A and 10B are respectively connected in parallel to an elongated V− bus bar (not shown) and an elongated V+ bus bar 72. A first MID-bus bar 74A is provided for the MID-terminal assembly 20 of power module 10A, and a second MID-bus bar 74B is provided for the MID-terminal assembly 20 of power module 10B.

Figure 25:
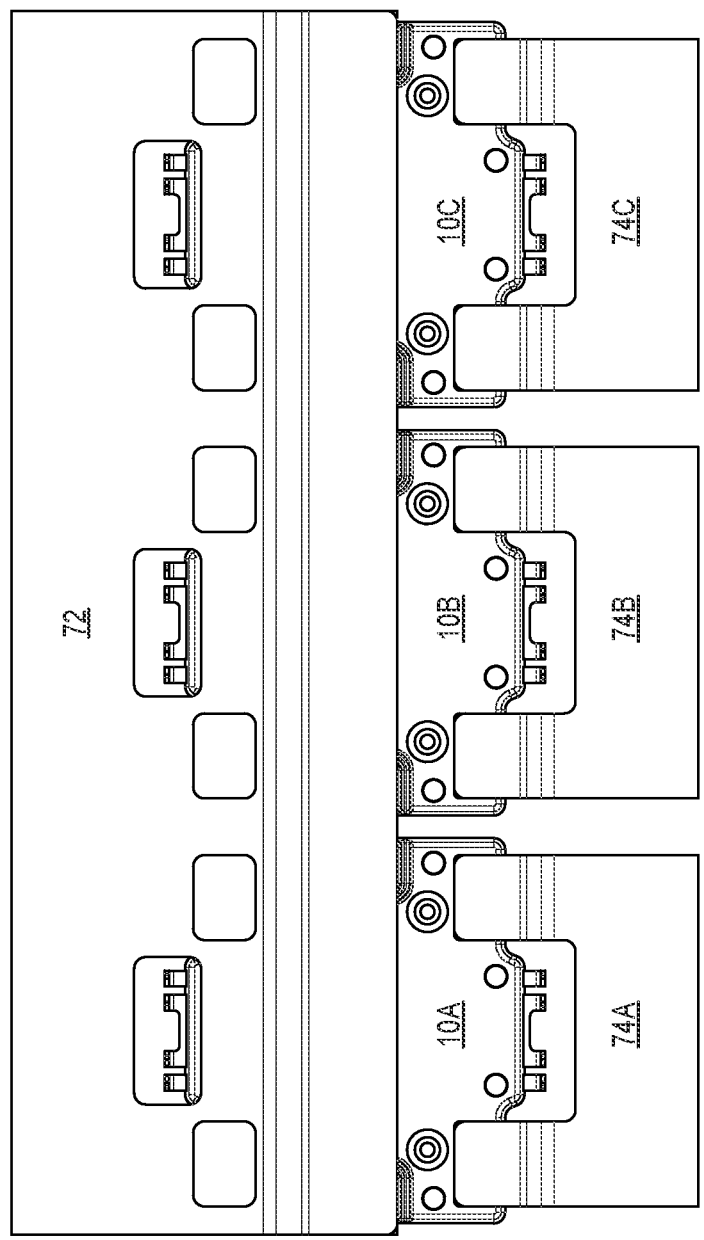
FIG. 25 illustrates power modules arranged as a three-phase topology according to one embodiment of the present disclosure.

FIG. 25 illustrates a three phase topology that has three bridge legs and employs laminated bussing. Three power modules 10A, 10B, and 10C are provided. The V− terminal assembly (not shown) and V+ terminal assembly 22 of power modules 10A, 10B, and 10C are respectively connected in parallel to the elongated V− bus bar (not shown) and the elongated V+ bus bar 72. A first MID-bus bar 74A is provided for the MID-terminal assembly 20 of power module 10A, a second MID-bus bar 74B is provided for the MID-terminal assembly 20 of power module 10B, and a third MID-bus bar 74C is provided for the MID-terminal assembly 20 of power module 10C.

Figure 26:
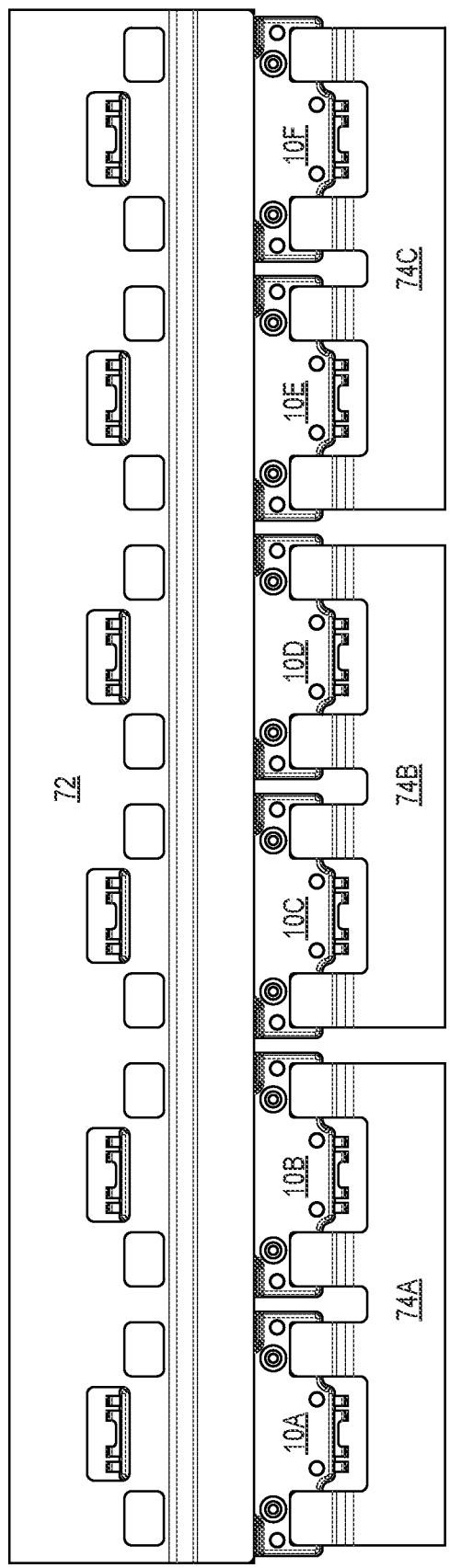
FIG. 26 illustrates power modules arranged as a three-phase topology with two power modules in parallel per leg, according to one embodiment of the present disclosure.

The concepts provided in FIGS. 23 and 24 can be combined. FIG. 26 demonstrates an arrangement that employs laminated bussing to provide three bridge legs with two power modules 10 in parallel per bridge leg. In particular, power modules 10A and 10B are connected in parallel for the first leg, power modules 10C and 10D are connected in parallel for the second leg, and power modules 10E and 10F are connected in parallel for the third leg using the three MID-bus bars 74A, 74B, and 74C.

Figure 27:
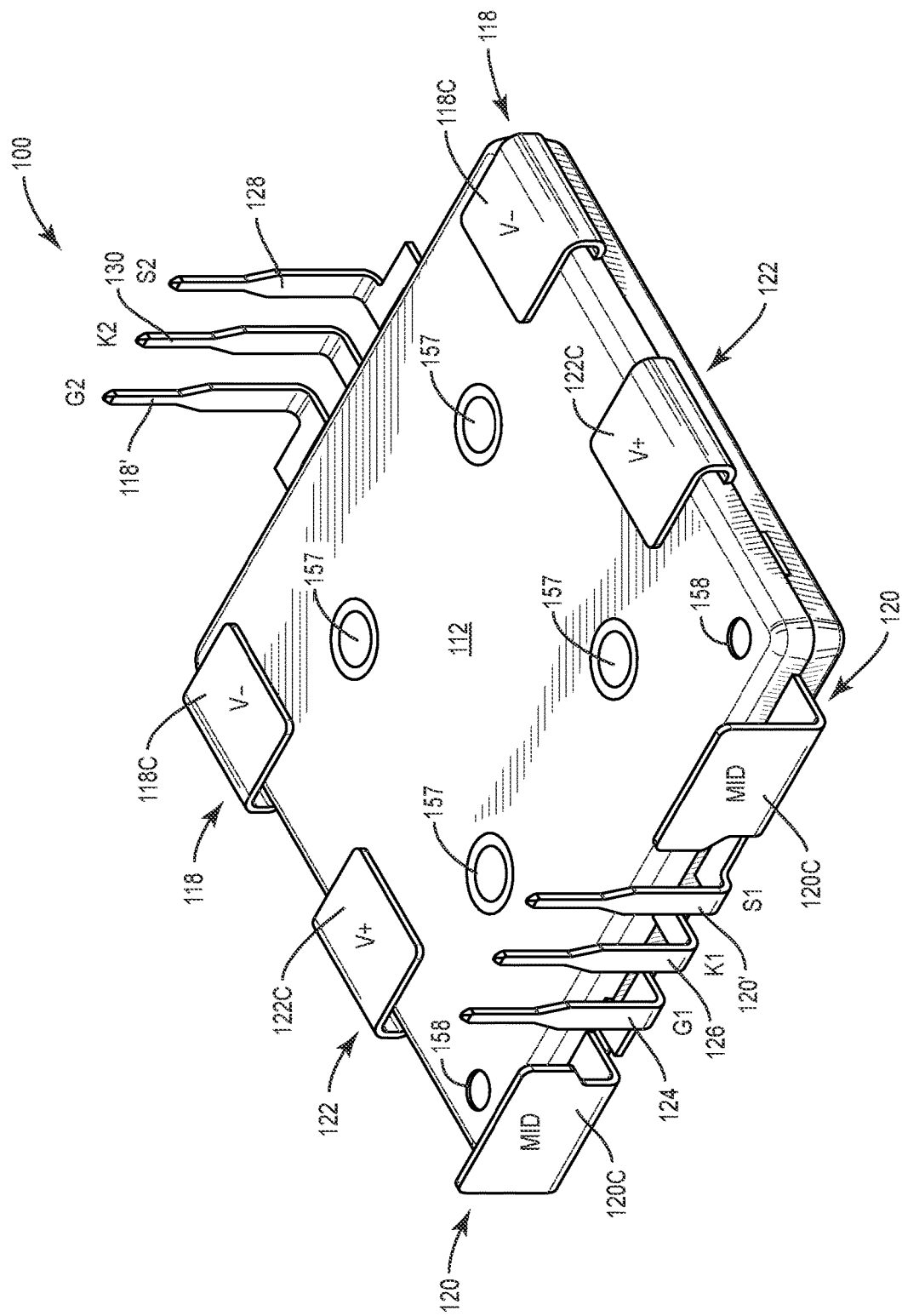
FIG. 27 is a first isometric view of an external structure of a power module according to another embodiment of the present disclosure.
Figure 28:
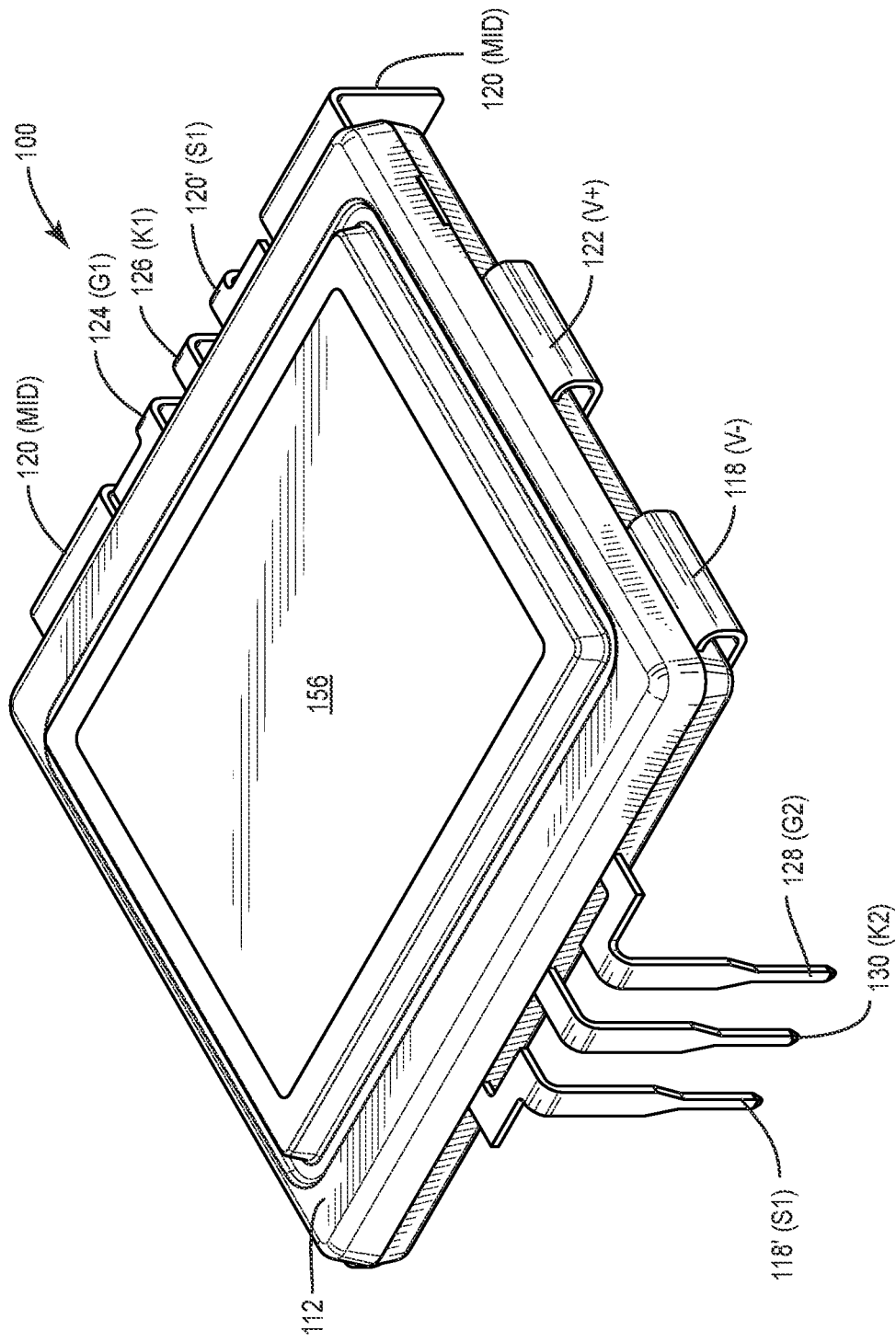
FIG. 28 is a second isometric view of the external structure of a power module according to the embodiment of FIG. 27 of the present disclosure.
Figure 29:
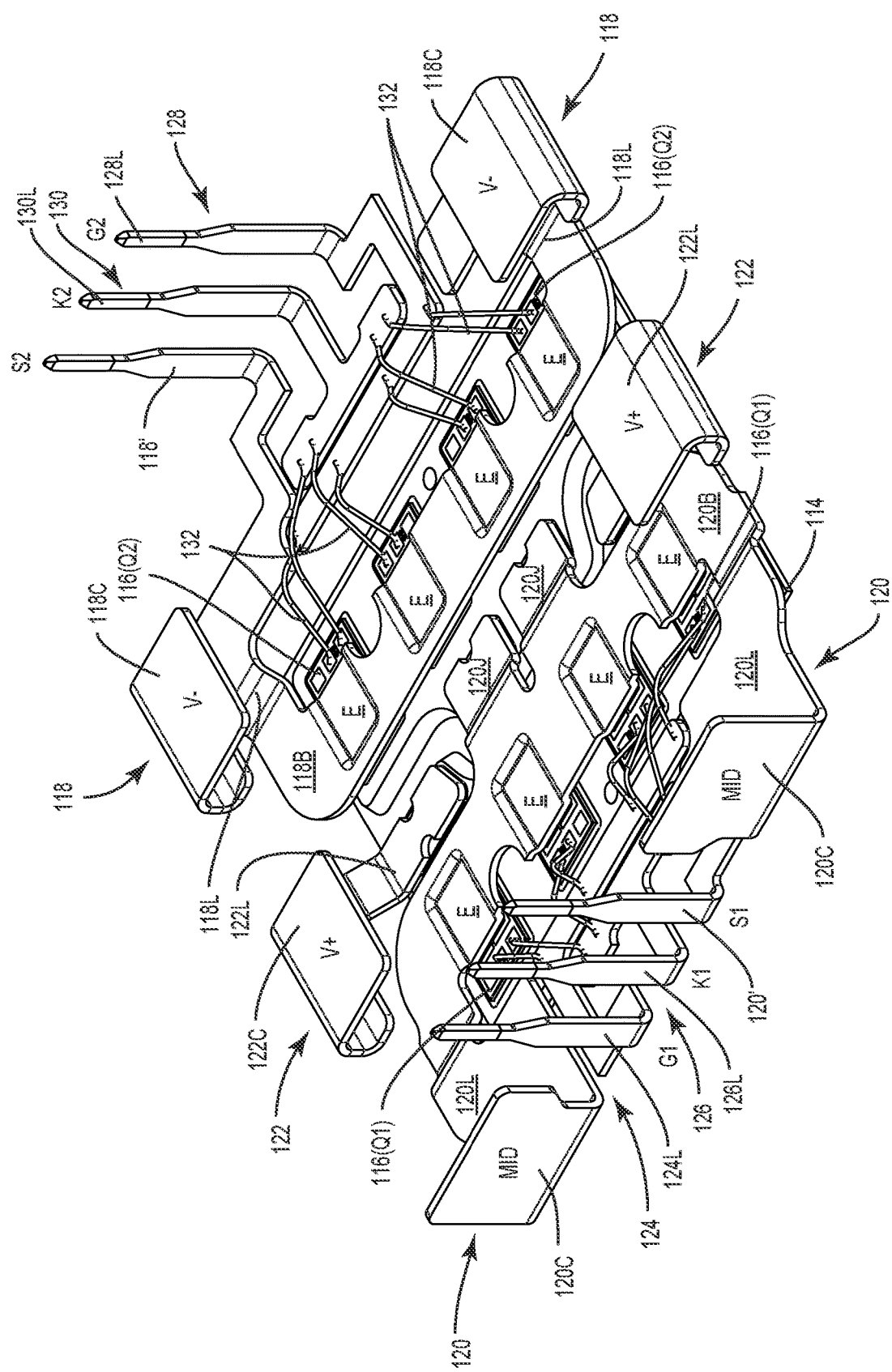
FIG. 29 is an isometric view of the internal structure of a power module according to the embodiment of FIG. 27 of the present disclosure.
Figure 30:
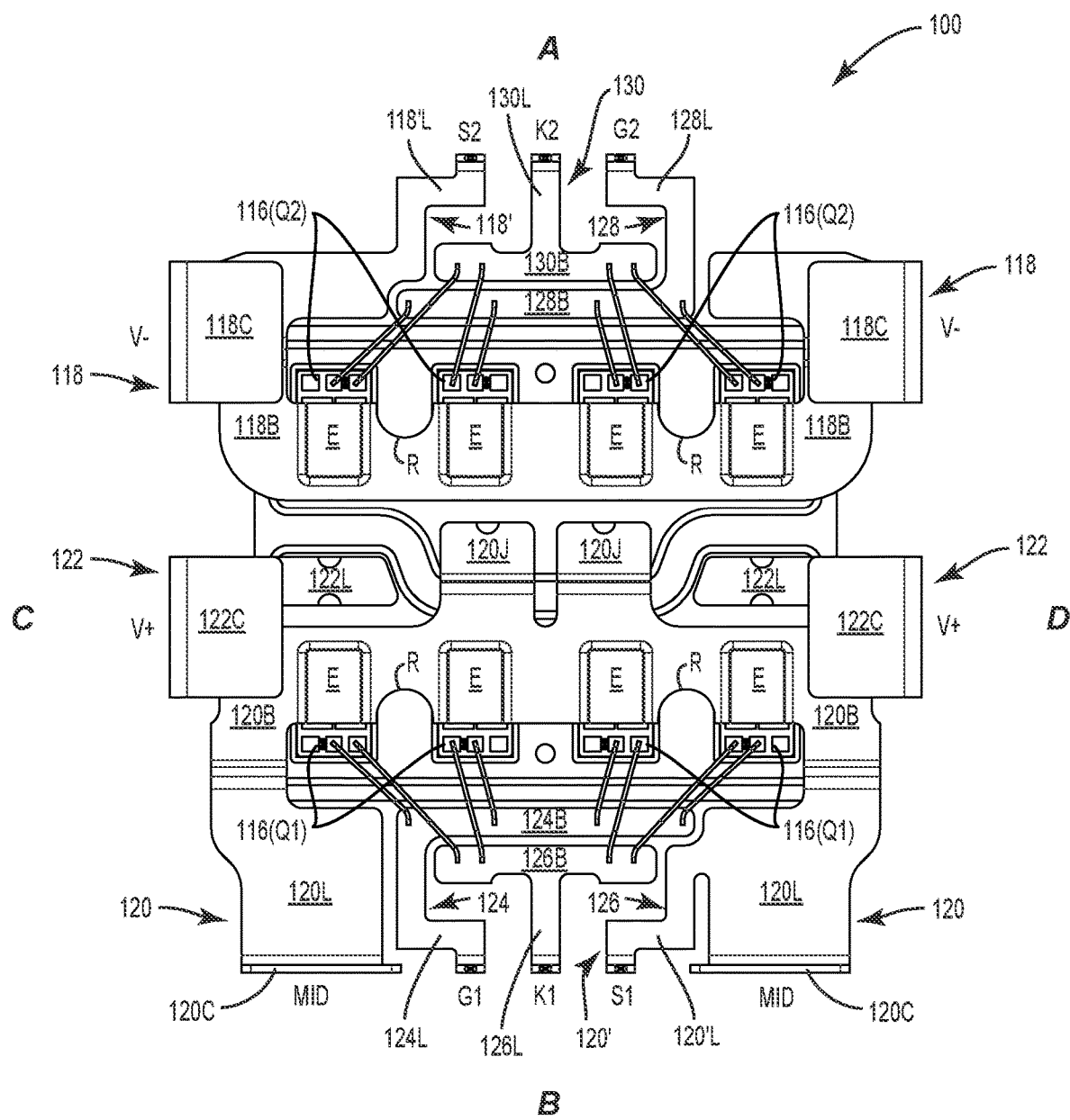
FIG. 30 is a plan view of the internal structure of a power module according to the embodiment of FIG. 27 of the present disclosure.
Figure 31:
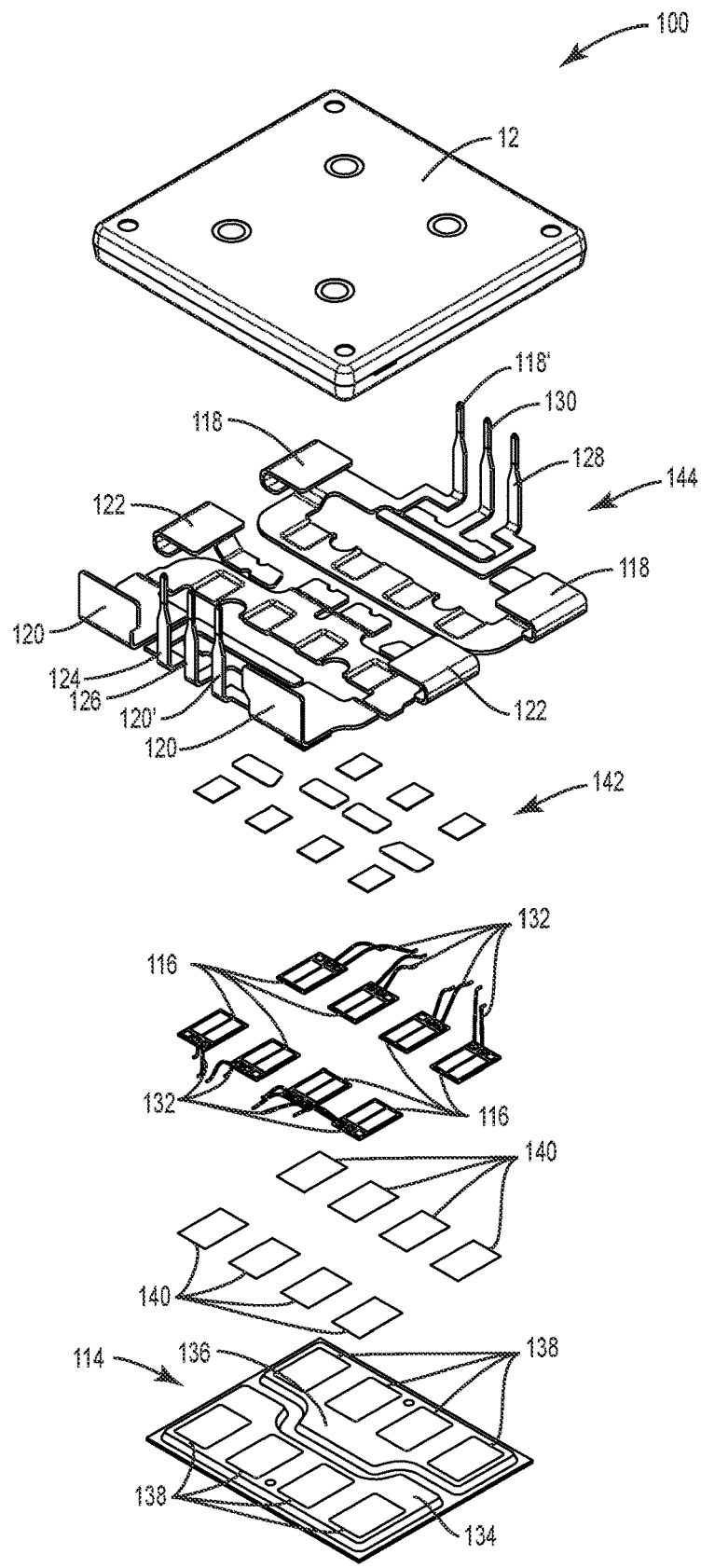
FIG. 31 is an exploded view of a power module according to the embodiment of FIG. 27 of the present disclosure.

Another exemplary power module 100, which incorporates certain of the concepts described above, is illustrated in FIGS. 27-32. FIG. 27 is an isometric view of the top of the power module 100 with a housing 112. FIG. 28 is an isometric view of the bottom of the power module 100. FIGS. 29 and 30 are isometric and plan views of the bottom of the power module 100 without the molded housing 112. FIG. 31 is an exploded view of the power module 100. The following description collectively references each of FIGS. 27-31.

At the core of the power module 100 is a substrate 114 with power devices 116 mounted to a top surface thereof. In this embodiment, the power devices 116 are transistors Q1 (i.e. Q1', Q1'', Q1''') and Q2 (i.e. Q2', Q2'', Q2'''). The V− terminal assembly 118 in this embodiment is still mounted over transistors Q2 (116) near side A of the power module 100. The V− terminal assembly 118 is conductive and is directly attached to the source contacts on the top side of transistors Q2 to form the V− node of FIG. 2. In this embodiment, there are four Q1 transistors and four Q2 transistors illustrated; however, those skilled in the art will recognize that the number, size, and capabilities of transistors Q1 and Q2 will and can vary from one application to another based on the performance and power requirements of the power module 100.

Two opposing V+ terminal assemblies 122 are mounted to a first trace/pad 134 (FIG. 31) on the top surface of the substrate 114 near sides C and D. The transistors Q1 are mounted on the substrate 114 such that the drains of transistors Q1 are directly attached to the first trace/pad 134. As such, the drains of transistors Q1 and the V+ terminal assemblies 122 form the V+ node of FIG. 2.

The MID-terminal assembly 120 is mounted over transistors Q1 (116) near side B of the power module 100. The MID-terminal assembly 120 is conductive and is directly attached to the source contacts on the top side of transistors Q1. The MID-terminal assembly 120 includes integral jumpers 120J that extend to and directly attach to a second trace/pad 136, on which the drain contacts of transistors Q2 are directly attached. As such, the drain contacts of transistor Q2, the source contacts of transistor Q1, and the MID-terminal assembly 20 form the MID node of FIG. 2.

The gate and source-kelvin contacts (G1, K1) for transistors Q1 are electrically coupled to pin assemblies 124, 126, respectively, using bond wires 132. Similarly, the gate and source-kelvin contacts (G2, K2) for transistors Q2 are electrically coupled to pin assemblies 128, 130, respectively, using bond wires 132. The pin assemblies 124, 126, 128, 130 are directly mounted to the top surface of the substrate 114, such that they are electrically isolated from each other as well as from the high-power V−, V+, and MID-nodes. Details pertaining to the design and shape of the pin assemblies 124, 126, 128, 130, V− terminal assembly 118, the opposing MID-terminal assembly 120, and the V+ terminal assemblies 122 are provided further below. Notably, such designs may include additional pins or pin assemblies that provide input or output nodes for the electronics provided by the power module 100. These additional pins and pin assemblies may be used for current sensing, temperature sensing, biasing, and the like.

Reference is now made to the exploded view of the power module 100 in FIG. 31. Starting from the bottom of the figure, the power devices 116, which include transistors Q1, Q2, are attached to the first and second traces 134, 136 at mounting locations 138 using device attach material 140. The device attach material 140 may be a solder, adhesive, sintered metal, or the like that provides for mechanical structure, high current interconnection, and high thermal conductivity.

The pin assemblies 118', 120', 124, 126, 128, 130, V− terminal assembly 118, the MID-terminal assembly 120, and the V+ terminal assembly 122 are formed from a single lead frame 144. In this embodiment, pin assembly 118' is an extension from the V− terminal assembly 118, and pin assembly 120' is an extension from the MID-terminal assembly 120. More detail related to the shape and use of the pin assemblies 118', 120', 124, 126, 128, and 130 is provided further below.

The portions of the top of the power devices 116 and the substrate 114 that are connected to corresponding bottom portions of the V− terminal assembly 118, the MID-terminal assembly 120, and the V+ terminal assemblies 122 are connected using lead frame attach material 142. As noted above, the lead frame attach material 142 may be solder, adhesive, sintered metal, a laser weld, an ultrasonic weld, and the like that provides mechanical structure, high current interconnection, and high thermal conductivity. The lead frame 144 is typically a metal contact strip for high current external connection and internal interconnection. Any contacts are joined together on a single sheet, often with multiple products per sheet, and processed as an array before being formed and singulated.

The bond wires 132 are typically used to connect the control contacts of the power devices 116 to the various pin assemblies 124, 126, 128, 130. The bond wires 132 may be ultrasonically or thermosonically bonded large diameter wire capable of supporting relatively high current electrical interconnection. Alternatively, the pin assemblies 126, 126, 128, 130 may be bonded directly to the power devices 116, to traces on the substrate 118, or the like. Since pin assemblies 118' and 120' are integral with and essentially extensions of the respective V− terminal assembly 118 and the MID-terminal assembly 120, no bond wires are necessary for these connections.

The housing 112 may be formed using a transfer or an injection molding process to provide mechanical structure and high voltage isolation. The housing 112 encapsulates the internal parts of the power module 100. The mold compound used for the housing 112 may be a transfer or compression molded epoxy molding compound (EMC) capable of providing mechanical structure, high voltage isolation, coefficient of thermal expansion (CTE) matching, and low humidity absorption.

Turning now to FIGS. 27-32 in general and FIGS. 29 and 30 in particular, the V− terminal assembly 118 includes an elongated first bar 118B, which resides between two terminal legs 118L. A notable difference between the power module 10 described above and the power module 100 is that the V− terminal assembly 118 is reconfigured such that the V− terminal contacts 118C are located on the same sides as the V+ terminal contacts 122C of the V+ terminal assemblies 122. This configuration may provide a slightly more optimized bus bar (bus bar 118B) with more overlap with the power devices 116(Q2) and less in-circuit inductance than with the power module 10 described above. In the power module 10, the V− terminal contacts 18C were both located on the one side opposite that of the MID-terminal contacts 20C of the MID terminal assembly 20.

In particular, the respective terminal legs 118L are shaped such that they extend outward from the first bar 118B toward opposing sides C and D of the power module 100, pass through one side of the housing 112, turn upward toward the top of the housing 112, and then turn inward over a portion of the top of the housing 112 to provide the respective and opposing V− terminal contacts 118C. A distal portion of each of the terminal legs 118L is bent back over an intermediate portion thereof. The bottom portions of the first bar 118B of the V− terminal assembly 118 are directly attached to the source contacts of transistors Q2 (power devices 116). The V− terminal contacts 118C at the exposed distal ends of terminal legs 118L provide terminal contacts for the V− terminal assembly 118.

The MID-terminal assembly 120 includes an elongated second bar 120B, which resides between two terminal legs 120L. Together, the second bar 120B and the two terminal legs 120L form a U-shape in the illustrated embodiment. Other shapes are envisioned, such as T, V, and C-shapes. Each of the terminal legs 120L is shaped such that it extends outward from an end of the second bar 120B toward side B of the power module, passes through the side of the housing 112, and turns upward toward the top of the housing 112 at an angle between 75 and 105 degrees. Other embodiments may include angles between 70 and 110 degrees, 80 and 100 degrees, 85 and 95 degrees, and 87 and 93 degrees. The exposed distal ends of terminal legs 120L provide MID-terminal contacts 120C for the MID-terminal assembly 120.

A second notable difference between power module 10 described above and the power module 100 is that the MID-terminal contacts 120C are not folded back over the bottom surface of the housing 112 as is done on the power module 10 (e.g. FIG. 3). Like the pin assemblies 120', 124, 126, the MID− terminal contacts 120C are substantially perpendicular relative to the plane in which the housing 112 resides. The terminal legs 120L effectively form an L-shape, wherein the vertical portions of the terminal legs 120L form the MID− terminal contacts 120C. The terminal legs 120L extend from the second bar 120B. Bottom portions of the second bar 120B of the MID-terminal assembly 120 are directly attached to source contacts of the transistors Q1 (power devices 116).

The MID-terminal assembly 120 in this embodiment also includes multiple (2) integrally formed jumpers 120J, which extend from the second bar 120B toward the first bar 118B of the V− terminal assembly 118. The distal ends of the jumpers 20J are directly attached to the second trace 136 on the top surface of the substrate 114, as described above. The jumpers 120J may be replaced with a single bar. Further, the number of jumpers 120J may vary from one embodiment to another. For example, three jumpers 120J were provided in power module 10, described above. In certain embodiments, there will be one jumper 120J per power device 116 that is coupled to the MID-terminal assembly 120.

In this embodiment, the terminal legs and contacts 120L, 120C of the MID-terminal assembly 120 allow for welding to a thicker external bus bar using conventional and more readily available side welding operations. Since the MID-terminal assembly 120 carries the AC output of the power module 100, thicker bus bars may be preferred or required for higher current applications.

For each of the opposing V+ terminal assemblies 122, one end is directly attached to the first trace 134 on the top of the substrate 114. From the substrate 114, each opposing terminal 122 extends outward toward sides C and D of the power module 100, passes through a respective side of the housing 112, turns upward toward the top of the housing 112, and then turns inward over a portion of the top of the housing 112. As such, a distal portion of each of the V+ terminal assemblies 122 is bent back over an intermediate portion thereof. The exposed distal ends of opposing terminals 122 provide terminal contacts 122C for the V+ terminal assemblies 122.

With particular reference to FIGS. 29 and 30, groups of nested signal pin assemblies 118', 120', 124, 126 and 128, 130 are provided on opposing sides the housing 112. Pin assemblies 126 and 130 are T-shaped and each include a pin bar 126B, 130B and pin legs 126L, 130L, which extend from central portions of the respective pin bars 126, 130. The pin legs 126L, 130L extend laterally outward from the respective pin bars 130B prior to turning approximately 90 degrees toward the bottom side of the power module 100.

Pin assemblies 124 and 128 are generally L-shaped and each include a pin bar 124B, 128B and pin legs 124L, 128L, which extend from distal portions of the respective pin bars 126, 130. The pin legs 126L, 130L extend laterally outward from the respective pin bars 126B, 130B, turn toward the pin legs 126L, 130L of the pin assembles 126, 130, turn approximately 90 degrees outward, and then turn approximately 90 degrees toward the bottom side of the power module 100. Other embodiments may include angles between 75 and 105 degrees, 70 and 110 degrees, 80 and 100 degrees, 85 and 95 degrees, and 87 and 93 degrees.

Pin assemblies 118' and 120', which are essentially additional pin legs, are integral extensions of terminal legs 118L and 120L of the respective the V− terminal assembly 118 and the MID-terminal assembly 120. Pin assembly 118' extends laterally from the bus bar 118B and/or the terminal leg 118L prior to turning approximately 90 degrees toward the bottom side of the power module 100 and ultimately running alongside of pin leg 130L of pin assembly 130. Pin assembly 120' extends laterally from the bus bar 120B and/or the terminal leg 120L prior to turning between 75 and 105 degrees toward the bottom side of the power module 100 and ultimately running alongside of pin leg 126L of pin assembly 126. An end portion of pin leg 130L of pin assembly 130 resides between end portions of pin assembly 118' and pin leg 128L of pin assembly 128. Other embodiments may include angles between 70 and 110 degrees, 80 and 100 degrees, 85 and 95 degrees, and 87 and 93 degrees.

By having pin assembly 118' extend directly from the V− terminal assembly 118, pin assembly 118' can be used to sense currents and overcurrent events by analyzing the voltage difference between the pin assembly 118' and pin assembly 130L, which correspond to the V− and the low side source Kelvin signal voltages (K2). Similarly, by having pin assembly 120' extend directly from the MID-terminal assembly 120, pin assembly 120' can be used to sense current and overcurrent events by analyzing the voltage difference between the pin assembly 120' and pin assembly 126, which correspond to the V− and the high side source Kelvin signal voltages (K1). Schematically, pin assembly 118' and pin assembly 120' correspond to the S2 and S1 signals, respectively, on FIG. 1B. FIG. 1A and FIG. 1B are essentially identical wherein the S1 and S2 terminals correspond to the pin assemblies 120' and 118' for the current embodiment. The bond wires 132 electrically connect the power devices 116 to the pin bars 124B, 126B, 128B, 130B of the pin assemblies 124, 126, 128, 130.

Figure 32:
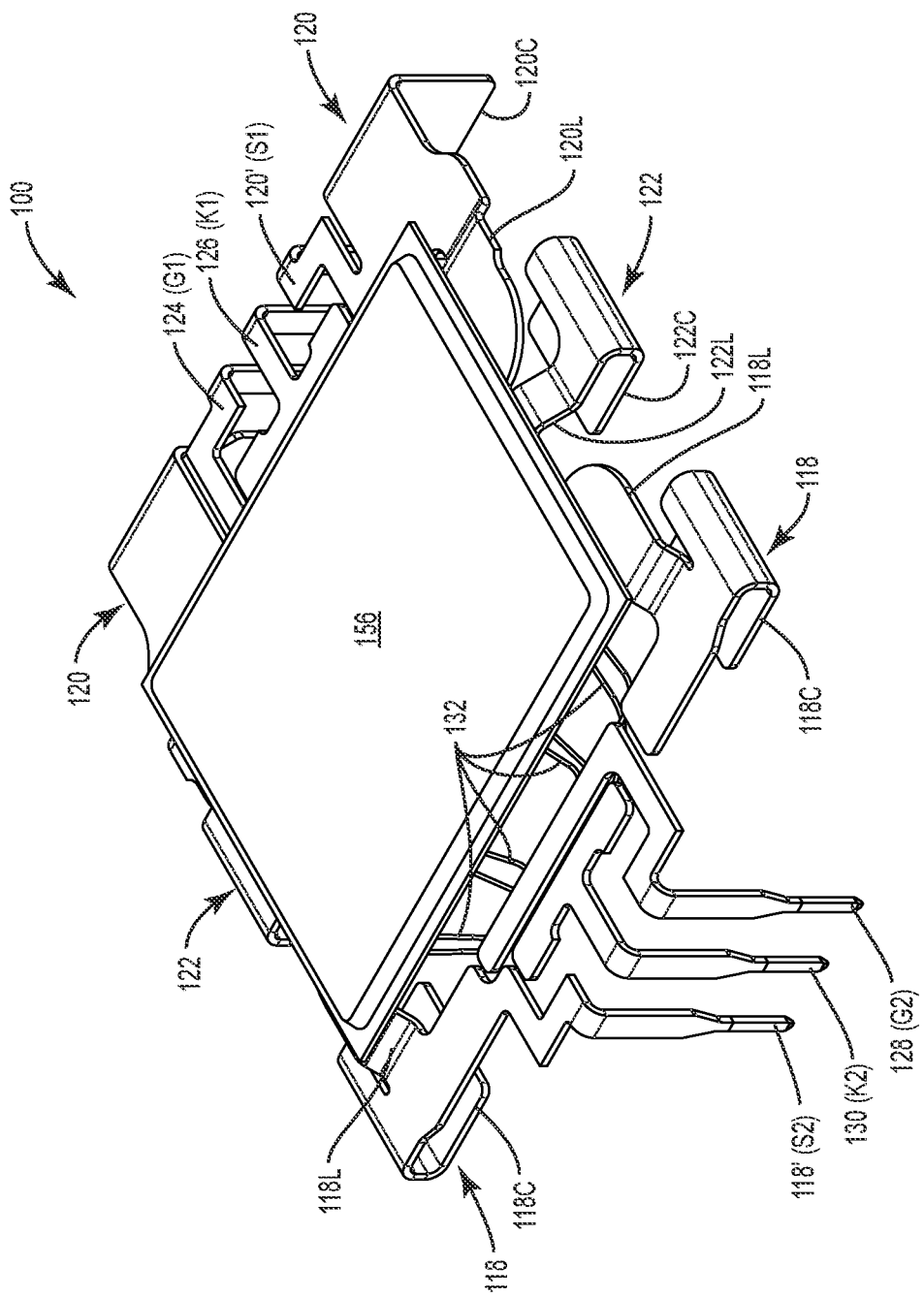
FIG. 32 is a third isometric view of the external structure of a power module according to the embodiment of FIG. 27 of the present disclosure, wherein the housing is removed.

With particular reference to FIGS. 27, 28, and 32, the internal workings of the power module 100 are encased by a protective plastic or epoxy housing 112 through transfer molding, compression molding, injection molding, or similar process. Several notable features of the housing 112 are highlighted and discussed below. As shown in FIGS. 28 and 32, the backside metal of the power substrate 114 is exposed on the underside of the power module 100 to provide a thermal pad 156. The thermal pad 156 is used as a thermal contact surface to remove heat from the power module 100. The thermal pad 156 may be sintered, soldered, epoxied, or similarly attached to a heat sink or cold plate (not shown) to further assist the removal of waste heat from the power module 100.

Features in the housing 112 may vary based on the manufacturing method. The embodiment illustrated is representative of the structural characteristics of transfer molding. As illustrated in FIG. 27, there are four hold-down pin vestiges 157 shown, but there may be more or fewer depending on the overall size of the power module 100. Hold-down pins (not shown) press down directly on the power substrate during the transfer molding process to limit the amount of plastic bleed or flash on the exposed portion of the thermal pad 156. This ensures that the thermal surface is free of debris and capable of acting to remove heat efficiently. There are also ejector marks 158 around the perimeter of the housing 112. The ejector marks 158 are small recesses created by ejector pins (not shown) that are used to remove the power module 100 from the mold (not shown) while it is still hot. Specific locations and associated geometries of these features will vary depending on specific product size and implementation.

Clearance and creepage may be important aspects for a high voltage product. Between conductors at different voltage potentials, clearance is the shortest direct path in air between the conductors. Creepage is the shortest direct path along a surface between the conductors. Meeting safety standards is a challenge and is often at odds with manufacturing method (tooling, epoxy flow, etc.) and product size (footprint and power density). For small transfer molded packages, particularly low profile and high voltage SiC based products, reaching a suitable balance is difficult.

In certain embodiments, the clearance distances are adequate and within standards. To increase the creepage distance, and correspondingly increase maximum allowable voltage, creepage extenders 60 may be used, such as those illustrated in FIGS. 14A and 14B for the earlier described power module 10. Creepage extenders 60 are grooves, ripples, or other surface enhancements that extend the surface distance between conductors at different potentials.

As described above, there are two categories of electrical loops in a power module: the power loop and the signal loop. The power loop is a high voltage, high current path through the transistors Q1, Q2 for delivering power to a load via the drain (or collector) and source (or emitter) of the transistors Q1, Q2, wherein the load is typically connected to the MID-terminal assembly 120. The signal loop is a low voltage, low current path through the gates G1, G2 (or bases) and the sources S (or emitters) of transistors Q1, Q2. The gate-source (or base-emitter) signal path actuates the transistors Q1, Q2 to effectively turn-on or turn-off the transistors Q1, Q2. As detailed below, the signal loop may also entail the source-Kelvin connections K1, K2 of the transistors Q1, Q2.

The power loop effectively runs between the V+ terminal assembly 122 and the V− terminal assembly 118. The V+ terminal assembly 122 and the V− terminal assembly 118 are typically connected across a DC supply, such as a battery in parallel with a large capacitance.

The opposing V+ terminal assemblies 122 are directly attached to opposing ends of the first trace 134 on the substrate 114. Power flows into the power module 100 through the contacts 122C and legs 122L of the two V+ terminal assemblies 122. As such, power flows onto the opposing ends of the first trace 134 on the substrate 114 via the terminal assemblies 122 and over to the drain contacts of transistors Q1. The drain contacts of transistors Q1 are on the bottoms of the transistors Q1 and are also directly attached to the second trace 136. The transistors Q1 are attached to the first trace 134 between the points where the two V+ terminal assemblies 22 are attached to the first trace 134, and the transistors Q1 are equally spaced apart from one another and the points of attachment for the two V+ terminal assemblies 122.

Power then flows up through transistors Q1 from the drains of transistors Q1 to the sources of transistors Q1. The sources of transistors Q1 are attached to the bottom side of the second bar 120B of the mid terminal assembly 20 at the embossments E. The mid-terminal jumpers 120J of the mid terminal assembly 120 connect the second bar 120B of the mid terminal assembly 120 to the second trace 136 on the substrate 114. The drains of the transistors Q2 are directly attached to the second trace 136 and are equally spaced apart from one another. From the drains of the transistors Q2, power flows up through transistors Q2 to the sources of transistors Q2. The sources of transistors Q2 are directly connected to the bottom side of the first bar 118B of the V− terminal assembly 118 at the embossments E. As such, power flows along the first bar 118B to the contacts 118C of the V− terminal assembly 118 via the opposing legs 118L.

With particular reference to FIGS. 29 and 30, multiple embossments E may be provided in each of the first bar 118B of the V− terminal assembly and the second bar 120B of the MID-terminal assembly. The embossments E are provided over each of the power devices 116 and function to extend portions of the first bar 118B and the second bar 120B downward toward the tops of the power devices. As such, the remaining non-embossed portions of the first bar 118B and the second bar 120B allow more space between the top of the substrate 114 and the bottom of the first bar 118B and the second bar 120B. The extra space aids in the fabrication of the housing 112 by reducing the amount of pressure necessary to cause the mold compound used to form the housing 112 to flow into and fill this area.

The first bar 118B and the second bar 120B also have recessed areas that correspond to the hold down locations on the substrate 114. As noted in the prior embodiment, hold down pins (not shown) are used in the transfer molding process wherein the hold down pins generally press directly on the substrate 114 to hold certain or all of the components of the power module 100 in place while the housing 112 is being formed.

By using symmetrical V+ terminal assemblies 122 and a symmetrical V− terminal assembly 118, the current sharing between devices is balanced and smaller external contacts can be used, which helps with lead frame panelization, and inductance is greatly reduced by shortening the overall current paths of the power loop. As described further below, the contacts 118C, 120C, and 122C of the V− terminal assembly 118, the MID-terminal assembly 120, and the V+ terminal assemblies 122 may be electrically connected external interconnections using laser welds, solder, ultrasonic welds, mechanical bonds (clamps, springs, etc.), conductive adhesives, or any other conductive bond.

Current must flow through a closed circuit. Accordingly, stray inductance of the package itself is not the only contributing factor to the full loop inductance. Inductance of the full loop, including any capacitance of the power supply and capacitors provided across the power supply, external bussing and wiring, and the power module 100 itself should be considered. As such, not only should the internal layout of the power module 100 be low-inductance, but the locations of the V− terminal assembly 118, the MID-terminal assembly 120, and the V+ terminal assemblies 122 should also allow for low-inductance laminated bussing or a similar interconnection method to connect the power module 100 to the DC supply.

In this embodiment, the signal loops, or the gate and source connections, for each transistor (Q1, Q2) position also benefit from a low impedance to minimize voltage stresses on the gates of the transistors Q1, Q2 during switching. Further, the power loops and signal loops are independent of each other to enable low switching loss with fast, well controlled dynamics.

The internal signal loops for this embodiment are similar to those illustrated in FIG. 11. The signal loop for transistor Q1 flows onto and through the G1 pin assembly 124 and then through a bond wire 132 to the gate contact of transistor Q1, where the signal is presented to transistor Q1. The signal loop flows from transistor Q1 via the source contact of transistor Q1. From the source contact, the signal loop flows through another bond wire 132 directly to and through the K1 pin assembly 126.

Similarly, the signal loop for transistor Q2 flows onto and through the G2 pin assembly 128 and then through a bond wire 132 to the gate contact of transistor Q2, where the signal is presented to transistor Q2. The signal loop flows from transistor Q2 via the source contact of transistor Q2. From the source contact, the signal loop flows through another bond wire 132 directly to and through the K2 pin assembly 130. As shown, this is a true source-Kelvin implementation in which the power and signal loops are completely independent.

To minimize the length of the power loop, some or all of the edge power contacts, such as those for the V− and MID-terminal assemblies 118, 120 may be inset from the edge of the housing 112, in comparison to the signal contacts, such as the pin assemblies 124, 126, 128, 130. The signal contacts provided by pin assemblies 124, 126, 128, 130 need more room to better accommodate the bond wires 132 from the devices; therefore, their housing section extends out from the edge of the overall housing 112. This contoured feature allows for inductance optimization for each of the independent power and signal loops.

As noted above, the terminal and pin assemblies 118-130 are formed from a lead frame 144 and combine functionality to provide high current internal interconnections, bond wire locations, and external terminal contact surfaces. Portions or parts of the lead frame 144 attach both to the topside source pads of transistors Q1, Q2 as well as to the substrate 114. The lead frame 144 may attach to the various components in several ways, including soldering, sintering, conductive epoxy, laser welding, ultrasonic welding, etc. Surface enhancement features, such as holes, slots, feathered edges, etc. are referred as 'solder or epoxy catches' and may be used to enhance the strength of the bond, as shown in FIG. 18.

The strip on the lead frame 144 that directly attaches to the topside source pads may have a few distinguishing features. It may have a variety of solder catch implementations, depending on the specific layout of the device being packaged. It may also include ripples (not pictured) between devices for thermal expansion stress relief and enhanced mold flow. Various bends in the lead frame 144 may be used as further means of stress relief.

Figure 33B:
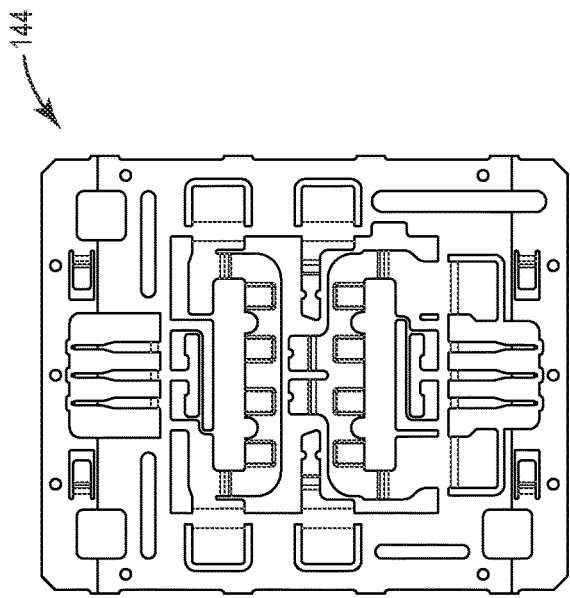
FIGS. 33A and 33B are isometric and plan views of a lead frame section according to the present disclosure.
Figure 33A:
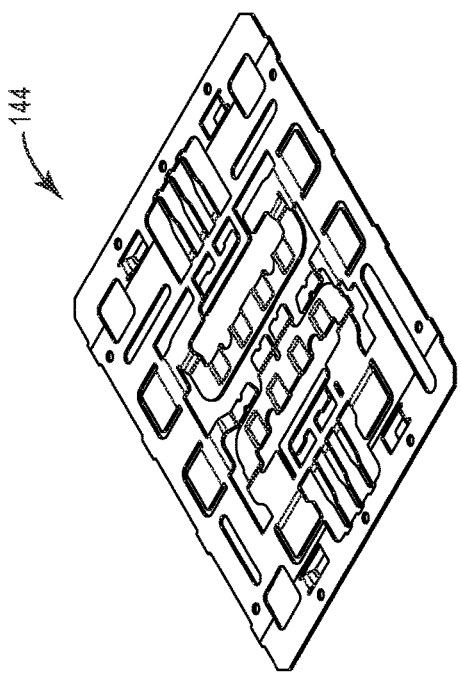

The lead frame 144 may be fabricated from sheet metal in either an etching or stamping process. One example of this is presented in FIGS. 33A and 33B. The contacts and inner features are joined to the external frame by narrow tabs. To streamline processing in panels or magazines, much of the sheet metal begins flat. Only the inner bends are formed. Due to the multiple heated processes that the assembly requires during manufacturing production, thermal expansion slots are added to break up large copper areas. These limit the expansion and warpage of the assembly.

After the lead frame 144 has been attached to the power devices 116 and substrate 114, wire bonded, and then molded, it is trimmed away from the outer frame at the locations of the joining tabs. The bends of the external contacts are folded and formed, often with procedural steps and selective trimming.

Figure 34:
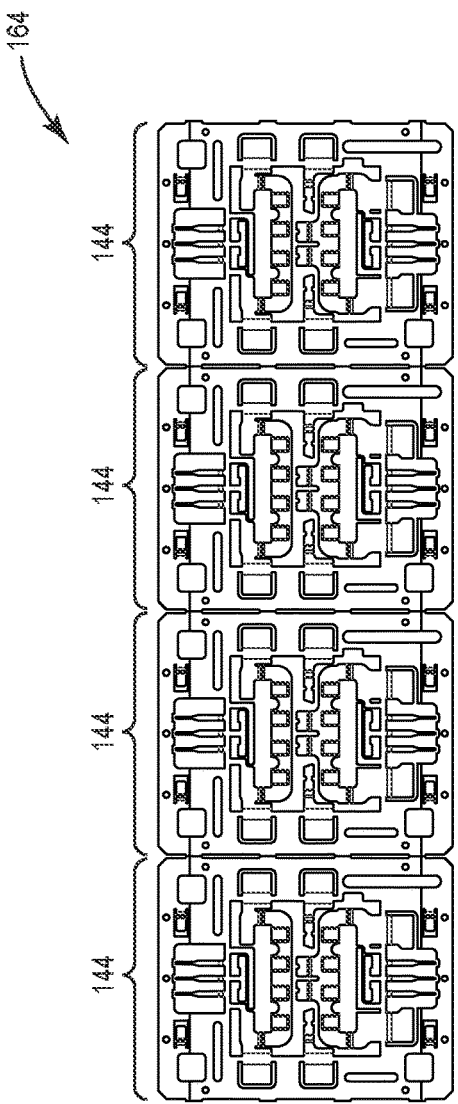
FIG. 34 illustrates one embodiment of a lead frame array according to the present disclosure.

For automated mass production, these lead frames 144 are often patterned into an array. These arrays are handled in multiple machines, often loaded from magazines or racks. Holes on the top and bottom edges are used for fixturing, positioning, keying, and handling. An example lead frame array 164 with four lead frames 144 is shown in FIG. 34. Specific features of the lead frames 144 and the lead frame array 164 will vary depending on product configuration, product size variations, and manufacturing equipment types.

Figure 35:
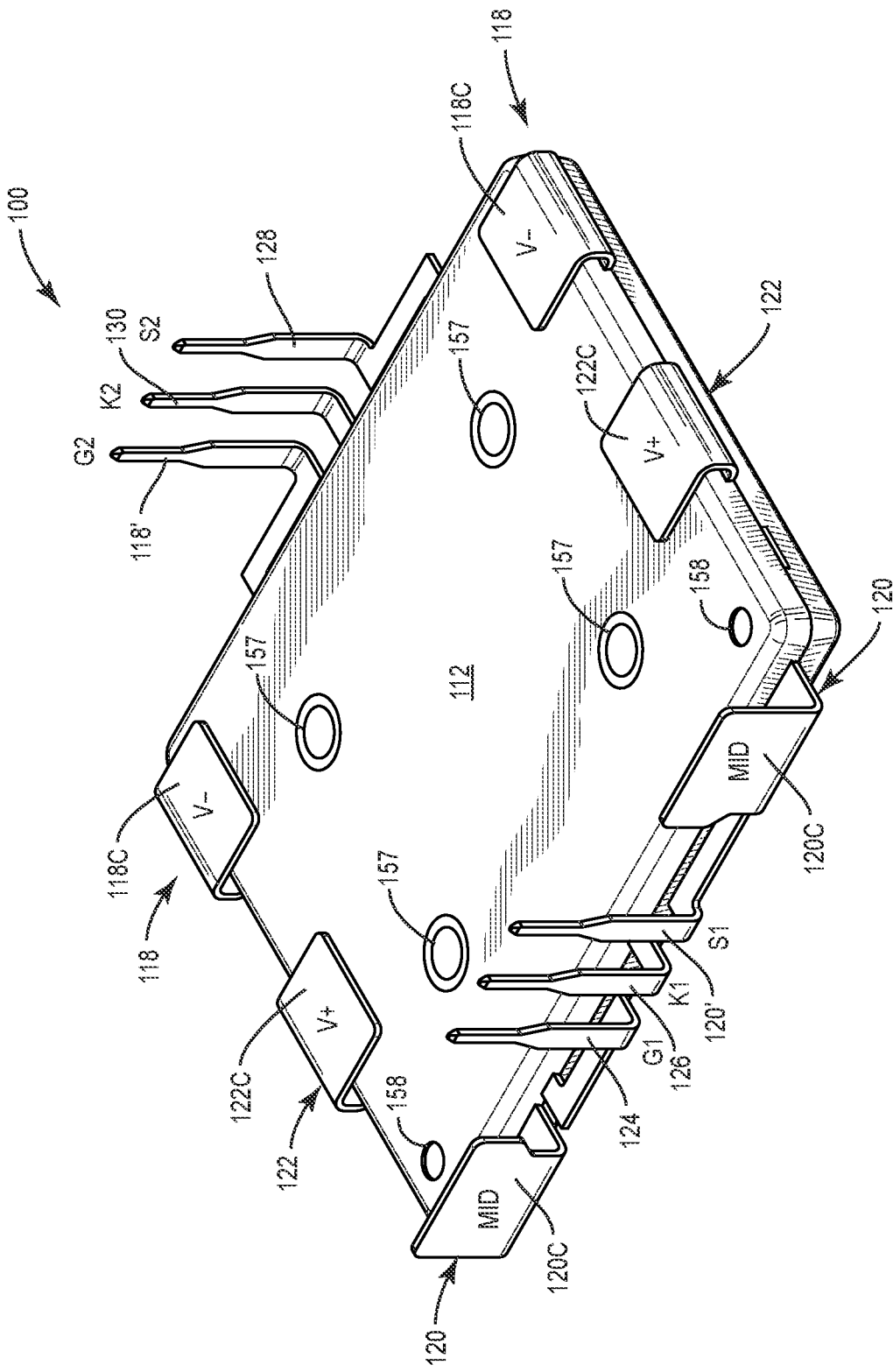
FIGS. 35 and 36 are first and second isometric views illustrating a wider variation for a power module according to the present disclosure, wherein the wider implementation supports additional power devices for a power module with higher power handling capabilities.
Figure 36:
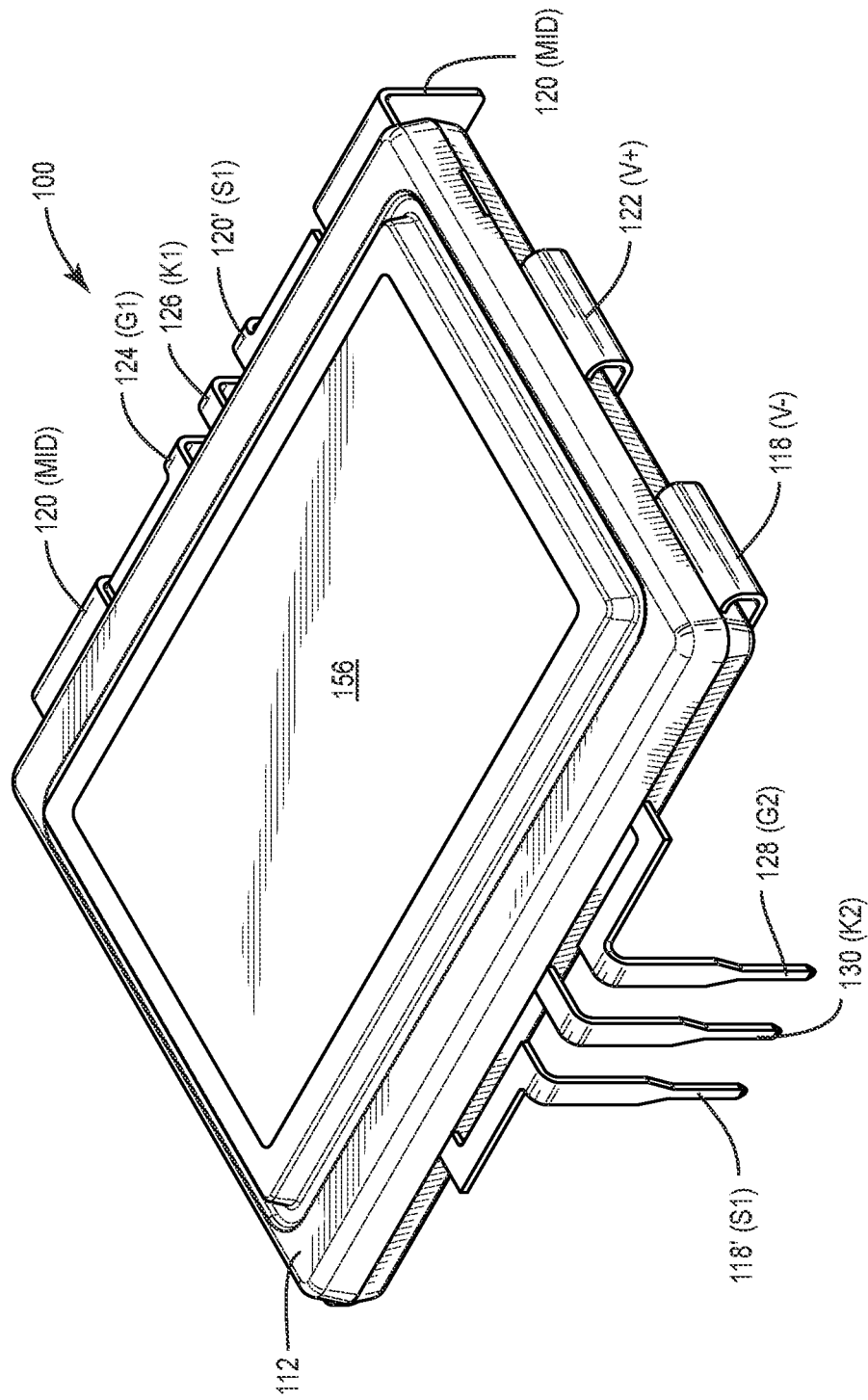
Figure 37:
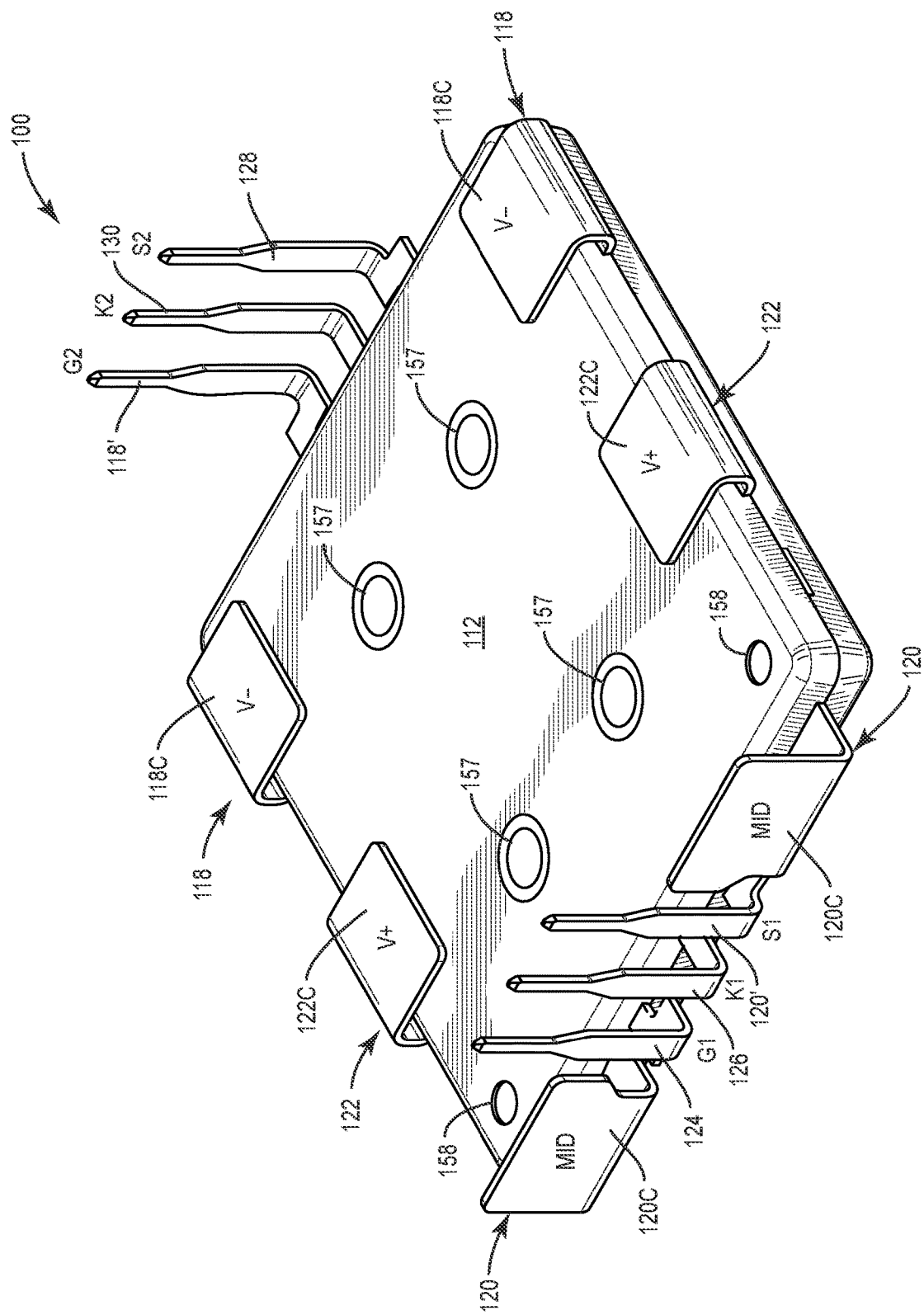
FIGS. 37 and 38 are first and second isometric views illustrating a narrower variation for a power module according to the present disclosure, wherein the narrower implementation supports lesser or smaller power devices for a power module with lower power handling capabilities.
Figure 38:
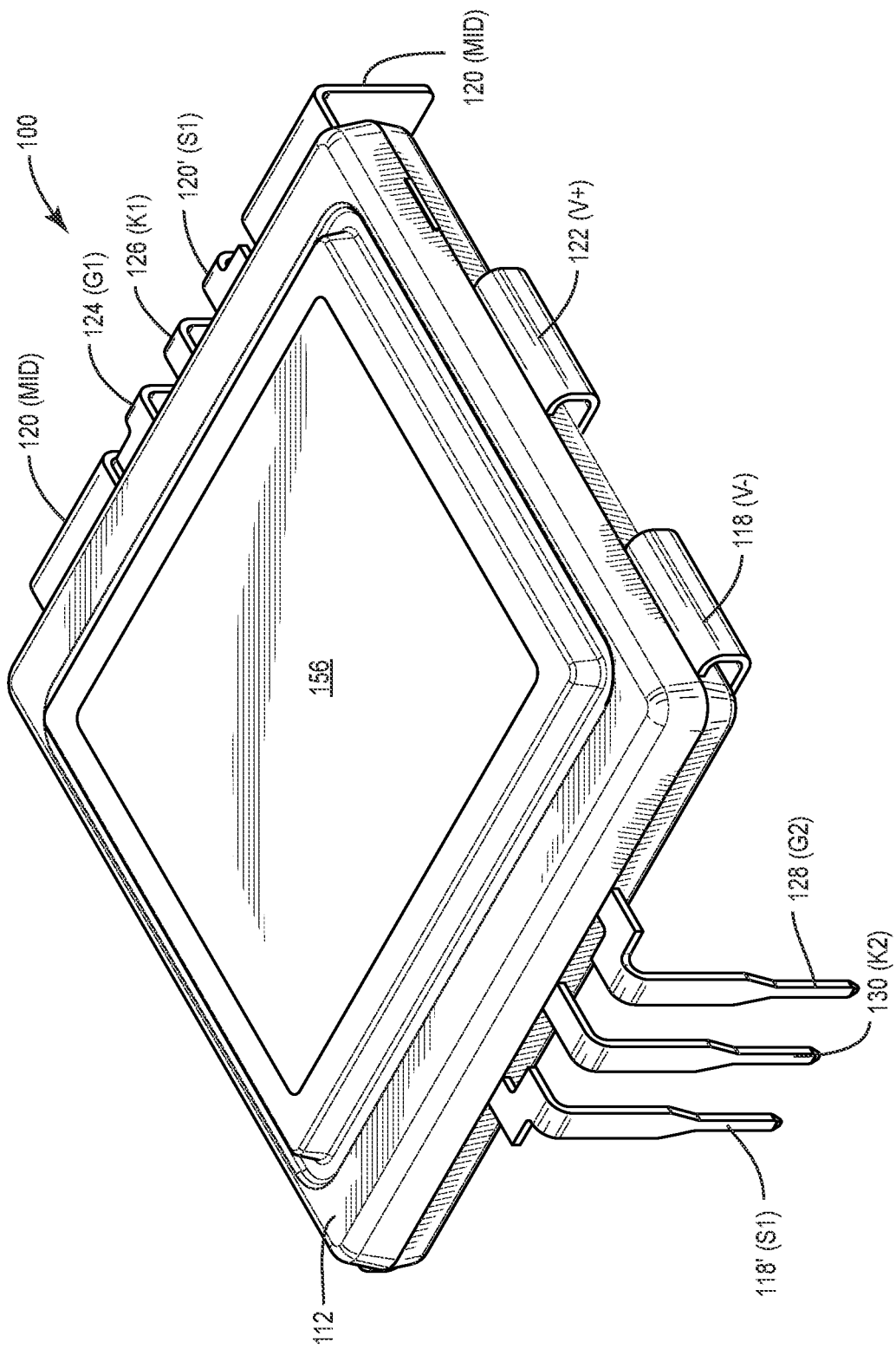

FIGS. 35 and 36 are bottom and top isometric views of a wider variant of the power module 100. As indicated above, the wider variants support inclusion of more power devices 116 for the low and high-side transistors, which generally corresponds to higher power handling capabilities for the power module 100.

The power module 10 and power module 100 described above have many of the same elements as well as several unique elements. Each of these elements can be combined in any combination. For example, the embossments E and the unique pin assemblies 118', 120', 124, 126, 128, 130 may be incorporated in the power module 10.

Silicon Carbide (SiC) power devices offer a high level of performance benefits, including high voltage blocking, low on-resistance, high current, fast switching, low switching losses, high junction temperatures, and high thermal conductivity. Ultimately, these characteristics result in a notable increase in potential power density, which is power processed per area or volume.

Achieving this potential, however, requires addressing significant challenges at the package and system level. The higher voltages, currents, and switching speeds manifest into significantly higher physical stresses applied onto smaller and more constrained areas. To fully take advantage of what SiC technology has to offer, one or more of the following challenges are addressed:

Provide common circuit topologies both within (internal layout) and without (interconnection) the package;
Remove waste heat from conduction and switching losses from the devices;
Provide effective electrical isolation between high voltage potentials;
Provide low power loop inductance for minimal high voltage overshoot during high speed switching;
Achieve low signal loop inductance for minimal gate voltage overshoot and oscillations;
Optimize internal layout for paralleling of power devices to achieve dynamic and steady state current sharing;
Provide low power loop resistance for high current carrying without overheating;
Provide external terminal arrangement well suited for paralleling modules and featuring straightforward arrangement into circuit topologies; and
Provide balanced arrangement of power devices.

The internal layout, or physical arrangement of package components, has a prominent influence on each of these factors. It becomes increasingly more difficult to realize an optimal layout as the number of devices inside of the package increases. Paralleling is a common technique for SiC devices to increase the current capability of a package. With more devices in parallel, the tradeoffs between heat spreading, power loop inductance, signal loop inductance, and package size become progressively more difficult to balance. Forming a half-bridge topology introduces additional layout challenges, as important parameters such as power loop inductance and equal heat transfer between switch positions become more of a design challenge.

In addition to performance, to appeal to a broad range of markets and applications, cost should be kept low. A few techniques to help reduce costs include:

Limit use of individual components by serving multiple functions out of the same component;
Optimize functionality and performance out of each component through design;
Limit the requirement of secondary or finishing operations;
Use conventional or well-established manufacturing methods known for high yield;
Use batch or continuous processing when possible, using panels, strips, arrays, magazines, etc.; and
Optimize package size and form based on manufacturing methods of the sub-components, such as sizing the parts that are fabricated on a strip or a panel to maximize utilization of that raw material.

Ultimately, the combination of internal scalability and external modularity results in a highly adaptable core layout that can apply to a wide range of system requirements.

The present disclosure relates to, but is not limited to the following:

Highly optimized half-bridge package design for the next generation of SiC products;
Scalable layout where products can be implemented by lengthening or widening the package to allow for more SiC area (through larger devices or more in parallel);
Modular approach to the external terminal locations for ease in paralleling multiple packages or arranging them into common circuit topologies;
Ultra-low inductance, balanced power loop layout;
Low inductance, balanced signal loop layout;
True Kelvin implementation for the signal loops;
Left or right-handed signal pin compatibility;
Low-cost through minimizing the number of unique parts used;
Low-cost through minimizing the area of the power substrate;
Low-cost through lead frame array processing;

High manufacturability utilizing well adopted lead frame array processing and transfer molding;

Molded-in voltage creepage extenders on the top and bottom sides of the package; and Direct power attach of the device topside to the lead frame.

The concepts provided above, address one, some, or all of the above to provide the unique and novel power modules 10, 100. Those skilled in the art will recognize improvements and modifications to the present disclosure. All such improvements and modifications are considered within the scope of the concepts disclosed herein.

What is claimed is:

1. A power module comprising:
a substrate having a top surface with a first trace and a second trace;
a first plurality of vertical power devices and a second plurality of vertical power devices that are electrically coupled to form part of a power circuit;
a first terminal assembly comprising a first elongated bar, at least two first terminal contacts, and at least two first terminal legs that respectively extend between different points of the first elongated bar and the at least two first terminal contacts;
a second terminal assembly comprising a second elongated bar, at least two second terminal contacts, and at least two second terminal legs that respectively extend between different points of the second elongated bar and the at least two second terminal contacts; and
a housing that includes four sides between a top surface and a bottom surface wherein the housing encapsulates at least a portion of the first terminal assembly and the second terminal assembly, such that:
first and second ones of the at least two first terminal legs extend out of first and second sides of the housing and fold such that the at least two first terminal contacts extend over and are parallel to the bottom surface of the housing; and
each of the at least two second terminal legs extends out of a third side of the housing and turns, wherein the at least two second terminal contacts form an angle between 75 and 105 degrees with the bottom surface of the housing, wherein the third side is between the first side and a second side of the housing.

2. The power module of claim 1 wherein:
the first plurality of vertical power devices is electrically and mechanically directly coupled between the first trace and a bottom of the first elongated bar of the first terminal assembly; and
the second plurality of vertical power devices are electrically and mechanically directly coupled between the second trace and a bottom of the second elongated bar of the second terminal assembly.

3. The power module of claim 2 wherein:
a plurality of first embossments is provided in the first elongated bar and biased toward the substrate;
a plurality of second embossments is provided in the second elongated bar and biased toward the substrate;
each of the first plurality of vertical power devices is electrically and mechanically directly coupled between the first trace and a bottom of one of the plurality of first embossments in the first elongated bar of the first terminal assembly; and
each of the second plurality of vertical power devices is electrically and mechanically directly coupled between the second trace and a bottom of one of the plurality of second embossments in the second elongated bar of the second terminal assembly.

4. The power module of claim 3 further comprising a third terminal assembly and a fourth terminal assembly, which are electrically and mechanically coupled to the second trace proximate opposing sides of the substrate, wherein:
the third terminal assembly comprises a third terminal leg that extends out of the first side of the housing and a third terminal contact that extends over and is parallel to the bottom surface of the housing; and
the fourth terminal assembly comprises a fourth terminal leg that extends out of the second side of the housing and a fourth terminal contact that extends over and is parallel to the bottom surface of the housing.

5. The power module of claim 1 further comprising a third terminal assembly and a fourth terminal assembly, which are electrically and mechanically coupled to the second trace proximate opposing sides of the substrate, wherein:
the third terminal assembly comprises a third terminal leg that extends out of the first side of the housing and a third terminal contact that extends over and is parallel to the bottom surface of the housing; and
the fourth terminal assembly comprises a fourth terminal leg that extends out of the second side of the housing and a fourth terminal contact that extends over and is parallel to the bottom surface of the housing.

6. The power module of claim 1 further comprising:
a first pin assembly that includes a first pin bar and at least one first pin leg that extends from the first pin bar and out of a fourth side of the housing and then turns at an angle between 75 and 105 degrees with the bottom surface of the housing, the fourth side being opposite the third side of the housing; and
a second pin assembly that includes a second pin bar and at least one second pin leg that extends from the second pin bar and out of the fourth side of the housing and then turns at an angle between 75 and 105 degrees with the bottom surface of the housing.

7. The power module of claim 6 wherein the first terminal assembly further comprises a third pin leg that extends out of the fourth side of the housing and then turns at an angle between 75 and 105 degrees with the bottom surface of the housing.

8. The power module of claim 7 wherein:
the first pin bar is between the second pin bar and the first elongated bar of the first terminal assembly; and
the at least one second pin leg is between the at least one first pin leg and the third pin leg.

9. The power module of claim 1 further comprising:
a first pin assembly that includes a first pin bar and at least one first pin leg that extends from the first pin bar and out of the third side of the housing and then turns at an angle between 75 and 105 degrees with the bottom surface of the housing; and
a second pin assembly that includes a second pin bar and at least one second pin leg that extends from the second pin bar and out of the third side of the housing and then turns at an angle between 75 and 105 degrees with the bottom surface of the housing, wherein the at least one first pin leg and the at least one second pin leg are between the at least two second terminal contacts.

10. The power module of claim 9 wherein the second terminal assembly further comprises a third pin leg that extends out of the third side of the housing and then turns at an angle between 75 and 105 degrees with the bottom surface of the housing.

11. The power module of claim 10 wherein:
the first pin bar is between the second pin bar and the second elongated bar of the second terminal assembly; and
the at least one second pin leg is between the at least one first pin leg and the third pin leg.

12. The power module of claim 1 further comprising:
a first pin assembly that includes a first pin bar and at least one first pin leg that extends from the first pin bar and out of a fourth side of the housing and then turns at an angle between 75 and 105 degrees with the bottom surface of the housing, the fourth side being opposite the third side of the housing;
a second pin assembly that includes a second pin bar and at least one second pin leg that extends from the second pin bar and out of the fourth side of the housing and then turns at an angle between 75 and 105 degrees with the bottom surface of the housing;
a third pin assembly that includes a third pin bar and at least one third pin leg that extends from the third pin bar and out of the third side of the housing and then turns at an angle between 75 and 105 degrees with the bottom surface of the housing; and
a fourth pin assembly that includes a fourth pin bar and at least one fourth pin leg that extends from the fourth pin bar and out of the third side of the housing and then turns at an angle between 75 and 105 degrees with the bottom surface of the housing, wherein the at least one third pin leg and the at least one fourth pin leg are between the at least two second terminal contacts.

13. The power module of claim 12 wherein:
the first terminal assembly further comprises a fifth pin leg that extends out of the fourth side of the housing and then turns at an angle between 75 and 105 degrees with the bottom surface of the housing; and
the second terminal assembly further comprises a sixth pin leg that extends out of the third side of the housing and then turns at an angle between 75 and 105 degrees with the bottom surface of the housing.

14. The power module of claim 1 wherein:
the power circuit comprises a power loop and at least one signal loop; and
the power loop runs through the first plurality of vertical power devices and the second plurality of vertical power devices.

15. The power module of claim 14 wherein the power loop is independent from the at least one signal loop.

16. The power module of claim 15 wherein the at least one signal loop provides at least one control signal for the first plurality of vertical power devices or the second plurality of vertical power devices.

17. The power module of claim 14 wherein the power loop does not run through any bond wires of the power module.

18. The power module of claim 1 wherein the first plurality of vertical power devices and the second plurality of vertical power devices comprise power field effect transistors and the power circuit is a half H-bridge circuit.

19. The power module of claim 1 wherein the second terminal assembly further comprises a plurality of jumpers that extends from the first elongated bar to the first trace, such that the plurality of jumpers connects electrically and mechanically to the first trace.

20. A power module comprising:
a substrate having a top surface with a first trace and a second trace;
a first plurality of vertical power devices and a second plurality of vertical power devices that are electrically coupled to form part of a power circuit;
a first terminal assembly comprising a first elongated bar, at least two first terminal contacts, and at least two first terminal legs that respectively extend between different points of the first elongated bar and the at least two first terminal contacts, wherein a plurality of first embossments are provided in the first elongated bar and biased toward the substrate; and
a second terminal assembly comprising a second elongated bar, at least two second terminal contacts, and at least two second terminal legs that respectively extend between different points of the second elongated bar and the at least two second terminal contacts, wherein a plurality of second embossments are provided in the second elongated bar and biased toward the substrate;
wherein each of the first plurality of vertical power devices is electrically and mechanically directly coupled between the first trace and a bottom of one of the plurality of first embossments in the first elongated bar of the first terminal assembly; and
wherein each of the second plurality of vertical power devices is electrically and mechanically directly coupled between the second trace and a bottom of one of the plurality of second embossments in the second elongated bar of the second terminal assembly.

21. The power module of claim 20 wherein:
the first plurality of vertical power devices is electrically and mechanically directly coupled between the first trace and a bottom of the first elongated bar of the first terminal assembly; and
the second plurality of vertical power devices is electrically and mechanically directly coupled between the second trace and a bottom of the second elongated bar of the second terminal assembly.

22. The power module of claim 21 further comprising a third terminal assembly and a fourth terminal assembly, which are electrically and mechanically coupled to the second trace proximate opposing sides of the substrate, wherein:
the third terminal assembly comprises a third terminal leg that extends out of a first side of a housing of the power module and a third terminal contact that extends over and is parallel to a bottom surface of the housing; and
the fourth terminal assembly comprises a fourth terminal leg that extends out of a second side of the housing and a fourth terminal contact that extends over and is parallel to a top surface of the housing.

23. The power module of claim 20 further comprising:
a first pin assembly that includes a first pin bar and at least one first pin leg that extends from the first pin bar and out of a fourth side of a housing of the power module and then turns at an angle between 75 and 105 degrees with a bottom surface of the housing, the fourth side being opposite a third side of the housing; and
a second pin assembly that includes a second pin bar and at least one second pin leg that extends from the second pin bar and out of the fourth side of the housing and then turns at an angle between 75 and 105 degrees with the bottom surface of the housing.

24. The power module of claim 23 wherein the first terminal assembly further comprises a third pin leg that extends out of the fourth side of the housing and then turns at an angle between 75 and 105 degrees with the bottom surface of the housing.

25. The power module of claim 24 wherein:
the first pin bar is between the second pin bar and the first elongated bar of the first terminal assembly; and
the at least one second pin leg is between the at least one first pin leg and the third pin leg.

26. The power module of claim 20 wherein:
the power circuit comprises a power loop and at least one signal loop;
the power loop runs through the first plurality of vertical power devices and the second plurality of vertical power devices;
the power loop is independent from the at least one signal loop; and
the at least one signal loop provides at least one control signal for the first plurality of vertical power devices or the second plurality of vertical power devices.

27. The power module of claim 26 wherein the power loop does not run through any bond wires of the power module.

28. The power module of claim 20 wherein the substrate, the first plurality of vertical power devices, and the second plurality of vertical power devices comprise silicon carbide.

\* \* \* \* \*